US011805709B2

(12) United States Patent
Najafi

(10) Patent No.: US 11,805,709 B2
(45) Date of Patent: Oct. 31, 2023

(54) SUPERCONDUCTOR-BASED TRANSISTOR

(71) Applicant: PsiQuantum Corp., Palo Alto, CA (US)

(72) Inventor: Faraz Najafi, Palo Alto, CA (US)

(73) Assignee: PSIQUANTUM CORP., Palo Alto, CA (US)

(*) Notice: Subject to any disclaimer, the term of this patent is extended or adjusted under 35 U.S.C. 154(b) by 217 days.

(21) Appl. No.: 16/813,628

(22) Filed: Mar. 9, 2020

(65) Prior Publication Data
US 2020/0303615 A1  Sep. 24, 2020

Related U.S. Application Data

(63) Continuation of application No. 16/046,807, filed on Jul. 26, 2018, now Pat. No. 10,586,910.
(Continued)

(51) Int. Cl.
*H10N 60/84* (2023.01)
*G01J 1/44* (2006.01)
(Continued)

(52) U.S. Cl.
CPC ............... *H10N 60/84* (2023.02); *G01J 1/44* (2013.01); *H01L 29/437* (2013.01);
(Continued)

(58) Field of Classification Search
CPC . H01L 39/10; H01L 29/437; H01L 29/78645; H01L 31/00; H01L 31/022408;
(Continued)

(56) References Cited

U.S. PATENT DOCUMENTS 3,059,196 A   10/1962  Lentz
3,119,076 A    1/1964  Schlig et al.
(Continued)

FOREIGN PATENT DOCUMENTS

CN   106289515 A   1/2017
CN   106549099     3/2017
(Continued)

OTHER PUBLICATIONS

Akhlaghi et al., "Gated Mode 145:149 Superconducting Nanowire Single Photon Detectors," Optics Express, vol. 20, No. 2, Jan. 16, 2012, 9 pgs.
(Continued)

*Primary Examiner* — Benjamin Tzu-Hung Liu
(74) *Attorney, Agent, or Firm* — Morgan, Lewis & Bockius LLP

(57) ABSTRACT

The various embodiments described herein include methods, devices, and systems for fabricating and operating transistors. In one aspect, a transistor includes: (1) a semiconducting component configured to operate in an on state at temperatures above a semiconducting threshold temperature; and (2) a superconducting component configured to operate in a superconducting state while: (a) a temperature of the superconducting component is below a superconducting threshold temperature; and (b) a first current supplied to the superconducting component is below a current threshold; where: (i) the semiconducting component is located adjacent to the superconducting component; and (ii) in response to a first input voltage, the semiconducting component is configured to generate an electromagnetic field sufficient to lower the current threshold such that the first current exceeds the lowered current threshold, thereby transitioning the superconducting component to a non-superconducting state.

17 Claims, 36 Drawing Sheets

Related U.S. Application Data

(60) Provisional application No. 62/591,600, filed on Nov. 28, 2017, provisional application No. 62/578,921, filed on Oct. 30, 2017, provisional application No. 62/538,565, filed on Jul. 28, 2017.

(51) Int. Cl.
| | |
|---|---|
| *H01L 29/43* | (2006.01) |
| *H01L 29/786* | (2006.01) |
| *H01L 31/00* | (2006.01) |
| *H01L 31/0224* | (2006.01) |
| *H01L 31/113* | (2006.01) |
| *H10N 60/10* | (2023.01) |
| *H10N 60/20* | (2023.01) |
| *H10N 60/30* | (2023.01) |
| *H10N 60/35* | (2023.01) |
| *G01J 1/42* | (2006.01) |

(52) U.S. Cl.
CPC ........ *H01L 29/78645* (2013.01); *H01L 31/00* (2013.01); *H01L 31/022408* (2013.01); *H01L 31/1136* (2013.01); *H10N 60/128* (2023.02); *H10N 60/207* (2023.02); *H10N 60/30* (2023.02); *H10N 60/35* (2023.02); *G01J 1/42* (2013.01); *G01J 2001/442* (2013.01); *G01J 2001/446* (2013.01); *G01J 2001/4473* (2013.01)

(58) Field of Classification Search
CPC ... H01L 31/1136; H01L 39/146; H01L 39/16; H01L 39/18; H01L 39/228; G01J 1/44; G01J 1/42; G01J 2001/442; G01J 2001/446; G01J 2001/4473; H10N 60/84; H10N 60/128; H10N 60/207; H10N 60/30; H10N 60/35
See application file for complete search history.

(56) References Cited

U.S. PATENT DOCUMENTS

| | | |
|---|---|---|
| 3,283,282 A | 11/1966 | Rosenberg |
| 4,336,561 A | 6/1982 | Murphy |
| 4,365,317 A | 12/1982 | Gheewala |
| 4,509,146 A | 4/1985 | Wang et al. |
| 4,647,954 A * | 3/1987 | Graf .................. H01L 29/157 505/860 |
| 4,989,051 A | 1/1991 | Whitehead et al. |
| 5,026,682 A | 6/1991 | Clark et al. |
| 5,030,614 A | 7/1991 | Hollander et al. |
| 5,030,617 A | 7/1991 | Legge |
| 5,041,880 A | 8/1991 | Nojima et al. |
| 5,051,787 A | 9/1991 | Hasegawa |
| 5,053,383 A | 10/1991 | Short et al. |
| 5,127,928 A | 7/1992 | Farries et al. |
| 5,173,620 A | 12/1992 | Fujimaki et al. |
| 5,219,826 A | 6/1993 | Kapitulnik |
| 5,247,475 A | 9/1993 | Hasunuma et al. |
| 5,321,004 A | 6/1994 | Perez et al. |
| 5,365,476 A | 11/1994 | Mukhanov |
| 5,376,626 A | 12/1994 | Drehman et al. |
| 5,455,519 A | 10/1995 | Ohori |
| 5,481,119 A | 1/1996 | Higashino et al. |
| 5,521,862 A * | 5/1996 | Frazier .................. G11C 11/44 257/38 |
| 5,574,290 A | 11/1996 | You |
| 5,719,105 A | 2/1998 | Odagawa et al. |
| 5,825,240 A | 10/1998 | Geis et al. |
| 5,831,278 A | 11/1998 | Berkowitz |
| 5,892,644 A | 4/1999 | Evans |
| 5,925,892 A | 7/1999 | Mizuno et al. |
| 6,029,075 A | 2/2000 | Das et al. |
| 6,078,517 A | 6/2000 | Herr |
| 6,242,939 B1 | 6/2001 | Nagasawa |
| 6,433,974 B2 | 8/2002 | Heismann |
| 6,774,463 B1 * | 8/2004 | Chaudhari ............ H01L 29/437 505/235 |
| 6,900,714 B1 | 5/2005 | Huang et al. |
| 7,227,438 B2 | 6/2007 | Song et al. |
| 7,513,765 B2 | 4/2009 | Liao |
| 7,558,030 B2 | 7/2009 | Lee et al. |
| 7,589,323 B2 | 9/2009 | Tanaka et al. |
| 7,724,083 B2 | 5/2010 | Herring et al. |
| 7,847,282 B2 | 12/2010 | Sandhu |
| 7,852,106 B2 | 12/2010 | Herr et al. |
| 8,330,145 B2 | 12/2012 | Wakana et al. |
| 8,565,844 B2 | 10/2013 | Smith |
| 8,577,430 B1 | 11/2013 | Smith |
| 8,736,085 B2 | 5/2014 | Sines |
| 9,293,240 B2 | 3/2016 | Flex-Cable |
| 9,443,576 B1 | 9/2016 | Miller |
| 9,500,519 B2 | 11/2016 | Tang et al. |
| 9,509,315 B2 | 11/2016 | McCaughan et al. |
| 9,853,645 B1 | 12/2017 | Mukhanov et al. |
| 9,876,505 B1 | 1/2018 | Dai et al. |
| 9,954,158 B2 | 4/2018 | You et al. |
| 9,998,122 B2 | 6/2018 | Hamilton et al. |
| 10,103,736 B1 | 10/2018 | Powell et al. |
| 10,133,986 B1 | 11/2018 | Newton et al. |
| 10,171,086 B2 | 1/2019 | McCaughan et al. |
| 10,177,298 B1 | 1/2019 | Taylor et al. |
| 10,186,858 B2 | 1/2019 | Klaus et al. |
| 10,197,440 B2 | 2/2019 | Najafi |
| 10,262,776 B2 | 4/2019 | Choi et al. |
| 10,361,703 B2 | 7/2019 | Najafi |
| 10,386,229 B2 | 8/2019 | Najafi et al. |
| 10,396,733 B2 | 8/2019 | Najafi et al. |
| 10,454,014 B2 | 10/2019 | Najafi et al. |
| 10,454,016 B2 | 10/2019 | Fong et al. |
| 10,566,516 B2 | 2/2020 | Najafi |
| 10,573,800 B1 | 2/2020 | Najafi |
| 10,586,910 B2 | 3/2020 | Najafi |
| 10,620,044 B2 | 4/2020 | Thompson et al. |
| 10,651,325 B2 | 5/2020 | Najafi et al. |
| 10,879,905 B2 | 12/2020 | Najafi et al. |
| 10,897,235 B2 | 1/2021 | Najafi et al. |
| 10,911,031 B2 | 2/2021 | Wise et al. |
| 10,944,403 B2 | 3/2021 | Najafi |
| 10,984,857 B2 | 4/2021 | Najafi |
| 11,009,387 B2 | 5/2021 | Chung et al. |
| 2002/0149453 A1 | 10/2002 | Snitchler et al. |
| 2003/0087503 A1 | 5/2003 | Sakaguchi et al. |
| 2005/0153843 A1 | 7/2005 | Kubota |
| 2005/0197254 A1 | 9/2005 | Stasiak et al. |
| 2006/0073979 A1 | 4/2006 | Thieme et al. |
| 2006/0183327 A1 | 8/2006 | Moon |
| 2006/0270224 A1 | 11/2006 | Song et al. |
| 2008/0026234 A1 | 1/2008 | Sambasivan et al. |
| 2008/0197285 A1 | 8/2008 | Frey et al. |
| 2008/0272302 A1 | 11/2008 | Frey et al. |
| 2009/0014433 A1 | 1/2009 | O'Neil et al. |
| 2010/0026447 A1 | 2/2010 | Keefe et al. |
| 2010/0171098 A1 | 7/2010 | Suzuki |
| 2011/0108803 A1 | 5/2011 | Deligianni et al. |
| 2011/0116742 A1 | 5/2011 | Chang et al. |
| 2011/0254053 A1 | 10/2011 | Goupil et al. |
| 2013/0012392 A1 | 1/2013 | Tanaka et al. |
| 2013/0090244 A1 | 4/2013 | Shinzato et al. |
| 2013/0124112 A1 | 5/2013 | Heath et al. |
| 2013/0143744 A1 | 6/2013 | Marsili et al. |
| 2013/0341594 A1 | 12/2013 | Mohseni et al. |
| 2014/0113828 A1 | 4/2014 | Gilbert et al. |
| 2014/0299751 A1 | 10/2014 | Tang et al. |
| 2015/0018218 A1 | 1/2015 | Lakrimi et al. |
| 2015/0179916 A1 | 6/2015 | Pramanik et al. |
| 2015/0348681 A1 | 12/2015 | Huh |
| 2016/0028402 A1 | 1/2016 | McCaughan et al. |
| 2016/0028403 A1 | 1/2016 | McCughan et al. |
| 2016/0356708 A1 | 12/2016 | Bennett et al. |
| 2017/0186933 A1 | 6/2017 | Sunter et al. |
| 2018/0033944 A1 | 2/2018 | Ladizinsky et al. |
| 2018/0145664 A1 | 5/2018 | Herr et al. |

(56) References Cited

U.S. PATENT DOCUMENTS

| | | | |
|---|---|---|---|
| 2018/0335343 | A1 | 11/2018 | Najafi et al. |
| 2018/0364097 | A1 | 12/2018 | Najafi |
| 2018/0374979 | A1 | 12/2018 | Nozawa |
| 2019/0027672 | A1 | 1/2019 | Megrant |
| 2019/0035904 | A1 | 1/2019 | Najafi |
| 2019/0035999 | A1 | 1/2019 | Najafi |
| 2019/0044051 | A1 | 2/2019 | Caudillo et al. |
| 2019/0109595 | A1 | 4/2019 | Najafi |
| 2019/0148848 | A1 | 5/2019 | Najafi et al. |
| 2019/0227230 | A1 | 7/2019 | Novack et al. |
| 2019/0288132 | A1 | 9/2019 | Wang et al. |
| 2019/0378874 | A1 | 12/2019 | Rosenblatt et al. |
| 2020/0066962 | A1 | 2/2020 | Najafi |
| 2020/0080890 | A1 | 3/2020 | Najafi et al. |
| 2020/0111944 | A1 | 4/2020 | Moodera et al. |
| 2020/0176662 | A1 | 6/2020 | Dayton et al. |
| 2020/0194656 | A1 | 6/2020 | Najafi |
| 2020/0256722 | A1 | 8/2020 | Najafi et al. |
| 2021/0183767 | A1 | 6/2021 | Najafi et al. |
| 2021/0239518 | A1 | 8/2021 | Chung et al. |

FOREIGN PATENT DOCUMENTS

| | | |
|---|---|---|
| DE | 2440576 B1 | 1/1976 |
| DE | 19714191 C1 | 7/1998 |
| EP | 0299879 A2 | 1/1989 |
| EP | 1965184 A1 | 9/2008 |
| GB | 2530500 A | 3/2016 |
| JP | S63299282 A | 12/1988 |
| JP | H05-55647 A | 3/1993 |
| WO | WO90/14715 A1 | 11/1990 |
| WO | WO94/09566 A1 | 4/1994 |
| WO | WO/2012052628 A1 | 4/2012 |

OTHER PUBLICATIONS

Atikian, Haig A. et al., "Superconducting Nanowire Single Photon Detector on Diamond," arXiv:1401.4490v1, physics.optics, Jan. 17, 2014, 5 pgs.

Cheng, Risheng et al., "Photon-No. Resolving Detector Based on Superconducting Serial Nanowires," IEEE Transactions on Applied Superconductivity, vol. 23, No. 1, Feb. 2013, 9 pgs.

Clem, John R. et al., "Geometry-dependent critical currents in superconducting nanocircuits," arXiv:1109.4881v1 [cond-mat.supr-con] Sep. 22, 2011, 29 pgs.

Dai, Daoxin et al., "Mode conversion in tapered submicron silicon ridge optical waveguides," Optics Express, vol. 20, No. 12, Jun. 4, 2012, 15 pgs.

Henrich, D. et al., "Geometry-inducted reduction of the critical current in superconducting nanowires," arXiv:1204.0616v2 [cond-mat-supr-con] Aug. 22, 2012, 6 pgs.

Hortensius, H.L. et al., "Critical-Current Reduction in Thin Superconducting Wires Due to Current Crowding," arXiv:1203.4253v3, [cond-mat-supr-con], May 6, 2012, 5 pgs.

Korzh, B.A. et al., "Demonstrating sub-3 ps temporal resolution in a superconducting nanowire single-photon detector," Apr. 18, 2018, 26 pgs.

Lee, S.-B. et al., "Fabrication of a self-aligned superconducting nanotransistor based NOR logic gate," Microelectronic Engineering 57-58, 2001, 7 pgs., downloaded from https://www.sciencedirect.com/science/article/abs/pii/S0167931701004269).

Marsili, F., "Single-photon detectors based on ultra-narrow superconducting nanowires," Massachusetts Institute of Technology, Department of Electrical Engineering and Computer Science, Dec. 19, 2010, 31 pgs.

Mattioli, Francesco et al., "Photon-number-resolving superconducting nanowire detectors," Superconductor Science and Technology, Aug. 24, 2015, 16 pgs.

McGaughan, "Superconducting thin film nanoelectronics," Sep. 2015, Massachusetts Institute of Technology, submitted to the Department of Electrical Engineering and Computer Science in partial fulfillment of the requirements for the degree of Doctor of Philosopy in Electrical Engineering, 22 pgs.

Murphy et al., "Nanoscale superconducting memory based on the kinetic inductance of asymmetric nanowire loops," Departmwent of Physics, University of Illinois at Urbana-Champaign, arXiv:1701.08715v2 [cond-mat.supr-con] Jun. 29, 2017, 19 pgs.

Natarajan et al., "Superconducting nanowire single-photon detectors: physics and applications", 2012, Superconduc. Sci. Technology vol. 25, p. 063001.

Quaranta et al., Superconductive Three-Terminal Amplifier/Discriminator, IEEE Transactions on Applied Superconductivity, vol. 19, No. 3, Jun. 2, 2009, 4 pgs.

Schmidt, E. et al., AIN-Buffered Superconducting NbN Nanowire Single-Photon Detector on GaAs, IEEE Transactions on Applied Superconductivity, vol. 27, No. 4, Jun. 2017, 5 pgs.

Shiino, Tatsuya et al., "Improvement of Critical Temperature of Superconducting NbTIN and NbN Thin Films Using the AIN Buffer Layer," Superconductor Science and Technology, Mar. 2010, 11 pgs.

Zhao, Qing-Yuan et al., "A compact superconducting nanowire memory element operated by nanowire cryotrons," Massachusetts Institute of Technology, Department of Electrical Engineering and Computer Science, Nov. 22, 2017, 20 pgs.

PsiQuantum Corp., International Search Report and Written Opinion, PCT/US2018/033042, dated Aug. 28, 2018, 13 pgs.

PsiQuantum Corp., International Search Report and Written Opinion, PCT/US2018/033041, dated Jul. 27, 2018, 16 pgs.

PsiQuantum Corp., International Search Report and Written Opinion, PCT/US2018/044091, dated Nov. 7, 2018, 13 pgs.

PsiQuantum Corp., Invitation to Pay Additional Fees/Partial Search Report, PCT/US2018/037892, dated Aug. 20, 2018, 12 pgs.

PsiQuantum Corp., Invitation to Pay Additional Fees/Partial Search Report, PCT/US2018/054414, dated Jan. 24, 2019, 21 pgs.

PsiQuantum Corp., International Search Report and Written Opinion, PCT/US2018/054414, dated Mar. 20, 2019, 21 pgs.

Najafi, Office Action dated Dec. 12, 2018, U.S. Appl. No. 16/028,288, 6 pgs.

Najafi, Notice of Allowance dated Apr. 5, 2019, U.S. Appl. No. 16/028,288, 10 pgs.

Najafi, Office Action dated Sep. 21, 2018, U.S. Appl. No. 16/028,293, 8 pgs.

Najafi, Final Office Action dated Mar. 1, 2019 U.S. Appl. No. 16/028,293, 5 pgs.

Najafi, Notice of Allowance dated Sep. 21, 2018, U.S. Appl. No. 16/012,520, 9 pgs.

Najafi, Office Action, U.S. Appl. No. 16/136,124, dated Apr. 4, 2019, 9 pgs.

Najafi, Quayle Office Action, U.S. Appl. No. 16/151,180, dated Jan. 31, 2019, 5pgs.

Najafi, Notice of Allowace, U.S. App. No. 16/151,180, dated Mar. 14, 2019, 5 pgs.

Najafi, Notice of Allowance U.S. Appl. No. 16/151,190, dated Feb. 6, 2019, 11 pgs.

Najafi, Notice of Allowance U.S. Appl. No. 16/151,190, dated Mar. 28, 2019, 5 pgs.

Najafi, Office Action, U.S. Appl. No. 16/046,815, dated Feb. 4, 2019, 9 pgs.

Najafi, Office Action, U.S. Appl. No. 16/046,807, dated Mar. 18, 2019, 10 pgs.

Najafi, Office Action, U.S. Appl. No. 16/107,143, dated Mar. 19, 2019, 11 pgs.

PsiQuantum Corp., International Search Report and Written Opinion, PCT/US2019/017687, dated Apr. 30, 2019, 8 pgs.

Stanfield, CMOS-Compatible, Piezo-Optomechanically Tunable Photonics for Visible Wavelengths and Cryogenic, Temperatures, vol. 27, Issue 20, pp. 28588-28605, 2019.

PsiQuantum Corp., International Search Report, PCT/US2019/017691, dated Apr. 23, 2019, 7 pgs.

PsiQuantum Corp., International Search Report and Written Opinion, PCT/US2019/030019, dated Jul. 17, 2019, 8 pgs.

PsiQuantum Corp., PCT/US2018/044091, International Preliminary Report on Patentability, dated Jan. 28, 2020, 6 pgs.

(56) References Cited

OTHER PUBLICATIONS

Najafi, Non-Final Office Action, U.S. Appl. No. 16/664,716, dated Apr. 1, 2020, 14 pgs.
PsiQuantum, International Search Report / Written Opinion, PCT/US2019/051853, dated Jan. 27, 2020, 13 pgs.
PsiQuantum, International Preliminary Report on Patentability, PCT/US12018/033041, dated Nov. 26, 2019, 8 pgs.
PsiQuantum, International Preliminary Report on Patentability, PCT/US2018/054414, dated Apr. 8, 2020, 15 pgs.
PsiQuantum, International Search Report / Written Opinion, PCT/US2018/037892, dated Oct. 17, 2018, 18 pgs.
PsiQuantum, International Preliminary Report on Patentability, PCT/US2018/037892, dated Dec. 17, 2019, 12 pgs.
Najafi, Non-Final Office Action, U.S. Appl. No. 16/553,068, dated Apr. 1, 2020, 11 pgs.
Najafi, Non-Final Office Action, U.S. Appl. No. 16/544,718, dated Aug. 17, 2020, 6 pgs.
Najafi, Non-Final Office Action, U.S. Appl. No. 16/656,506, dated Aug. 13, 2020, 18 pgs.
Najafi, Notice of Allowance, U.S. Appl. No. 16/553,068, dated Sep. 18, 2020, 8 pgs.
Najafi, Notice of Allowance, U.S. Appl. No. 16/473,550, dated Sep. 24, 2020, 8 pgs.
Najafi, Notice of Allowance, U.S. Appl. No. 16/473,550, dated Nov. 3, 2020, 2 pgs.
Najafi, Notice of Allowance, U.S. Appl. No. 16/553,068, dated Nov. 12, 2020, 2 pgs.
Najafi, Notice of Allowance, U.S. Appl. No. 16/656,506, dated Nov. 3, 2020, 12 pgs.
Najafi, Final Office Action, U.S. Appl. No. 16/664,716, dated Oct. 16, 2020, 14 pgs.
Najafi, Notice of Allowance, U.S. Appl. No. 16/473,547, dated Dec. 9, 2020, 8 pgs.
Najafi, Notice of Allowance, U.S. Appl. No. 16/543,256, dated Dec. 9, 2020, 12 pgs.
Chung, Non-Final Office Action, U.S. Appl. No. 16/849,829, dated Aug. 21, 2020, 5 pgs.
Chung, Notice of Allowance, U.S. Appl. No. 16/849,829, dated Dec. 8, 2020, 5 pgs.
PsiQuantum Corp., International Search Report / Written Opinion, PCT/US20/28519, dated Jan. 12, 2021, 9 pgs.
PsiQuantum Corp., Notice of Allowance, U.S. Appl. No. 16/849,829, dated Mar. 1, 2021, 8 pgs.
PsiQuantum Corp., Notice of Allowance, U.S. Appl. No. 16/544,718, dated Feb. 5, 2021, 6 pgs.
PsiQuantum Corp., Notice of Allowance, U.S. Appl. No. 16/664,716, dated Jan. 28, 2021, 8 pgs.
PsiQuantum Corp., Notice of Allowance, U.S. Appl. No. 16/473,547, dated Jan. 27, 2021, 2 pgs.
PsiQuantum Corp., Notice of Allowance, U.S. Appl. No. 16/543,256, dated Feb. 4, 2021, 2 pgs.
PsiQuantum Corp., Notice of Allowance, U.S. Appl. No. 16/544,718, dated Mar. 12, 2021, 2 pgs.
PsiQuantum Corp., Notice of Allowance, U.S. Appl. No. 16/544,718, dated Mar. 24, 2021, 2 pgs.
PsiQuantum Corp., Notice of Allowance, U.S. Appl. No. 16/849,829, dated Apr. 5, 2021, 2 pgs.
PsiQuantum, Notice of Allowance, U.S. Appl. No. 16/840,166, dated Mar. 23, 2021, 7 pgs.
PsiQuantum, Notice of Allowance, U.S. Appl. No. 16/544,718, dated Apr. 26, 2021, 2 pgs.
PsiQuantum, Notice of Allowance, U.S. Appl. No. 16/664,716, dated Apr. 21, 2021, 8 pgs.
PsiQuantum, Notice of Allowance, U.S. Appl. No. 16/664,716, dated May 7, 2021, 2 pgs.
PsiQuantum, Notice of Allowance, U.S. Appl. No. 16/543,256, dated Mar. 24, 2021, 2 pgs.
PsiQuantum, Notice of Allowance, U.S. Appl. No. 16/575,274, dated Apr. 22, 2021, 10 pgs.
PsiQuantum, International Preliminary Report on Patentability, PCT/US2018/033042, dated Nov. 19, 2019, 7 pgs.
PsiQuantum, International Search Report, PCT/US2018/033041, dated Jul. 27, 2018, 12 pgs.
PsiQuantum, International Preliminary Report on Patentability, PCT/US2019/051853, dated Mar. 23, 2021, 10 pgs.
PsiQuantum, International Preliminary Report on Patentability, PCT/US2019/017687, dated Aug. 18, 2020, 6 pgs.
PsiQuantum, International Preliminary Report on Patentability, PCT/US2019/030019, dated Nov. 3, 2020, 7 pgs.
PsiQuantum, Notice of Allowance, U.S. Appl. No. 16/840,166, dated May 24, 2021, 5 pgs.
Najafi, Non-Final Office Action, U.S. Appl. No. 16/623,503, dated Jun. 23, 2021, 15 pgs.
Najafi, Notice of Allowance, U.S. Appl. No. 16/840,166, dated Jul. 21, 2021, 2 pgs.
Najafi, Non-Final Office Action, U.S. Appl. No. 17/135,861, dated Sep. 23, 2021, 6 pgs.
PsiQuantum, International Preliminary Report on Patentability, PCT/US2019/016885, dated Aug. 11, 2020, 7 pgs.
PsiQuantum, International Search Report and Written Opinion, PCT/US2019/016885, dated Apr. 24, 2019, 9 pgs.
Thompson, Non-Final Office Action, U.S. Appl. No. 16/450,911, dated Aug. 2, 2019, 6 pgs.
Thompson, Notice of Allowance, U.S. Appl. No. 16/450,911, Dec. 11, 2019, 5 pgs.
Thompson, Non-Final Office Action, U.S. Appl. No. 16/985,137, dated Sep. 30, 2021, 6 pgs.
Najafi, Notice of Allowance, U.S. Appl. No. 16/046,807, dated Oct. 29, 2019, 7 pgs.
Najafi, Non-Final Office Action, U.S. Appl. No. 16/136,124, dated Apr. 4, 2019, 8 pgs.
Najafi, Notice of Allowance, U.S. Appl. No. 16/136,124, dated Jun. 27, 2019, 8 pgs.
Najafi, Corrected Notice of Allowance, U.S. Appl. No. 16/136,124, dated Sep. 23, 2019, 2 pgs.
PsiQuantum Corp., International Search Report and Written Opinion, PCT/US2018/060802, dated Apr. 8, 2019, 6 pgs.
PsiQuantum, International Preliminary Report on Patentability, PCT/US2018/060802, dated May 19, 2020, 13 pgs.
Najafi, Notice of Allowance, U.S. Appl. No. 16/773,921, dated Sep. 22, 2021, 8 pgs.
Najafi, Notice of Allowance, U.S. Appl. No. 17/195,522, dated Nov. 12, 2021, 8 pgs.
Najafi, Notice of Allowance, U.S. Appl. No. 17/195,522, dated Nov. 16, 2021, 2 pgs.
Najafi, Notice of Allowance, U.S. Appl. No. 16/773,921, dated Nov. 15, 2021, 8 pgs.
Najafi, Notice of Allowance, U.S. Appl. No. 17/033,337, dated Dec. 9, 2021, 8 pgs.
McCaughan, A.N., et al., "Using Geometry to Sense Current," Nano Letters 16 (2016), 6 pgs.
Chung, Non-Final Office Action, U.S. Appl. No. 17/232,086, dated Dec. 16, 2021, 6 pgs.
Najafi, Notice of Allowance, U.S. Appl. No. 17/195,522, dated Dec. 9, 2021, 2 pgs.
Najafi, Notice of Allowance, U.S. Appl. No. 16/773,921, dated Dec. 24, 2021, 2 pgs.
Najafi, Notice of Allowance, U.S. Appl. No. 17/195,522, dated Jan. 7, 2022, 2 pgs.
Najafi, Notice of Allowance, U.S. Appl. No. 17/135,861, dated Jan. 28, 2022, 7 pgs.
Thompson, Non-Final Office Action, U.S. Appl. No. 16/985,137, dated Jan. 18, 2022, 8 pgs.
Najafi, Notice of Allowance, U.S. Appl. No. 17/195,522, dated Feb. 9, 2022, 2 pgs.
Najafi, Notice of Allowance, U.S. Appl. No. 17/135,861, dated Feb. 15, 2022, 2 pgs.
Najafi, Notice of Allowance, U.S. Appl. No. 16/773,921, dated Feb. 16, 2022, 2 pgs.
Najafi, Notice of Allowance, U.S. Appl. No. 17/033,337, dated Feb. 25, 2022, 7 pgs.

(56) References Cited

OTHER PUBLICATIONS

Thompson, Notice of Allowance, U.S. Appl. No. 16/985,137, dated May 26, 2022, 9 pgs.
Chung, Notice of Allowance, U.S. Appl. No. 17/232,086, dated May 11, 2022, 6 pgs.
Najafi, Non-Final Office Action, U.S. Appl. No. 17/160,283, dated Mar. 31, 2022, 17 pgs.
Najafi, Non-Final Office Action, U.S. Appl. No. 17/234,701, dated Feb. 1, 2022, 13 pgs.
Najafi, Non-Final Office Action, U.S. Appl. No. 16/840,182, dated Apr. 29, 2022, 12 pgs.
Najafi, Notice of Allowance, U.S. Appl. No. 16/623,503 dated Feb. 22, 2022, 10pgs.
Najafi, Non-Final Office Action, U.S. Appl. No. 17/160,283, dated Jul. 15, 2022, 14 pgs.
Najafi, Notice of Allowance, U.S. Appl. No. 17/234,701, dated Jun. 6, 2022, 9 pgs.
Najafi, Notice of Allowance, U.S. Appl. No. 17/033,337, dated Mar. 16, 2022, 2 pgs.
Najafi, Notice of Allowance, U.S. Appl. No. 17/135,861, dated Mar. 15, 2022, 2 pgs.
Najafi, Notice of Allowance, U.S. Appl. No. 16/623,503, dated Mar. 11, 2022, 3 pgs.

\* cited by examiner

SUPERCONDUCTOR-BASED TRANSISTOR

PRIORITY AND RELATED APPLICATIONS

This application is a continuation of U.S. patent application Ser. No. 16/046,807, filed Jul. 26, 2018, which claims priority to U.S. Provisional Application No. 62/591,600, filed Nov. 28, 2017, entitled "Nanowire Transistor," U.S. Provisional Application No. 62/578,921, filed Oct. 30, 2017, entitled "Photodetector with Superconductor Nanowire Transistor based on Interlayer Heat Transfer;" and U.S. Provisional Application No. 62/538,565, filed Jul. 28, 2017, entitled "Superconductor Nanowire Transistor Based On Interlayer Heat Transfer;" each of which is incorporated by reference herein in its entirety.

This application is also related to International (PCT) Patent Application PCT/US18/33041, filed May 16, 2018, entitled "Gated Superconducting Photon Detector;" and U.S. application Ser. No. 16/046,815, filed Jul. 26, 2018, entitled "Photodetector with Superconductor Nanowire Transistor Based on Interlayer Heat Transfer," now U.S. Pat. No. 10,566,516, each of which is incorporated by reference herein in its entirety.

TECHNICAL FIELD

This relates generally to transistors, including but not limited to, transistors utilizing semiconducting freeze-out effects.

BACKGROUND

A transistor is a device used to switch and/or amplify electrical signals. A transistor has at least three terminals for connection to a circuit, sometimes labeled as a gate, a source, and a drain. Transistors are generally configured such that a current or voltage applied to the gate allows current to flow from the source to the drain. However, as device sizes decrease, various technical issues, such as gate oxide leakage current in semiconductor-based transistors, have limited the performance of semiconductor-based transistors.

Superconductors are materials capable of operating in a superconducting state with zero electrical resistance under particular conditions. Additionally, in some circumstances, superconductors generate heat when transitioning from a superconducting state to a non-superconducting state.

SUMMARY

There is a need for systems and/or devices with more efficient and effective methods for providing the functionality of a transistor. Such systems, devices, and methods optionally complement or replace conventional systems, devices, and methods for providing the functionality of a transistor.

As an example in accordance with some embodiments, a transistor is composed of a semiconducting wire (e.g., acting as a source and drain of the transistor) and a superconducting wire (e.g., acting as a gate of the transistor). In this example, the superconducting wire is electrically isolated from the semiconducting wire, and the semiconducting wire is initially maintained at a temperature below a critical temperature for current flow through the semiconducting wire (representing an "off" state for the transistor and sometimes referred to as a "freeze-out state"). The superconducting wire in this example is initially in a superconducting state. While in the superconducting state a current is introduced to the superconducting wire that exceeds a critical current for the wire. As a result, the superconducting wire transitions to a non-superconducting state. During the transition, the superconducting wire generates heat sufficient to heat the semiconducting wire above the critical temperature for current flow. The increase in temperature thus allows current flow through the semiconducting wire (representing an "on" state for the transistor). Thus, in these embodiments, the transition of the superconductor wire from the superconducting state to the non-superconducting state switches the transistor from an off state to an on state.

As another example in accordance with some embodiments, a transistor is composed of a semiconducting wire (e.g., acting as a gate of the transistor) and a superconducting wire (e.g., acting as a source and drain of the transistor). In this example, the superconducting wire is electrically isolated from the semiconducting wire, and the semiconducting wire is initially maintained at a temperature below a critical temperature for current flow through the semiconducting wire. The superconducting wire in this example is initially in a superconducting state, representing an "on" state for the transistor. While in the superconducting state, a voltage is introduced to the semiconducting wire. The voltage generates an electromagnetic field that lowers a current threshold for the superconducting wire. As a result, the superconducting wire transitions to a non-superconducting state. In the non-superconducting state, less current flows through the superconducting wire, representing an "off" state for the transistor. Thus, in these embodiments, the application of the voltage to the semiconducting wire switches the transistor from an on state to an off state.

In one aspect, some embodiments include a transistor having: (1) a first wire including a semiconducting component configured to operate in an on state at temperatures above a semiconducting threshold temperature; and (2) a second wire including a superconducting component configured to operate in a superconducting state while: (a) a temperature of the superconducting component is below a superconducting threshold temperature; and (b) a first input current supplied to the superconducting component is below a current threshold; where: (i) the semiconducting component is located adjacent to the superconducting component; (ii) in response to a first input voltage, the semiconducting component is configured to generate an electromagnetic field sufficient to lower the current threshold such that the first input current exceeds the lowered current threshold, thereby transitioning the superconducting component to a non-superconducting state; (iii) the transistor is configured to operate in an on state while the superconducting component is in the superconducting state; and (iv) the transistor is configured to operate in an off state while the superconducting component is in the non-superconducting state.

In another aspect, some embodiments include a method for operating a superconductor-based transistor. The method includes operating the superconductor-based transistor in a first mode, including: (a) maintaining the transistor in an off state, including: (i) maintaining a superconducting component of the transistor in a superconducting state; and (ii) maintaining a semiconducting component of the transistor in an off state; and (b) transitioning the transistor from the off state to an on state, including supplying current to the superconducting component, wherein the current exceeds a superconducting current threshold for the superconducting component; where, in response to the current supplied to the superconducting component, the superconducting component transitions to a non-superconducting state and generates heat sufficient to increase a temperature of the semiconducting component above a semiconducting threshold temperature and allow current flow through the semiconducting component.

In another aspect, some embodiments include a transistor having: (1) a first wire including a semiconducting component configured to operate in an on state at temperatures above a semiconducting threshold temperature; and (2) a second wire located adjacent to the semiconducting component; where: (a) in response to an input current, the second wire is configured to generate heat sufficient to increase a temperature of the semiconducting component above the semiconducting threshold temperature; (b) the transistor is configured to operate in an off state while the semiconducting component is maintained at a temperature below the semiconducting threshold temperature; and (c) the transistor is configured to operate in an on state while the semiconducting component is at a temperature above the semiconducting threshold temperature.

In yet another aspect, some embodiments include a transistor device configured to perform any of the methods described herein.

In yet another aspect, some embodiments include a transistor device, comprising: (1) a superconducting wire, the superconducting wire comprising a first layer of the transistor device; (2) a semiconducting wire, the superconducting wire comprising a second layer of the transistor device and configured to transfer current from a source of the transistor to a drain of the transistor; and (3) an electrically-insulating layer isolating the first layer from the second layer.

In yet another aspect, some embodiments include a method for fabricating a superconductor-based transistor. The method includes: (1) providing a superconducting wire; (2) depositing an electrically insulating layer over the superconducting wire; and (3) forming a semiconducting wire on the electrically insulating layer.

In yet another aspect, some embodiments include a method for fabricating a transistor device, comprising: (1) providing a semiconducting wire; (2) depositing an electrically insulating layer over the semiconducting wire; and (3) forming a superconducting wire on the electrically insulating layer.

Thus, devices and systems are provided with methods for fabricating and operating freeze-out transistors, thereby increasing the effectiveness, efficiency, and user satisfaction with such systems and devices.

BRIEF DESCRIPTION OF THE DRAWINGS

For a better understanding of the various described embodiments, reference should be made to the Detailed Description below, in conjunction with the following drawings in which like reference numerals refer to corresponding parts throughout the figures.

DETAILED DESCRIPTION

Figure 1A:
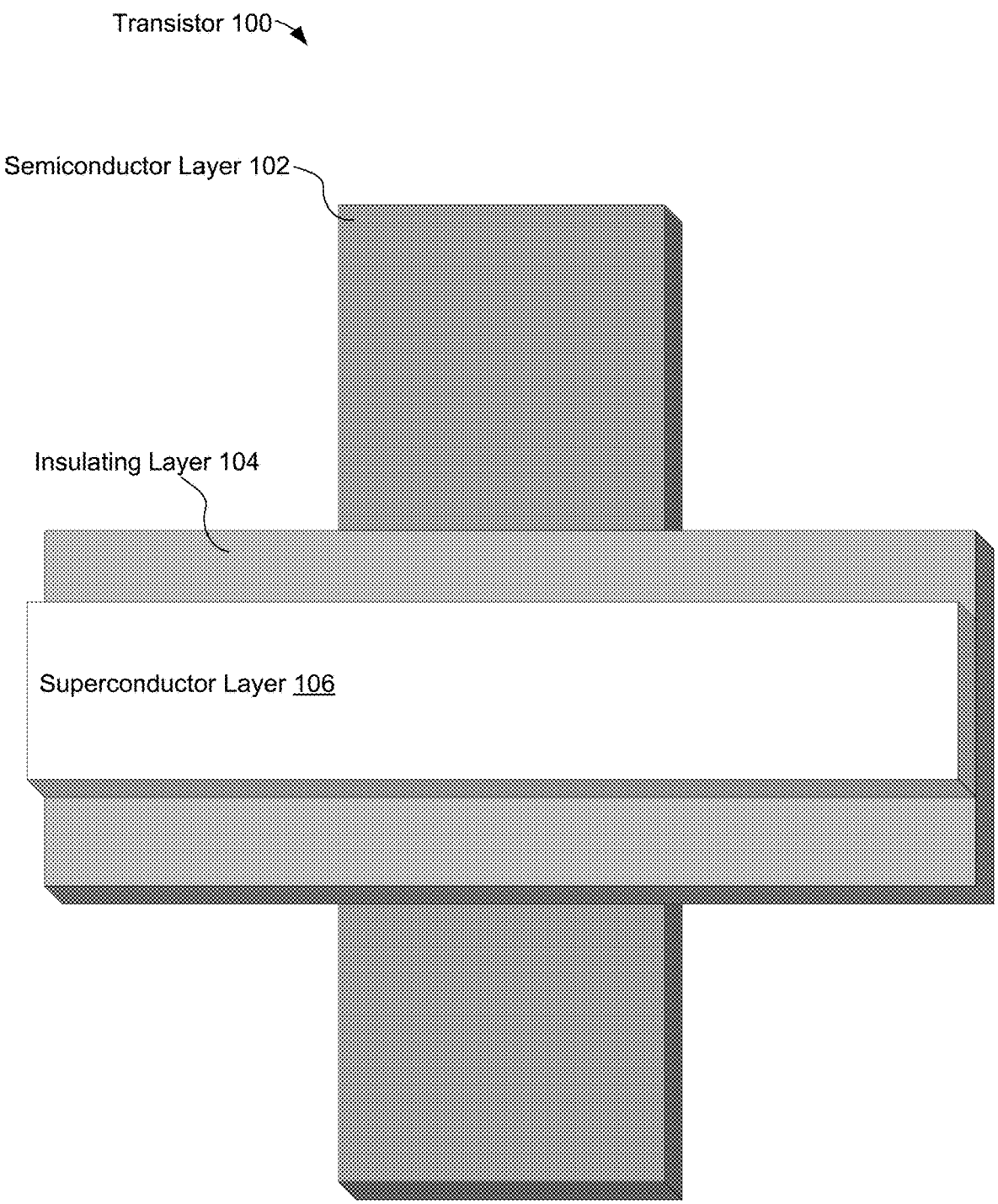
FIG. 1A is a perspective diagram illustrating components of a representative transistor in accordance with some embodiments.

Reference will now be made in detail to embodiments, examples of which are illustrated in the accompanying drawings. In the following detailed description, numerous specific details are set forth in order to provide a thorough understanding of the various described embodiments. However, it will be apparent to one of ordinary skill in the art that the various described embodiments may be practiced without these specific details. In other instances, well-known methods, procedures, components, circuits, and networks have not been described in detail so as not to unnecessarily obscure aspects of the embodiments.

Many modifications and variations of this disclosure can be made without departing from its spirit and scope, as will be apparent to those skilled in the art. The specific embodiments described herein are offered by way of example only, and the disclosure is to be limited only by the terms of the appended claims, along with the full scope of equivalents to which such claims are entitled.

The present disclosure describes transistor devices that utilize a freeze-out property of semiconductors in conjunction with resistive heat generation of superconductors (and other conductors) to achieve transistor functionality. As an example, in accordance with some embodiments, a transistor is composed of a semiconducting wire (e.g., acting as a source and drain of the transistor) and a superconducting wire (e.g., acting as a gate of the transistor). In this example, the superconducting wire is electrically isolated from the semiconducting wire, and the semiconducting wire is initially maintained at a temperature below a critical temperature for current flow through the semiconducting wire (representing an "off" state for the transistor and sometimes referred to as a "freeze-out state"). The superconducting wire in this example is initially in a superconducting state. While in the superconducting state a current is introduced to the superconducting wire that exceeds a critical current for the wire. As a result, the superconducting wire transitions to a non-superconducting state. During the transition, the superconducting wire generates heat sufficient to heat the semiconducting wire above the critical temperature for current flow. The increase in temperature thus allows current flow through the semiconducting wire (representing an "on" state for the transistor). Thus, in these embodiments, the transition of the superconductor wire from the superconducting state to the non-superconducting state switches the transistor from an off state to an on state.

The present disclosure also describes transistor devices that utilize electromagnetic fields generated by semiconductors in conjunction with superconducting to non-superconducting transitions for superconductors to achieve transistor functionality. As another example, in accordance with some embodiments, a transistor is composed of a semiconducting wire (e.g., acting as a gate of the transistor) and a superconducting wire (e.g., acting as a source and drain of the transistor). In this example, the superconducting wire is electrically isolated from the semiconducting wire, and the semiconducting wire is initially maintained at a temperature below a critical temperature for current flow through the semiconducting wire. The superconducting wire in this example is initially in a superconducting state, representing an "on" state for the transistor. While in the superconducting state, a voltage is introduced to the semiconducting wire. The voltage generates an electromagnetic field that lowers a current threshold for the superconducting wire. As a result, the superconducting wire transitions to a non-superconducting state. In the non-superconducting state, less current flows through the superconducting wire, representing an "off" state for the transistor. Thus, in these embodiments, the application of the voltage to the semiconducting wire switches the transistor from an on state to an off state.

As used herein, a "superconducting transistor" or "superconductor-based transistor" is a transistor having one or more superconducting components. As used herein, a "superconducting" material is a material that is capable of operating in a superconducting state (under particular conditions). For example, a superconducting material is a material that operates as a superconductor (e.g., operates with zero electrical resistance) when cooled below a particular temperature (e.g., a critical temperature) and having less than a threshold current flowing through it. A superconducting material is also called herein a superconduction-capable material. The superconducting materials may also operate in an "off" state where little or no current is present. In some embodiments, the superconducting materials operate in a non-superconducting state during which the materials have a non-zero electrical resistance (e.g., a resistance in the range of one thousand to ten thousand ohms). For example, a superconducting material supplied with a current greater than a threshold superconducting current for the superconducting material may transition from a superconducting state with zero electrical resistance to a non-superconducting state with non-zero electrical resistance. As an example, superconducting layer 106 in FIG. 1A is a superconducting material that is capable of operating in a superconducting state (e.g., under particular operating conditions).

Figure 2A:
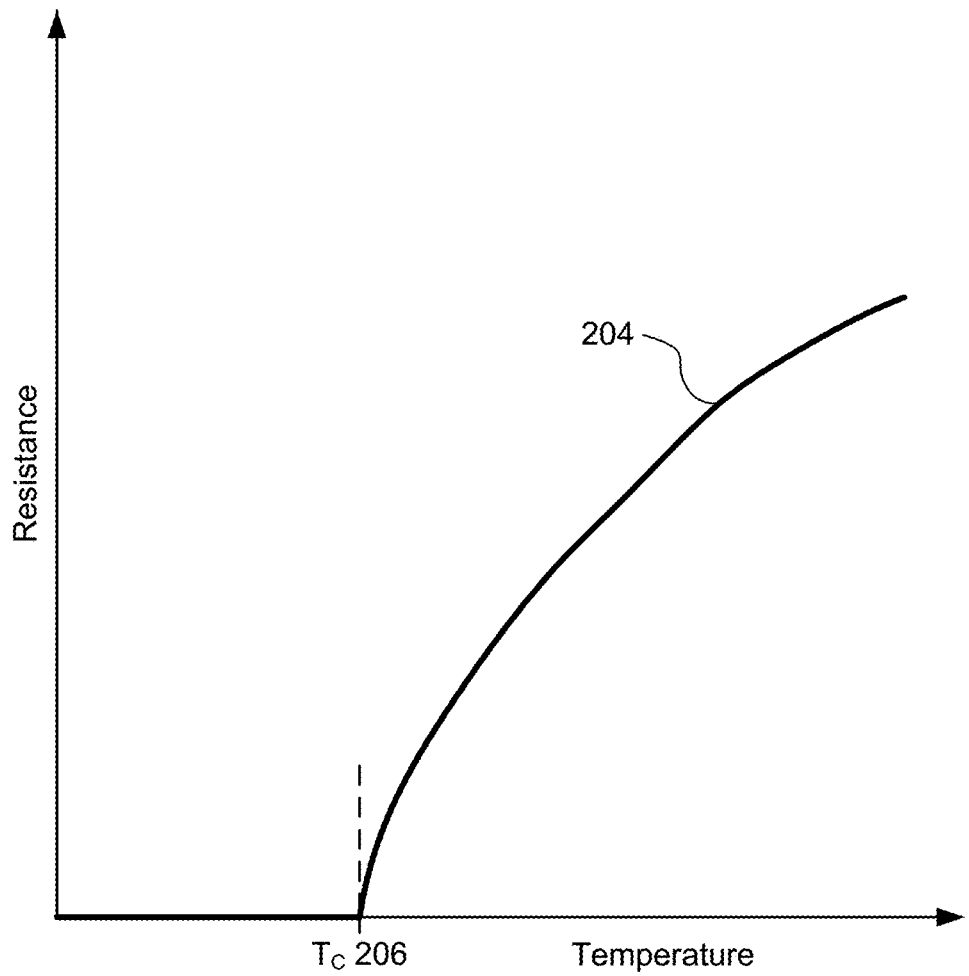
FIG. 2A is a graph illustrating a prophetic example of a relationship between resistance and temperature in a representative superconductor in accordance with some embodiments.
Figure 2B:
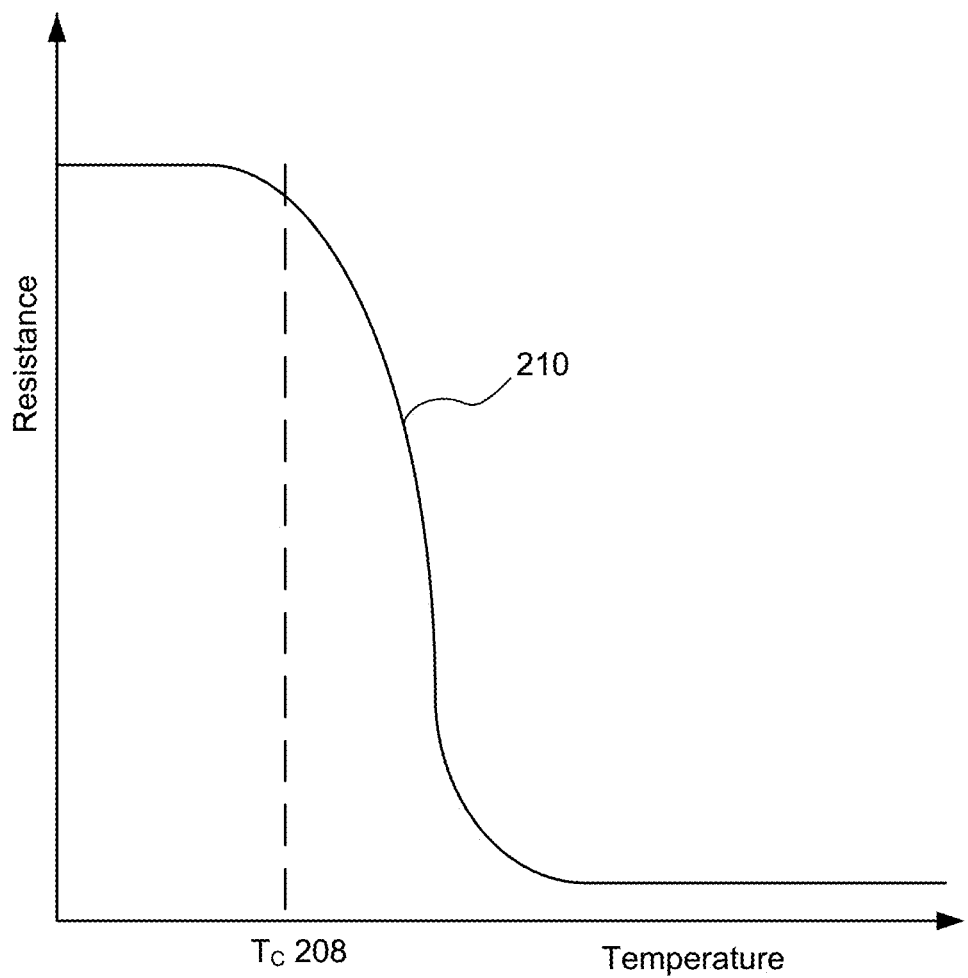
FIG. 2B is a graph illustrating a prophetic example of a relationship between resistance and temperature in a representative semiconductor in accordance with some embodiments.

As used herein, a semiconducting component is deemed to be in an "on" state when the semiconducting component is at a temperature above a critical temperature of a semiconducting material (e.g., Tc 208 in FIG. 2B). For example, in FIG. 2B, the semiconducting component has a low resistance at temperatures above the critical temperature of the semiconducting material. A semiconducting component is deemed to be in an "off" or "frozen" state when the semiconducting component is at a temperature below the critical temperature of a semiconducting material (e.g., Tc 208 in FIG. 2B). For example, in FIG. 2B, the semiconducting component has a high resistance at temperatures below the critical temperature of the semiconducting material. In some embodiments, the superconducting threshold temperature (e.g., Tc 206) is below the semiconducting threshold temperature (e.g., Tc 208).

As used herein, a transistor is deemed to be in an "on" state when a current is allowed to flow from a source of the transistor to a drain of the transistor (e.g., the transistor has a low drain-source resistance), and a transistor is deemed to be in an "off" state when a current flow from the source to the drain is prevented or reduced (e.g., the transistor has a high drain-source resistance).

As used herein, a "wire" is a section of material configured for transferring electrical current. In some embodiments, a wire includes a section of material conditionally capable of transferring electrical current (e.g., a wire made of a superconducting material that is capable of transferring electrical current while the wire is maintained at a temperature below a critical temperature). A cross-section of a wire (e.g., a cross-section that is perpendicular to a length of the wire) optionally has a geometric (e.g., flat or round) shape or an irregular (also sometimes called a non-geometric) shape. In some embodiments, a length of a wire is greater than a width or a thickness of the wire (e.g., the length of a wire is at least 5, 6, 7, 8, 9, or 10 times greater than the width and the thickness of the wire).

As used herein, the term "light intensity" or simply "intensity" refers to the number of photons incident on a unit area, e.g., a superconducting wire, per unit time. The term "intensity" includes a situation where only a single photon is incident on the detector in a given time period and also includes a situation where multiple photons are incident on the detector in the given time period. For example, a first light pulse having a first intensity that is greater than a second light pulse having a second intensity includes a first light pulse that includes more photons than a second light pulse. For example, the first light pulse can include 10 photons or 100 photons, while the second light pulse can include one photon, two photons, . . . , 9 photons, etc.

FIG. 1A is a perspective diagram illustrating components of a transistor 100 in accordance with some embodiments. As shown in FIG. 1A, the transistor 100 includes a semiconductor layer 102 (e.g., a semiconducting wire), a superconductor layer 106 (e.g., a superconducting wire), and an electrically-insulating layer 104 separating the semiconductor layer 102 from the superconductor layer 106. In some embodiments, the electrically-insulating layer 104 is an oxide layer. In some embodiments, the electrically-insulating layer 104 is carbon (e.g., diamond). In some embodiments, the electrically-insulating layer 104 is a layer of aluminum nitride (AlN). In some embodiments, the electrically-insulating layer 104 has a thickness between 2 nm and 10 nm. In some embodiments, the electrically-insulating layer 104 is thermally conductive. In some embodiments, the semiconductor layer 102 includes a layer of silicon or germanium. In some embodiments, the semiconductor layer 102 is a doped semiconductor (e.g., n-doped or p-doped) layer. In some embodiments, the superconductor layer 106 includes a layer of niobium or a niobium alloy.

As shown in FIG. 1A, the semiconductor layer 102 is a wire positioned perpendicular to a wire of the superconductor layer 106 in some embodiments. In some embodiments, the semiconductor layer 102 is a wire positioned in another orientation with respect to a wire of the superconductor layer 106 (e.g., positioned in parallel or at any other angle).

Figure 1B:
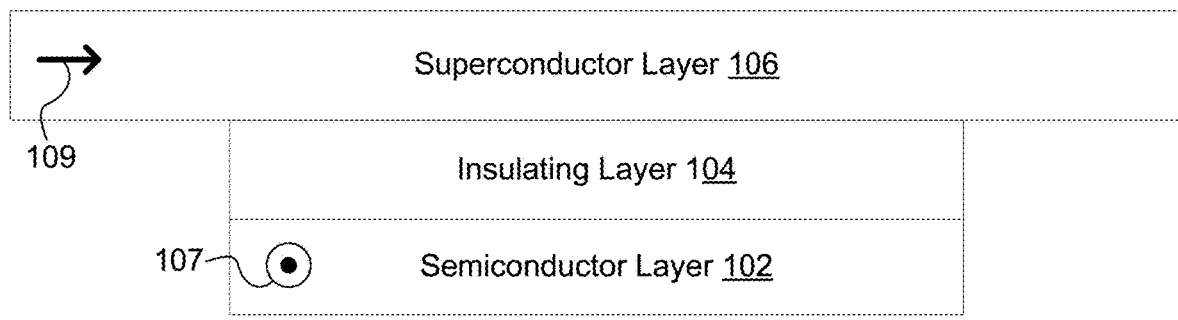
FIGS. 1B-1E are cross-sectional diagrams illustrating components of representative transistors in accordance with some embodiments.

FIGS. 1B-1E are cross-sectional diagrams illustrating components of representative transistors in accordance with some embodiments. FIG. 1B shows a first arrangement for the transistor components, where the superconductor layer 106 is on top of, and substantially perpendicular to, the semiconductor layer 102, as shown in FIG. 1A (e.g., within 20 degrees, 10 degrees, or 5 degrees of being exactly perpendicular). The semiconductor layer 102 and the superconductor layer 106 are separated by the insulating layer 104. FIG. 1B further shows that the superconductor layer 106 is configured to allow current to flow through the superconductor layer 106 from left to right (denoted by arrow 109) and the semiconductor layer 102 is configured to allow current to flow through the semiconductor layer 102 into the page (denoted by the circle 107).

Figure 1C:
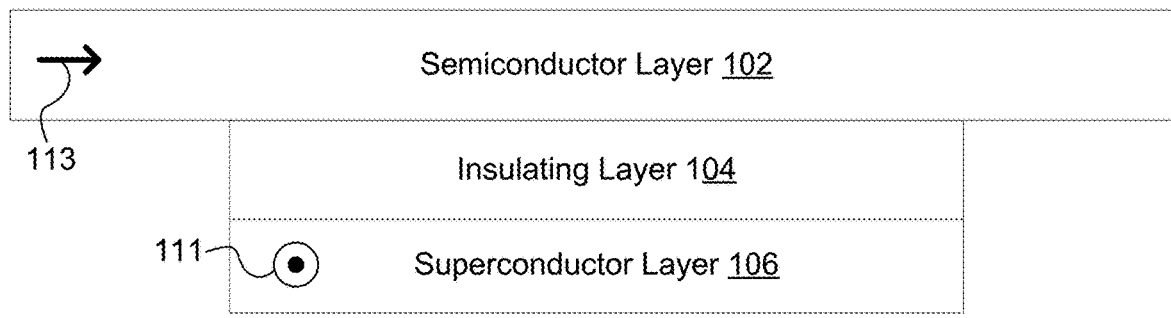

FIG. 1C shows a second arrangement for the transistor components, where the semiconductor layer 102 is on top of, and perpendicular to, the superconductor layer 106. The semiconductor layer 102 and the superconductor layer 106 are separated by the insulating layer 104. FIG. 1C further shows that the semiconductor layer 102 is configured to allow current to flow through the semiconductor layer 102 from left to right (denoted by arrow 113) and the superconductor layer 106 is configured to allow current to flow through the superconductor layer 106 into the page (denoted by circle 111).

Figure 1D:
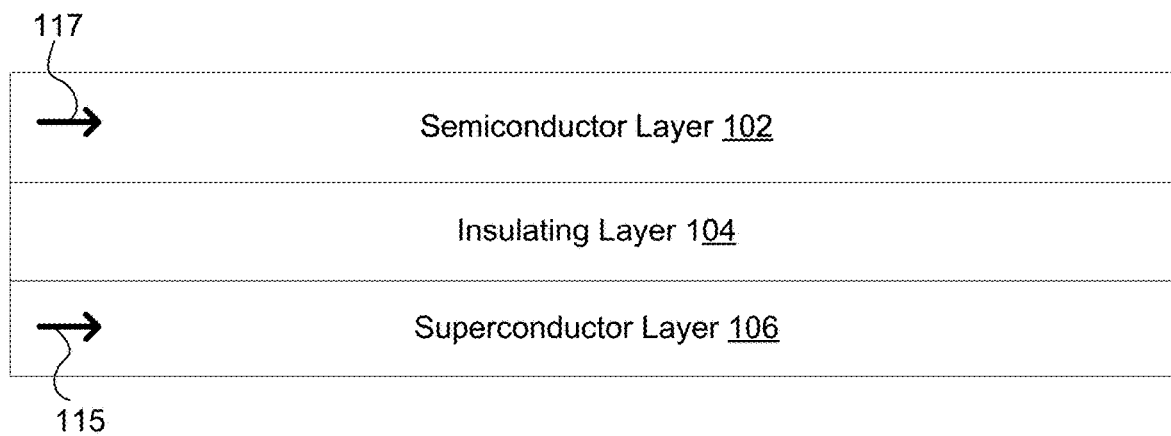

FIG. 1D shows a third arrangement for the transistor components, where the semiconductor layer 102 is on top of, and substantially parallel to, the superconductor layer 106 (e.g., within 20 degrees, 10 degrees, or 5 degrees of being exactly parallel). The semiconductor layer 102 and the superconductor layer 106 are separated by the insulating layer 104. FIG. 1D further shows the semiconductor layer 102 is configured to allow current to flow through the semiconductor layer 102 from left to right (denoted by the arrow 117), and the superconductor layer 106 is configured to allow current to flow through the superconductor layer 106 from left to right (denoted by arrow 115).

Although FIG. 1D shows an arrangement where the semiconductor layer 102 is on top of, and parallel to, the superconductor layer 106, in some embodiments, the superconductor layer 106 is on top of, and parallel to, the semiconductor layer 102. For brevity, this arrangement is not illustrated.

Figure 1E:
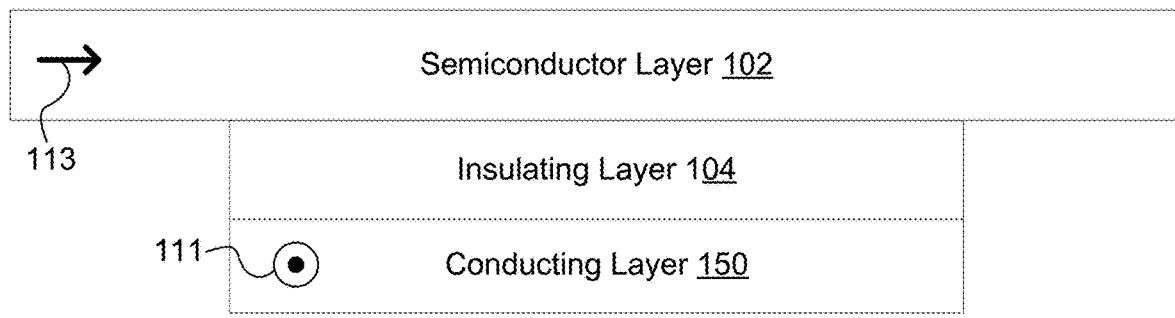

FIG. 1E shows an arrangement for transistor components, where the semiconductor layer 102 is on top of, and perpendicular (e.g., within 20 degrees, 10 degrees or 5 degrees of being exactly perpendicular) to, a conducting layer 150. The semiconductor layer 102 and the conducting layer 150 are separated by the insulating layer 104. FIG. 1E further shows that the semiconductor layer 102 is configured to allow current to flow through the semiconductor layer 102 from left to right (denoted by arrow 113) and the conducting layer 150 is configured to allow current to flow through the conducting layer 150 into the page (denoted by circle 111). In some embodiments, the conducting layer 150 is a superconducting material in a non-superconducting state. In some embodiments, the conducting layer 150 is composed of metal and/or a metal alloy. In some embodiments, the semiconductor layer 102 and the conducting layer 150 are configured such that the respective current flow through each layer is parallel (e.g., within 20 degrees, 10 degrees, or 5 degrees of being exactly parallel) to one another (e.g., as illustrated in FIG. 1D).

Although FIGS. 1B-1E show the insulating layer 104 only on one side of the bottom layer (e.g., over the semiconductor layer 102 as shown in FIG. 1B), in some embodiments, the insulating layer 104 is on two, three, four, five, or six sides of the bottom layer (e.g., the insulating layer encloses the bottom layer).

FIG. 2A is a graph illustrating a prophetic example of a relationship 204 between resistance and temperature in a representative superconductor (e.g., superconductor layer 106) in accordance with some embodiments. As shown in FIG. 2A, the superconductor has zero resistance at temperatures below a critical temperature Tc 206 (also sometimes called a superconducting threshold temperature) (e.g., the superconductor is in a superconducting state). At the critical temperature Tc 206, the superconductor transitions to a non-superconducting state and the resistance increases with an increasing temperature. This transition causes heat to be generated by the superconductor (e.g., the superconductor in a non-superconducting state generates heat from the current flowing through the superconductor having an increased, non-zero resistance). In some embodiments, the critical temperature Tc 206 is in the range of 5 Kelvin to 15 Kelvin. In some embodiments, the critical temperature Tc 206 is in the range of 5 Kelvin to 10 Kelvin.

FIG. 2B is a graph illustrating a prophetic example of a relationship 210 between resistance and temperature in a representative semiconductor (e.g., semiconductor layer 102) in accordance with some embodiments. As shown in FIG. 2B, the semiconductor has a high resistance at temperatures below a critical temperature Tc 208 (sometimes also called a freezing temperature or a semiconducting threshold temperature) (e.g., the semiconductor is in an off state with no current flow). At the critical temperature Tc 208, the semiconductor transitions to an "on" state and the resistance of the semiconductor decreases with an increasing temperature. In some embodiments, the critical temperature Tc 208 is in the range of 3 Kelvin to 12 Kelvin. In some embodiments, the critical temperature Tc 208 is in the range of 30 Kelvin to 50 Kelvin. In some embodiments, the semiconductor is doped to adjust the critical temperature (e.g., to lower the critical temperature).

Figure 2C:
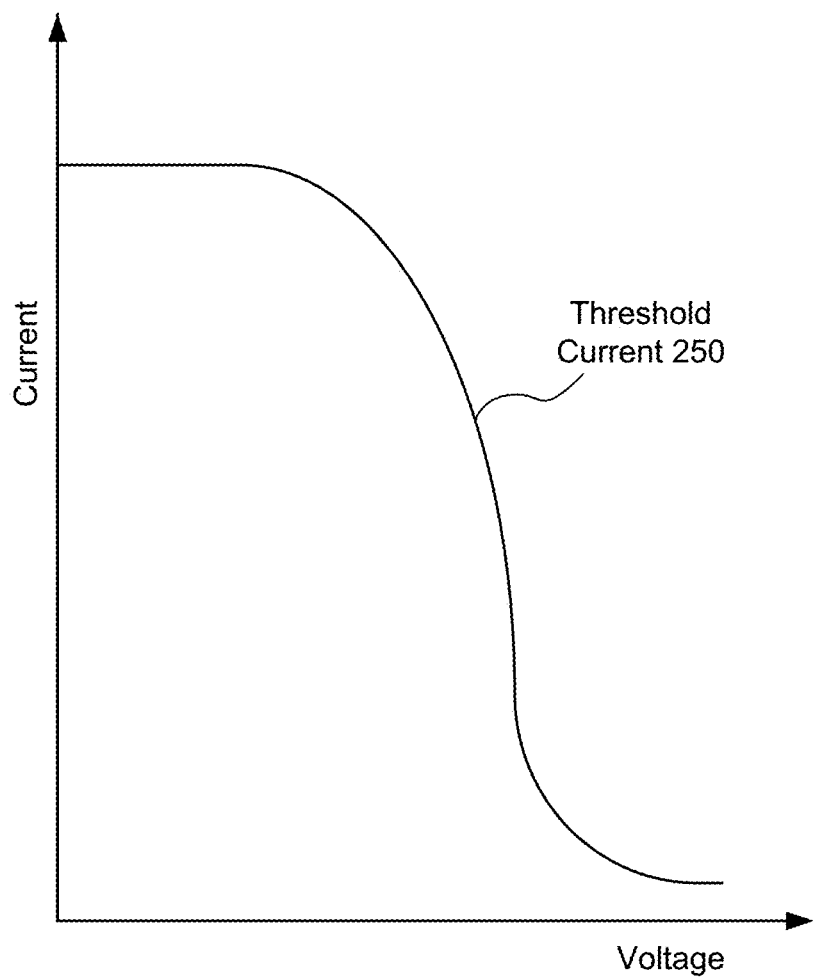
FIG. 2C is a graph illustrating a prophetic example of a relationship between current and voltage in a representative semiconductor in accordance with some embodiments.

FIG. 2C is a graph illustrating a prophetic example of a relationship between threshold current and voltage in a representative superconductor-based transistor (e.g., the transistor 100 in FIG. 1A) in accordance with some embodiments. As shown in FIG. 2C, as more voltage is applied to the semiconductor component (e.g., the semiconductor layer 102, FIG. 1A) a superconducting current threshold 250 for the superconductor component (e.g., the superconductor layer 106, FIG. 1A) decreases. Thus, as more voltage is applied to the semiconductor component less input current is needed to transition the superconductor component from a superconducting state to a non-superconducting state. In some instances and embodiments, the voltage applied to the semiconductor component generates an electromagnetic field (e.g., at a freeze-out region of the semiconductor) in proximity to the superconducting component, which lowers the superconducting current threshold 250.

Figure 3A:
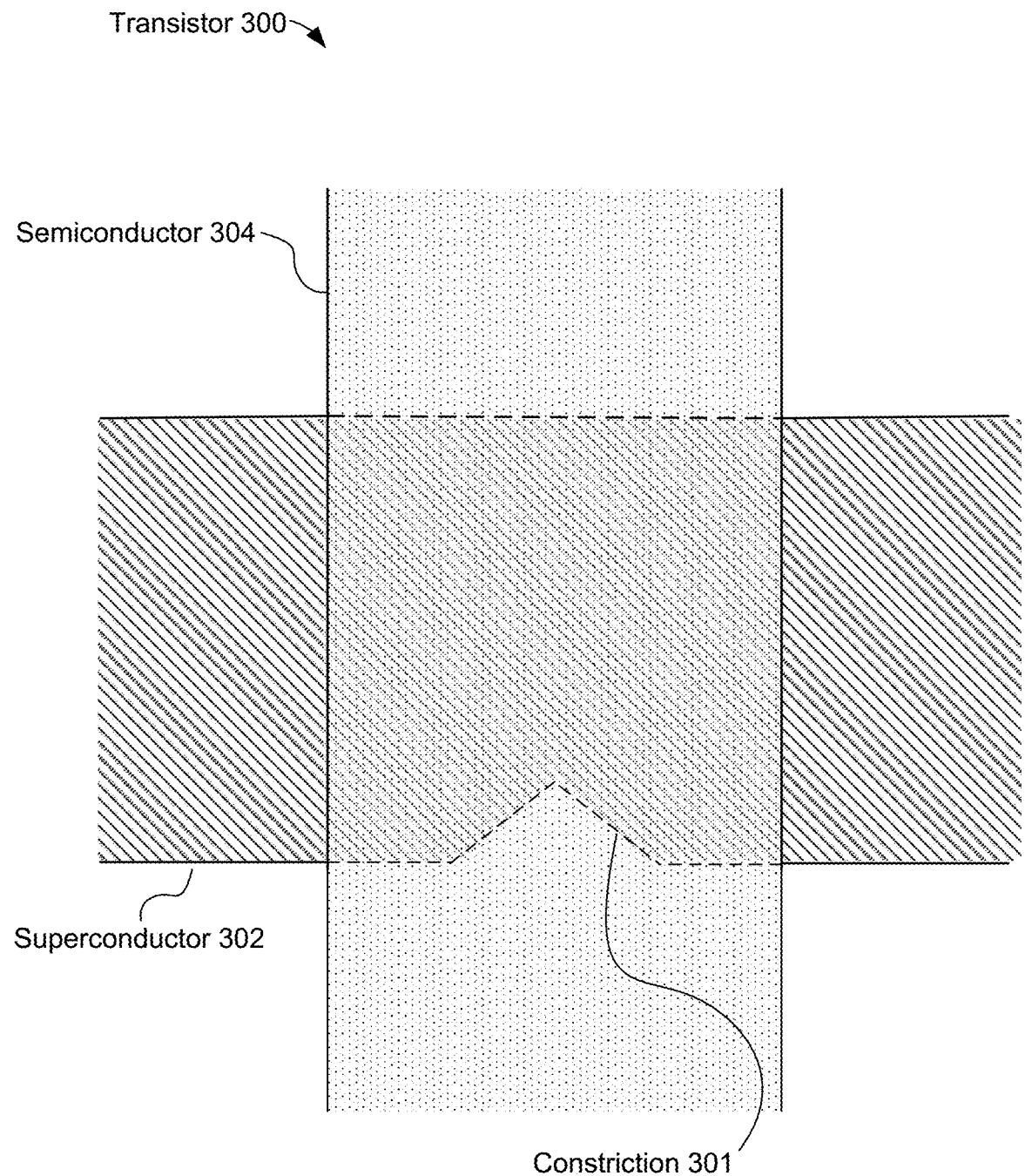
FIGS. 3A-3C are plan view (sometimes called top-down) schematic diagrams illustrating representative transistor devices in accordance with some embodiments.
Figure 3B:
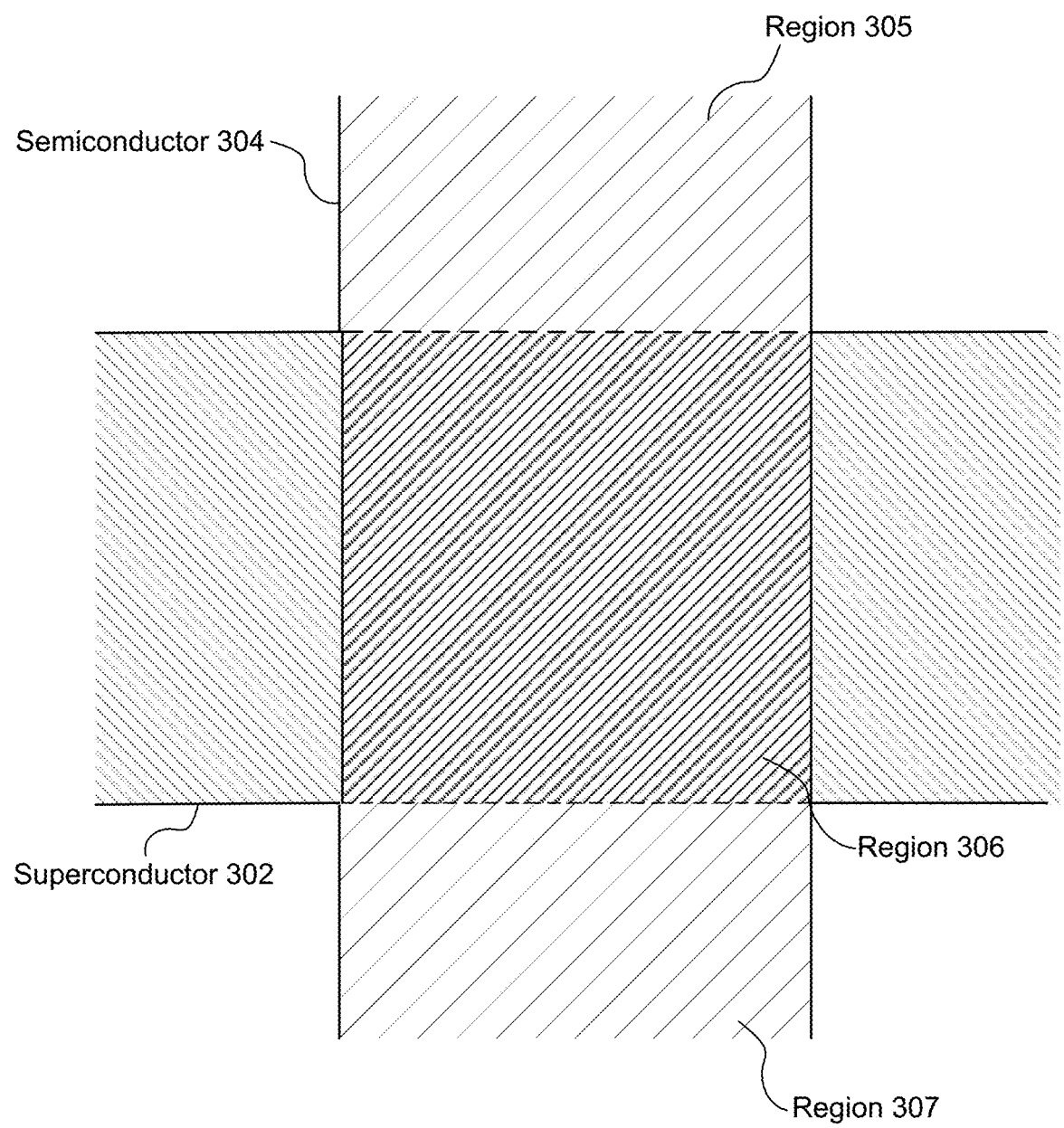
Figure 3C:
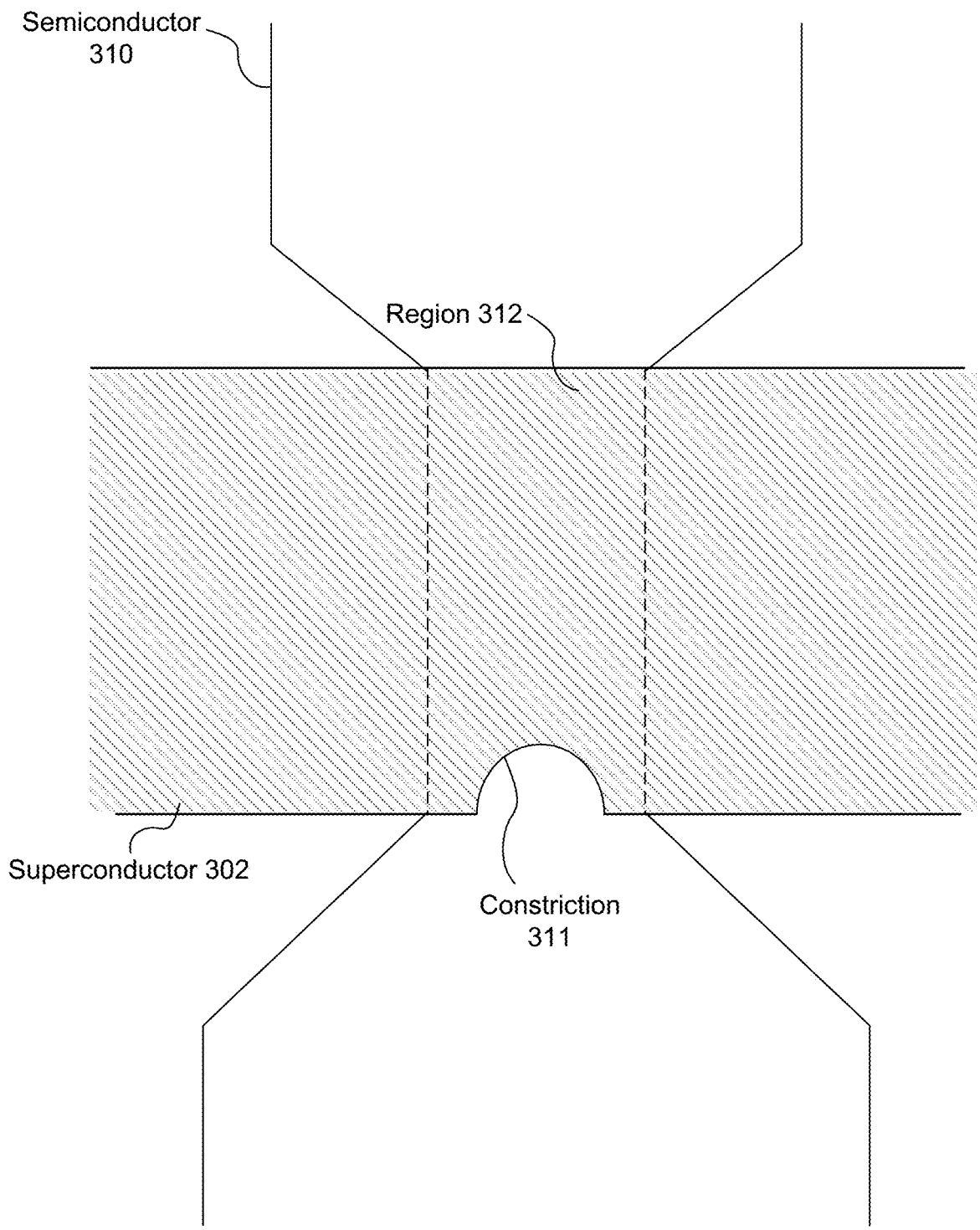

FIGS. 3A-3C are diagrams illustrating representative transistor devices in accordance with some embodiments. FIG. 3A shows a transistor 300 with a superconductor 302 (e.g., a superconducting wire) proximate to (e.g., under) a semiconductor 304 (e.g., a semiconducting wire). FIG. 3A also shows a constriction 301 (also sometimes called a constricted region) of the superconductor 302 at a location proximate to the semiconductor 304 (e.g., the constriction 301 is located under the semiconductor 304). In some embodiments, the constriction 301 is a narrowing of the width of the superconductor 302. In some embodiments, the constriction 301 is made of a non-superconducting material (e.g., an insulating material) whose presence narrows the width of the superconductor 302.

FIG. 3B also shows a superconductor 302 (e.g., a superconducting wire) proximate to (e.g., under) a semiconductor 304 (e.g., a semiconducting wire). In FIG. 3B, the semiconductor 304 has three regions, region 305, region 306, and region 307. In some embodiments, the regions 305 and 307 have a lower critical temperature (e.g., Tc 208) than the region 306. In some embodiments, the regions 305 and 307 are doped at a higher level than region 306. In some embodiments, the regions 305 and 307 have a coating (e.g., a metal coating) that lowers the regions' critical temperatures.

In some embodiments in which the region 306 of the semiconductor 304 has a highest critical temperature, the region 306 may operate as a block preventing current flow through the semiconductor, e.g., when the semiconductor 304 is at a temperature that is higher than respective critical temperatures of regions 305 and 307, but below the critical temperature of region 306. In this example, once the region 306 heats up to its critical temperature, current will flow through the semiconductor 304. In some embodiments, a portion of the superconductor 302 that is proximate to the semiconductor 304 has a constriction (e.g., similar to the constriction 301 shown in FIG. 3A).

Although FIG. 3B illustrates that the boundary of the regions 305 and 306 and the boundary of the regions 306 and 307 are aligned with the boundaries of the superconductor 302, in some embodiments, the boundary of the regions 305 and 306 and the boundary of the regions 306 and 307 are not aligned with the boundaries of the superconductor 302. For example, in some embodiments, the superconductor 302 is located over a portion of the region 305 and/or a portion of the region 307.

FIG. 3C shows a superconductor 302 (e.g., a superconducting wire) proximate to (e.g., above) a semiconductor 310 (e.g., a semiconducting wire). In FIG. 3C, the semiconductor 310 has a narrow region 312 proximate to (e.g., under) the superconductor 302. In some embodiments, the semiconductor 310 is configured such that the narrow region 312 has a higher critical temperature (e.g., Tc 208) than the neighboring regions of the semiconductor 310. FIG. 3C also shows an optional semi-circular constriction 311 on the superconductor 302 at a location proximate to (e.g., above) the semiconductor 310. In some embodiments, the constriction 311 lowers a critical current for the superconductor at the location of the constriction (e.g., the critical current is based in part on a width of the superconductor). In some embodiments, the superconductor 302 is configured such that, when supplied with a current in excess of a critical current of the superconductor, the superconductor transitions to a non-superconducting state at a location proximate to the constriction 311. As discussed below, this transition to the non-superconducting state generates heat that can transfer to the semiconductor 310.

Although FIG. 3C shows that the narrow region 312 spans the entire width of the superconductor 302, in some embodiments, the length of the narrow region 312 is distinct from the width of the superconductor 302. For example, in some embodiments, the length of the narrow region 312 is less than the width of the superconductor 302. In some embodiments, the length of the narrow region 312 is greater than the width of the superconductor 302.

Although FIGS. 3A-3C illustrate the superconductor 302 located over a respective semiconductor, in some embodiments, the superconductor 302 is located under the respective semiconductor, and the constriction 301 of the superconductor 302 is located below the respective semiconductor. For brevity, these details are not repeated herein.

Although some of FIGS. 3A-3C illustrate constrictions having particular shapes, in some embodiments, the constrictions have different shapes. In some embodiments, the constriction has a shape of a triangle with or without one or more rounded corners, a rectangle with or without one or more rounded corners, or a portion of a circle or an ellipse, or a non-geometric (e.g., irregular) shape.

Figure 4A:
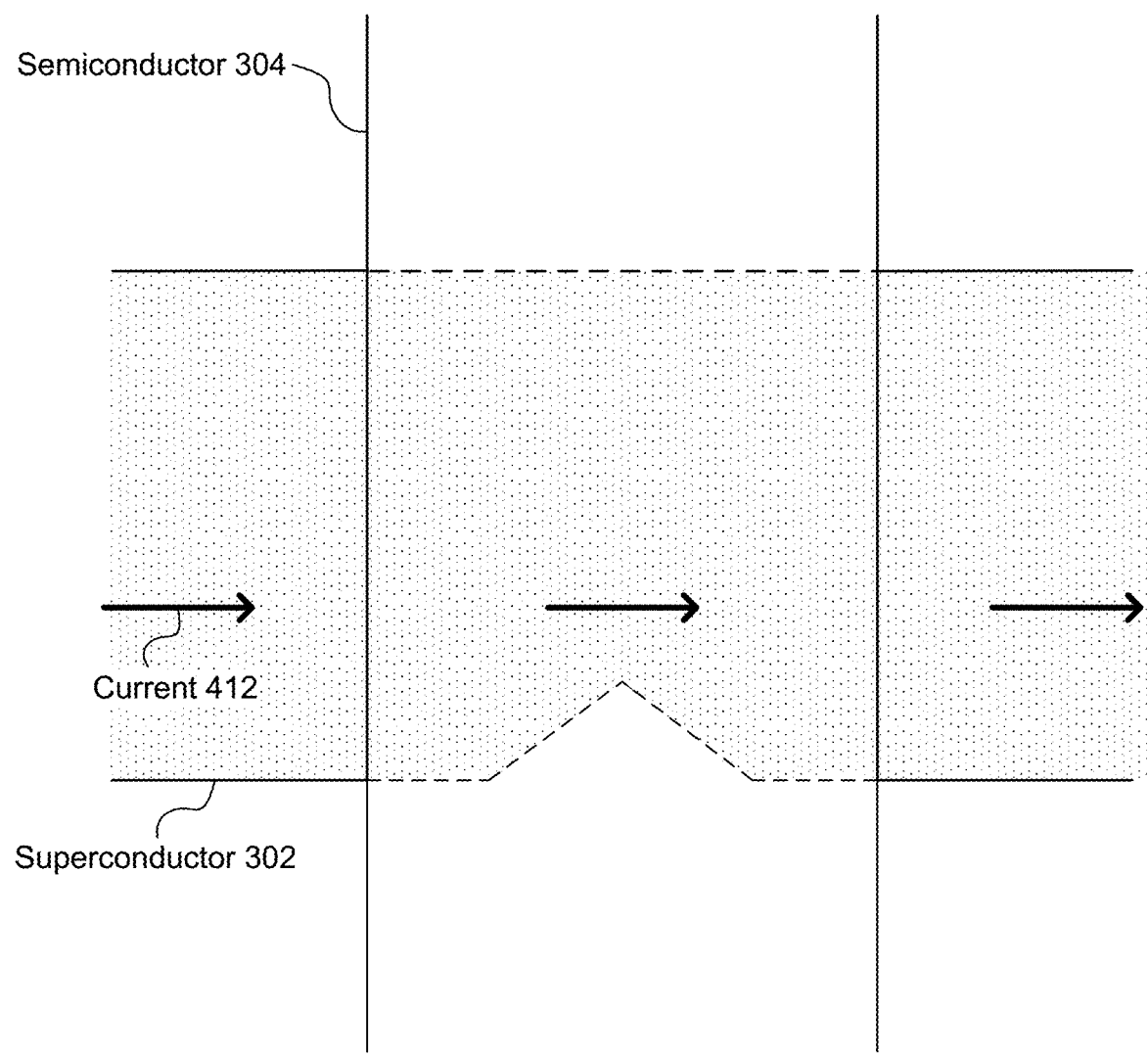
FIGS. 4A-4C are diagrams illustrating a prophetic example of a representative operating sequence of the transistor device of FIG. 3A in accordance with some embodiments.
Figure 4B:
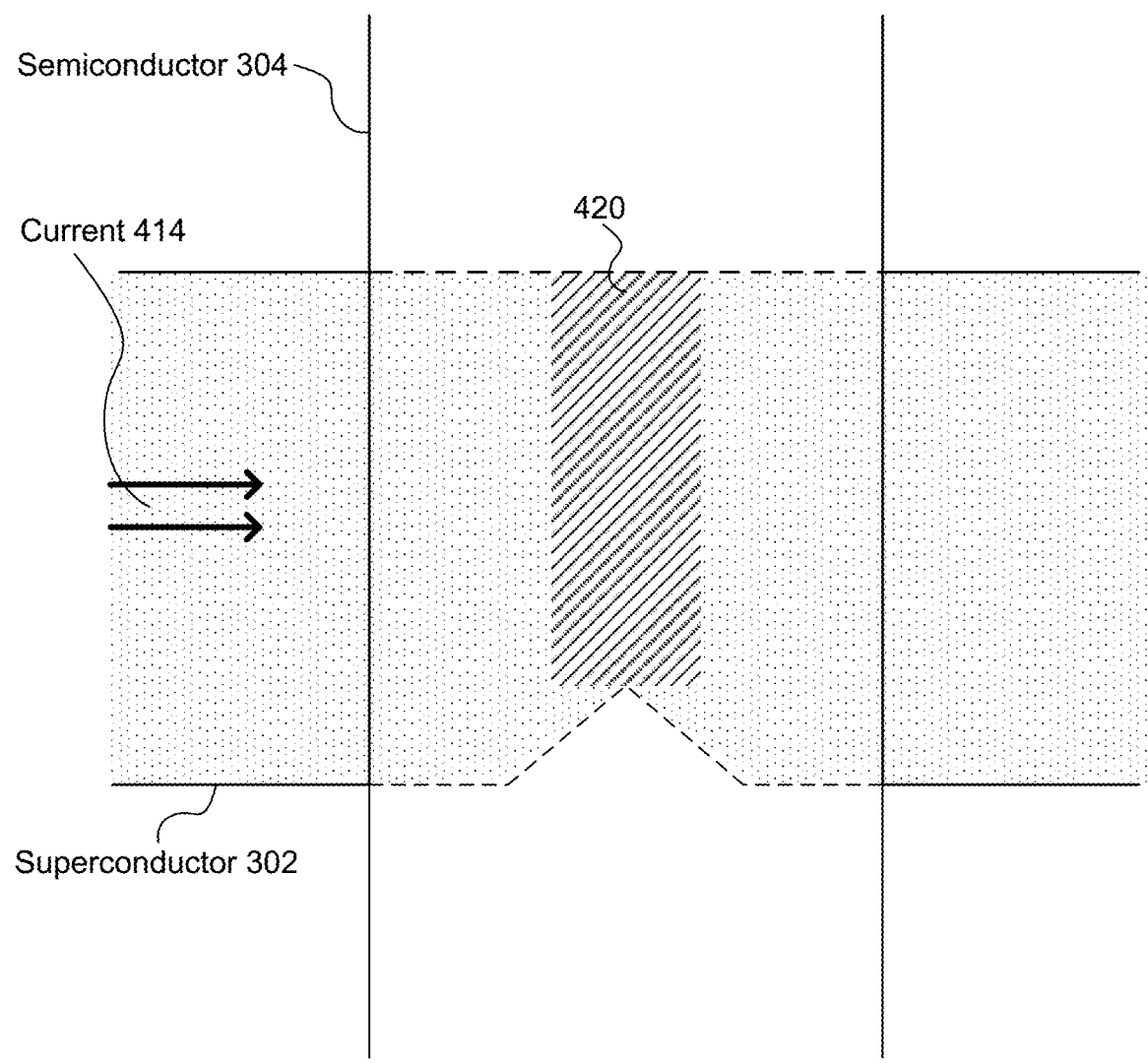
Figure 4C:
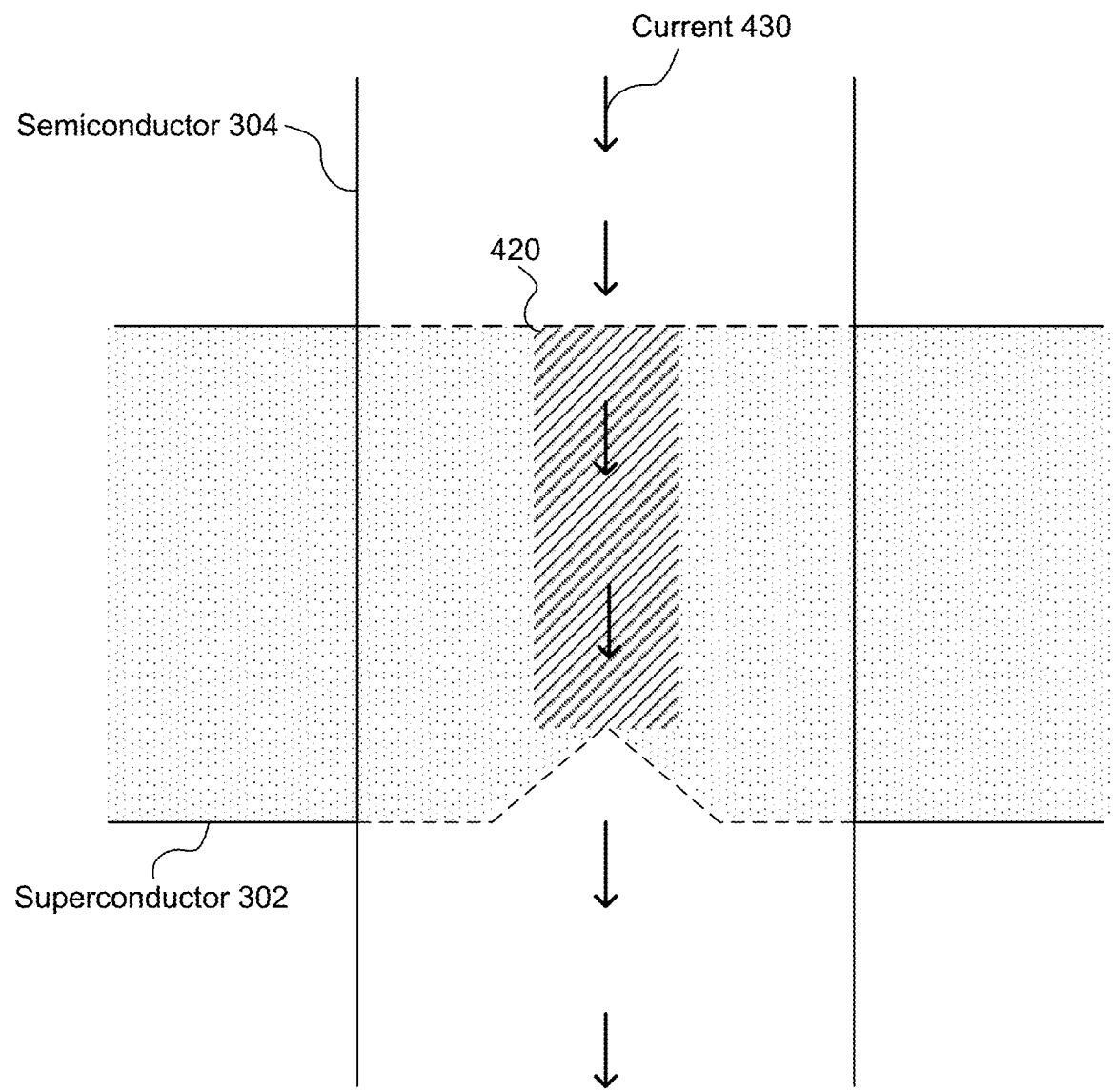

FIGS. 4A-4C are diagrams illustrating a prophetic example of an operating sequence of the transistor device 300 of FIG. 3A in accordance with some embodiments. FIG. 4A shows the transistor device having a superconductor 302 as a gate and a semiconductor 304 as a source and drain. At the first time shown in FIG. 4A, a current 412 (e.g., a current below a critical current for the superconductor 302) is supplied to the superconductor 302. In accordance with some embodiments, the superconductor 302 in FIG. 4A is in a superconducting state. FIG. 4A further shows the semiconductor 304 with no current flow (e.g., the semiconductor 304 is in an off state due to a temperature of the semiconductor 304 being below a critical temperature for the semiconductor). Thus, in FIG. 4A, the transistor device is in an off state (e.g., no current flows through the semiconductor 304 from the source to the drain).

FIG. 4B shows the transistor device at a second time, subsequent to the first time. At the second time, a current 414 (e.g., a current at or above the critical current for the superconductor 302) is supplied to the superconductor 302. The current 414 causes a portion of the superconductor 302 to transition into a non-superconducting state. The superconductor 302 in FIG. 4B includes a non-superconducting region 420 at the constriction location due to the current 414 exceeding the critical current for that region. This transition of the portion of the superconductor 302 from the superconducting state to the non-superconducting state generates heat.

FIG. 4C shows the transistor device at a third time, subsequent to the second time. As shown in FIG. 4C, the semiconductor 304 has a current 430 passing through it. In accordance with some embodiments, the heat generated by the transition of the superconductor 302 in FIG. 4B to the non-superconducting state is sufficient to increase a temperature of the semiconductor 304 above a critical temperature (e.g., Tc 208) of the semiconductor 304 (e.g., the heat generated by the transition of the superconductor 302 in FIG. 4B to the non-superconducting state increases a temperature of at least a portion of the semiconductor 304 adjacent to the constriction above a critical temperature (e.g., Tc 208) of the semiconductor 304). At temperatures above the critical temperature of the semiconductor 304, current 430 is allowed (enabled) to pass through a portion of the semiconductor 304 adjacent to the constriction. Thus, in FIG. 4C, the transistor device is in an on state (e.g., allowing current flow from the source to the drain).

In some embodiments, one or more portions of the semiconductor 304 adjacent to the non-superconducting region are maintained above the critical temperature (e.g., Tc 208) of the semiconductor 304. In some embodiments, one or more portions of the semiconductor 304 adjacent to the non-superconducting region are doped to lower the critical temperature (e.g., Tc 208) of the semiconductor 304 for the one or more portions of the semiconductor 304 (e.g., FIG. 3B). In some embodiments, one or more portions of the semiconductor 304 adjacent to the non-superconducting region are coated with metal to allow current flow at a temperature below the critical temperature (e.g., Tc 208) of the semiconductor 304. In some embodiments, one or more portions of the semiconductor 304 adjacent to the non-superconducting region are configured to have a wider width than the non-superconducting region (e.g., FIG. 3C) so that the resistance of the one or more portions of the semiconductor 304 adjacent to the non-superconducting region is lower than the resistance of the non-superconducting region even when the entire semiconductor 304 is below the critical temperature (e.g., Tc 208) of the semiconductor 304.

In some embodiments, the non-superconducting region 420 of the superconductor 302 prevents or reduces current flow through the superconductor 302. Once the current 412 is no longer supplied, the non-superconducting region 420 (and the semiconductor 304) cool down over time. Once the temperature of the semiconductor 304 falls below the critical temperature of the semiconductor 304, the current flow through the semiconductor 304 is reduced or blocked (e.g., the semiconductor 304 returns to the "freeze-out" state).

Figure 5A:
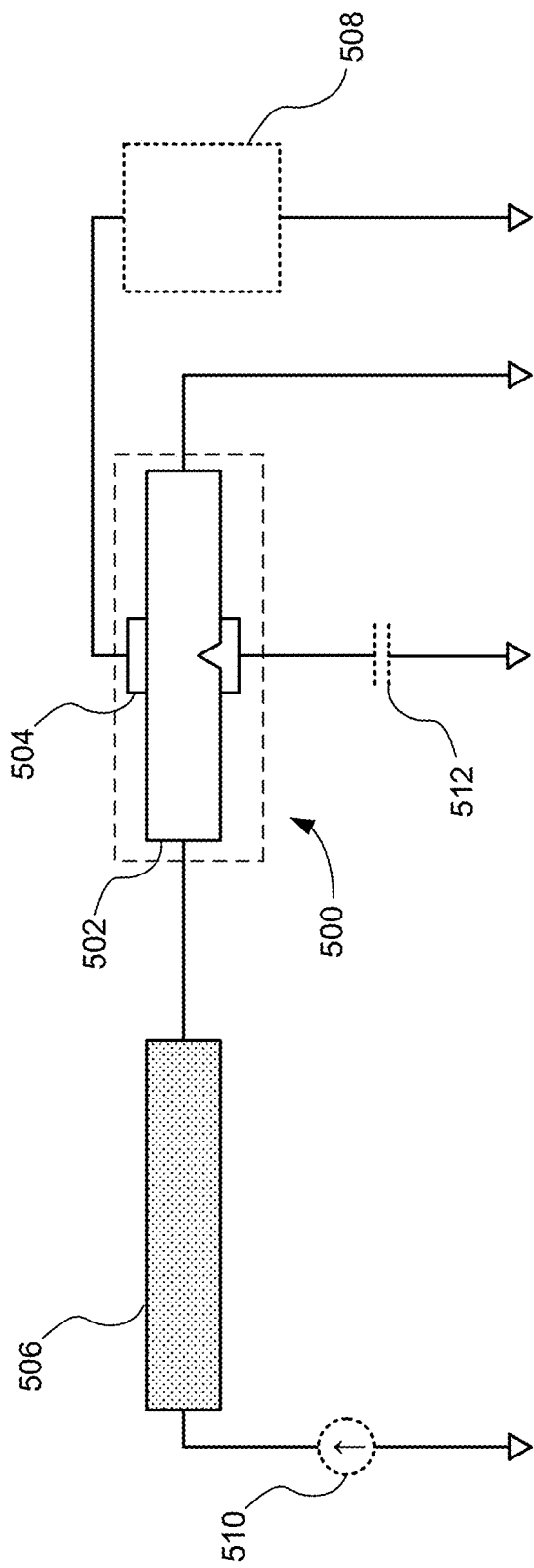
FIG. 5A is a schematic diagram illustrating an example photodetector in accordance with some embodiments.

FIG. 5A is a schematic diagram illustrating an example photodetector in accordance with some embodiments. FIG. 5A illustrates a photodetector that includes a transistor 500. The transistor 500 includes superconducting component 502 (which has one or more characteristics of superconductor layer 106 and/or superconductor 302) and semiconducting component 504 (which has one or more characteristics of semiconductor layer 102 and/or semiconductor 304). Typically, superconducting component 502 is electrically insulated from semiconducting component 504 (e.g., an electrical insulator is located between superconducting component 502 and semiconducting component 504), and superconducting component 502 is thermally coupled with semiconducting component 504 (e.g., heat generated by the superconducting component 502 transfers to the semiconducting component 504).

The photodetector also includes semiconductor photodetector 506 (e.g., a photodiode that includes silicon, germanium, indium gallium arsenide, lead sulfide, and/or mercury cadmium telluride). In some embodiments, semiconductor photodetector 506 is voltage-biased (e.g., using an optional voltage source). Semiconductor photodetector 506 is configured to generate photoelectrons upon receiving light. In FIG. 5A, semiconductor photodetector 506 is electrically coupled to superconducting component 502. Thus, the generated photoelectrons supply a current to the superconducting component 502. In some embodiments, semiconductor photodetector 506 is directly coupled to superconducting component 502. In some embodiments, semiconductor photodetector 506 is coupled to superconducting component 502 via one or more electrical components (e.g., wires, resistors, inductors, etc.).

In some embodiments, (not shown) the transistor 500 is configured to be a photodetector. For example, the superconducting component 502 of the transistor 500 is coupled to a waveguide so as to detect photons from the waveguide. In some embodiments in which the superconducting component 502 is configured to be a photodetector, the superconducting component 502 is biased so as to operate in a superconducting state in the absence of incident photon(s). In some embodiments, in response to receiving incident photon(s) of a first intensity, photocarriers (also called hot electrons) are generated in the superconductor (e.g., through the breaking of the superconductor's cooper pairs) which, in turn, causes transition of superconducting component 502 from a superconducting state to a non-superconducting state. In some embodiments in which the superconducting component 502 is configured to be a photodetector, the photodetector does not include the semiconductor photodetector 506.

FIG. 5A also illustrates that the photodetector optionally includes readout circuit 508, source 510 (e.g., a current source), and/or additional electrical components, such as capacitor 512.

In some embodiments, readout circuit 508 includes one or more superconductor and/or semiconductor components. In some embodiments, readout circuit 508 is configured to transition to a state that indicates whether a resistance of semiconducting component 504 is a logical 0 (e.g., resistance is greater than a predefined resistance threshold) or a logical 1 (e.g., resistance is less than the predefined resistance threshold), and thereby facilitates providing the logical state of the photodetector to other circuits or system components. In some embodiments, readout circuit 508 is configured to measure a current flowing through semiconducting component 504 or a voltage drop over semiconducting component 504. For example, in some embodiments, readout circuit 508 is a voltage readout circuit. In some embodiments, readout circuit 508 includes a resistor (e.g., 50 ohms) and the readout circuit is configured to measure a voltage drop over the resistor. In some embodiments, readout circuit 508 includes a voltage source or a current source.

In some embodiments, source 510 provides an electrical signal (e.g., an electrical current) that is used to bias semiconductor photodetector 506 and/or superconducting component 502.

Figure 5B:
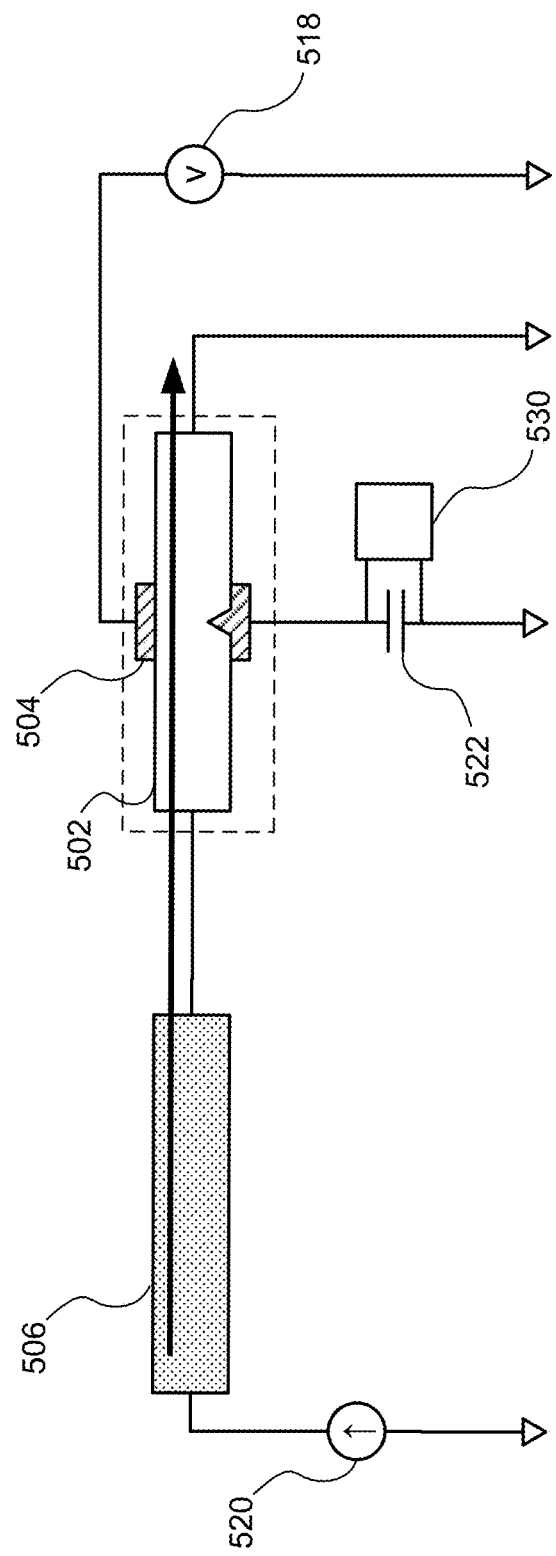
FIGS. 5B-5E are schematic diagrams illustrating operations of an example photodetector in accordance with some embodiments.

FIGS. 5B-5E are schematic diagrams illustrating an example photodetector and its operations in accordance with some embodiments. The example photodetector shown in FIG. 5B is similar to the photodetector shown in FIG. 5A, except that the photodetector shown in FIG. 5B includes voltage source 518 and readout circuit 530. The photodetector shown in FIG. 5B also includes current source 520 and capacitor 522.

FIG. 5B illustrates that current from current source 520 flows through semiconductor photodetector 506 and superconducting component 502 while superconducting component 502 and semiconducting component 504 remain below respective threshold temperatures (e.g., superconducting component 502 is at a temperature below a threshold temperature of superconducting wire 502 and semiconducting component 504 is at a temperature below a threshold temperature of semiconducting component 504). Thus, superconducting component 502 is in a superconducting state and semiconducting component 504 is in an "off" state.

While semiconducting component 504 is in the "off" state, there is a small (or zero) voltage differential over capacitor 522, and semiconducting component 504 in the "off" state has a larger voltage differential.

Figure 5C:
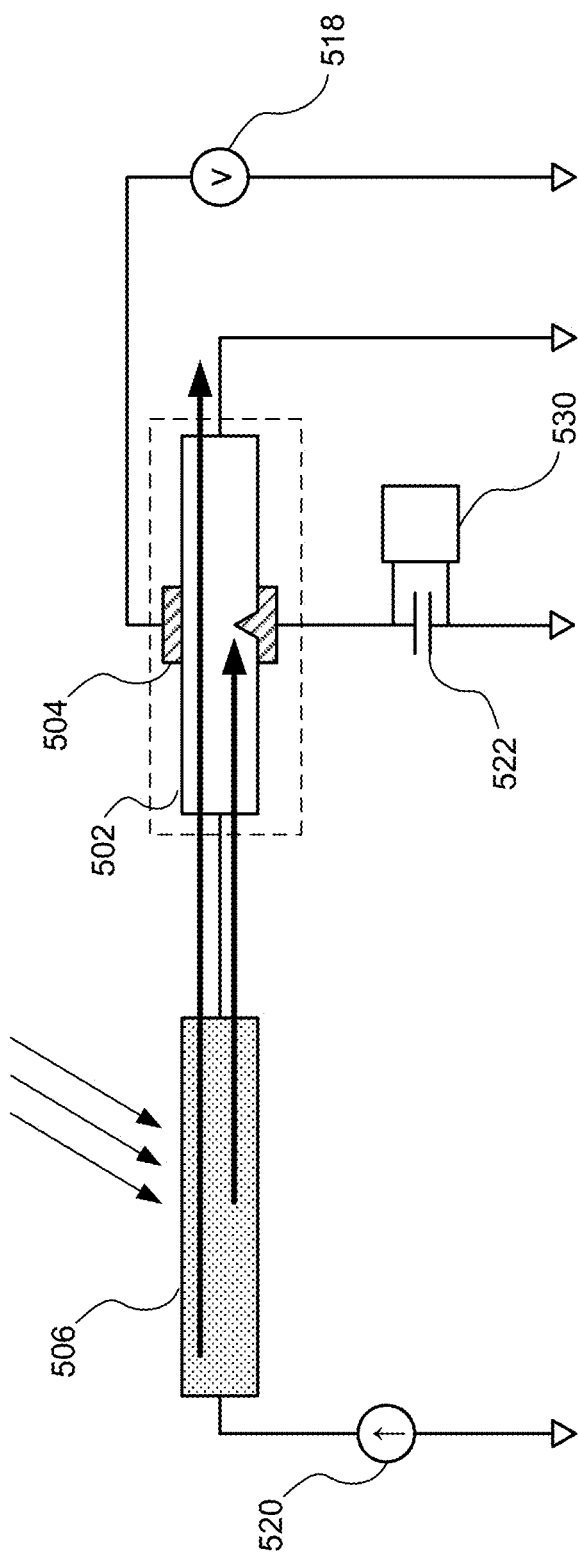

FIG. 5C illustrates that semiconductor photodetector 506 is exposed to light. Semiconductor photodetector 506, in response to receiving the light, generates photoelectrons, which, in turn, generates photocurrent flowing toward superconducting component 502.

Figure 5D:
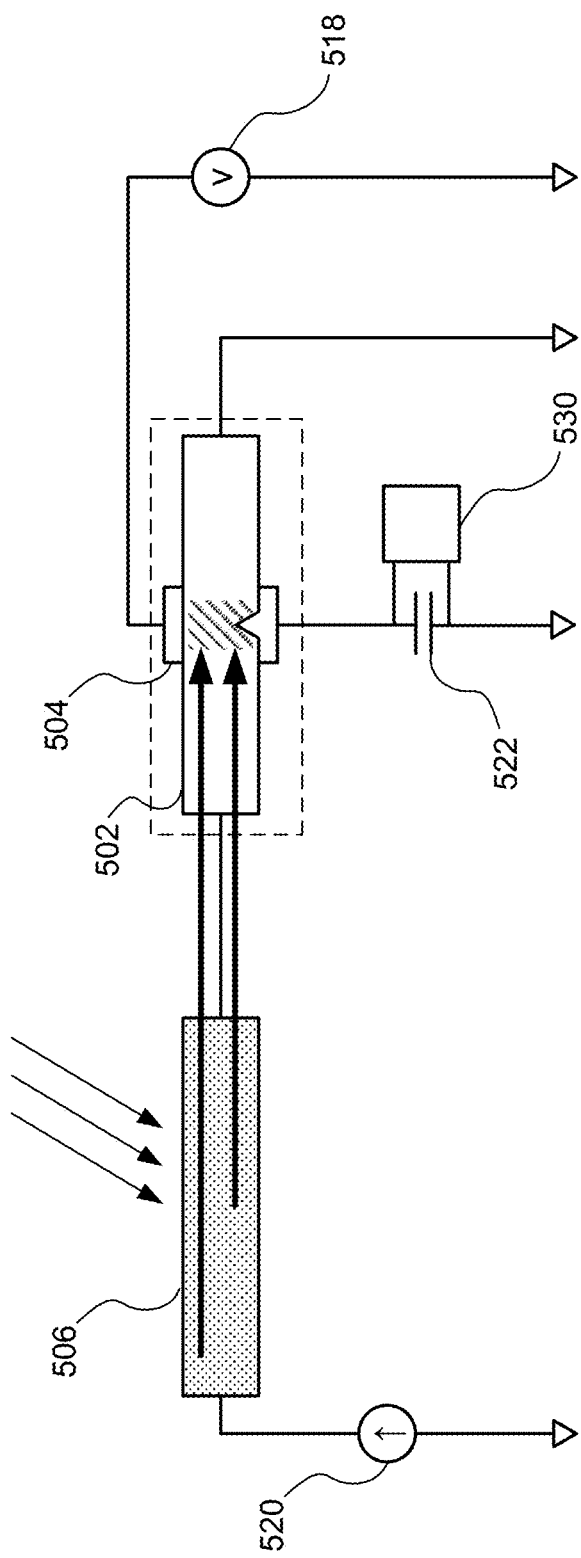

FIG. 5D illustrates that a combination of current provided by current source 520 and the photocurrent is above a current threshold of superconducting component 502, and superconducting component 502 transitions from a superconducting state to a non-superconducting state. Superconducting component 502 generates heat during the transition of superconducting component 502 from the superconducting state to the non-superconducting state and/or while superconducting component 502 remains in the non-superconducting state due to the current provided to superconducting component 502. The heat generated by superconducting component 502 is transferred to semiconducting component 504, and in turn, increases the temperature of semiconducting component 504 above the threshold temperature of semiconducting component 504.

Figure 5E:
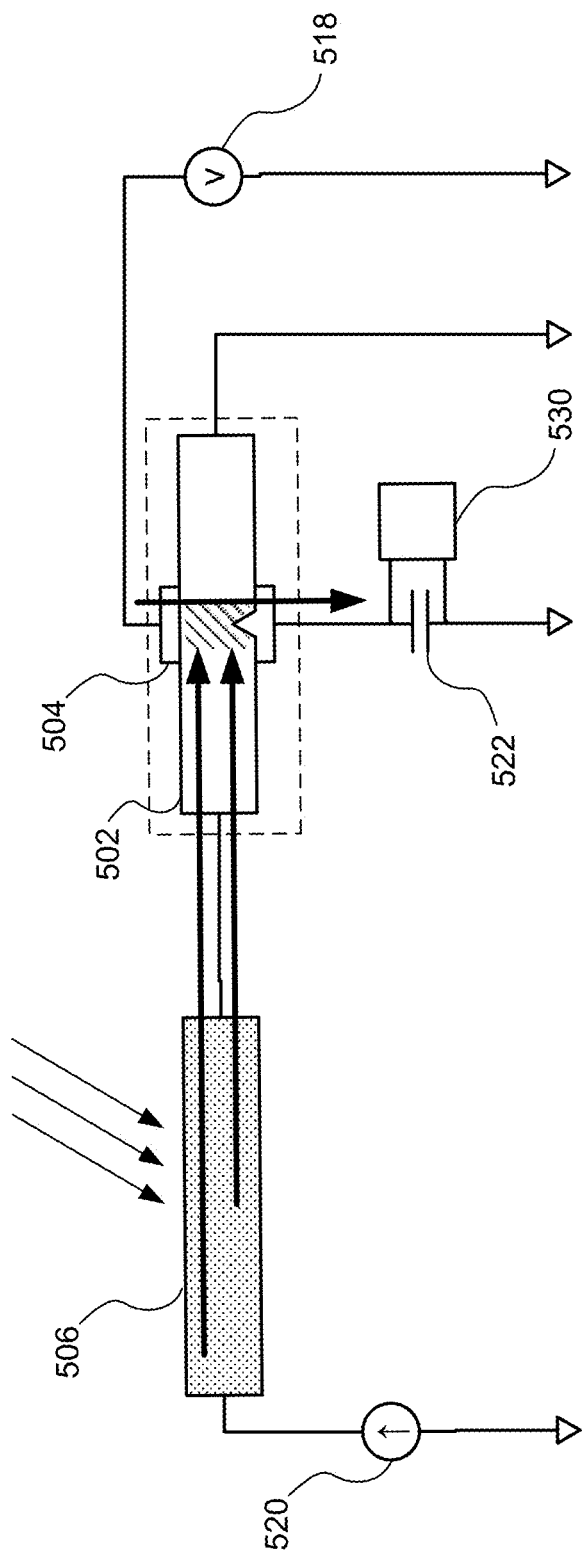

FIG. 5E illustrates that semiconducting component 504 has transitioned from the "off" state to an "on" state, which, in turn, increases the voltage differential over capacitor 522. Readout circuit 530 detects the increase in the voltage differential over capacitor 522. In some embodiments, readout circuit 530 includes a transistor which is turned on by the increased voltage differential over capacitor 522 (while semiconducting component 504 remains in the "on" state) and turned off by the reduced voltage differential over capacitor 522 (while semiconducting component 504 remains in the "off" state).

Figure 5F:
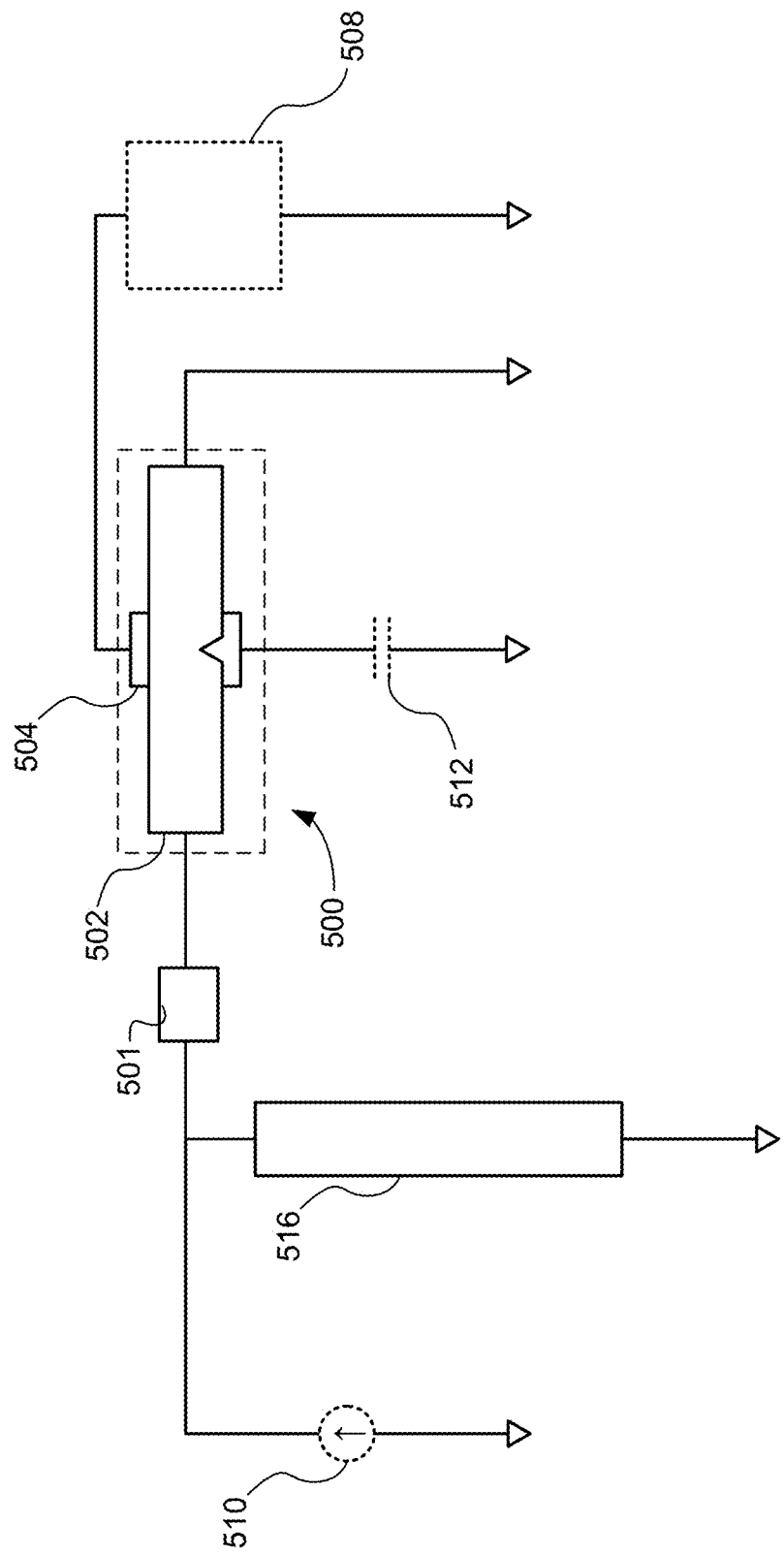
FIG. 5F is a schematic diagram illustrating an example photodetector in accordance with some embodiments.

FIG. 5F is a schematic diagram illustrating an example photodetector in accordance with some embodiments. FIG. 5F is similar to FIG. 5A, except that the photodetector shown in FIG. 5F includes superconducting wire 516 instead of semiconductor photodetector 506, and includes a resistive component 501 (e.g., a resistor). In some embodiments, the resistive component is configured to prevent current flow to the transistor 500 while the superconducting wire 516 is in the superconducting state. In addition, superconducting wire 516 is connected differently. For example, in FIG. 5F, one end of superconducting wire 516 is electrically coupled to a ground (e.g., a conductor coupled to a reference voltage, such as a zero reference voltage), and a second end of superconducting wire 516, opposite to the first end of superconducting wire 516, is electrically coupled to superconducting component 502. As discussed previously, in some embodiments (not shown), the transistor 500 is configured to be a photodetector. In some embodiments in which the transistor 500 is configured to be a photodetector, the photodetector does not include the superconducting wire 516.

FIGS. 5G-5K are schematic diagrams illustrating operations of an example photodetector in accordance with some embodiments.

Figure 5G:
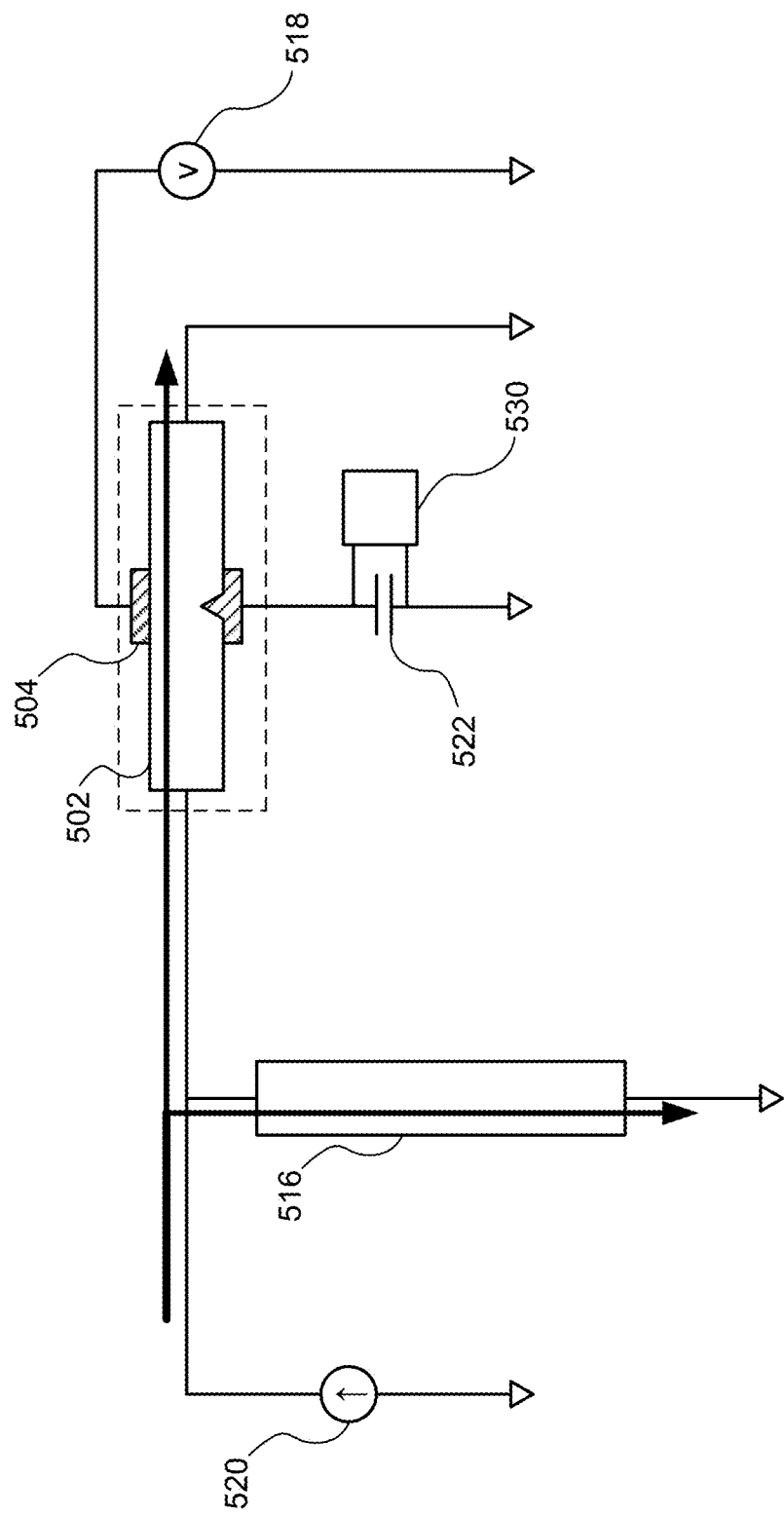
FIGS. 5G-5K are schematic diagrams illustrating operations of an example photodetector in accordance with some embodiments.

FIG. 5G is similar to FIG. 5B, except that the photodetector shown in FIG. 5G includes superconducting wire 516 instead of semiconductor photodetector 506. In addition, superconducting wire 516 is connected differently. For example, in the example photodetector shown in FIG. 5G, a first end of superconducting wire 516 is electrically coupled to a ground (e.g., a conductor coupled to a reference voltage, such as a zero reference voltage), and a second end of superconducting wire 516, opposite to the first end of superconducting wire 516, is electrically coupled to superconducting component 502.

FIG. 5G also illustrates that current from current source 520 flows partially through superconducting wire 516 and partially through superconducting component 502 while superconducting wire 516, superconducting component 502, and semiconducting component 504 remain below respective threshold temperatures (e.g., superconducting wire 516 is at a temperature below a threshold temperature of superconducting wire 516, superconducting component 502 is at a temperature below a threshold temperature of superconducting wire 502, and semiconducting component 504 is at a temperature below a threshold temperature of semiconducting component 504). Thus, superconducting wire 516 is in a superconducting state, superconducting component 502 is in a superconducting state, and semiconducting component 504 is in an "off" state.

While semiconducting component 504 is in the "off" state, there is a small (or zero) voltage differential over capacitor 522 and semiconducting component 504 in the "off" state has a larger voltage differential.

Figure 5H:
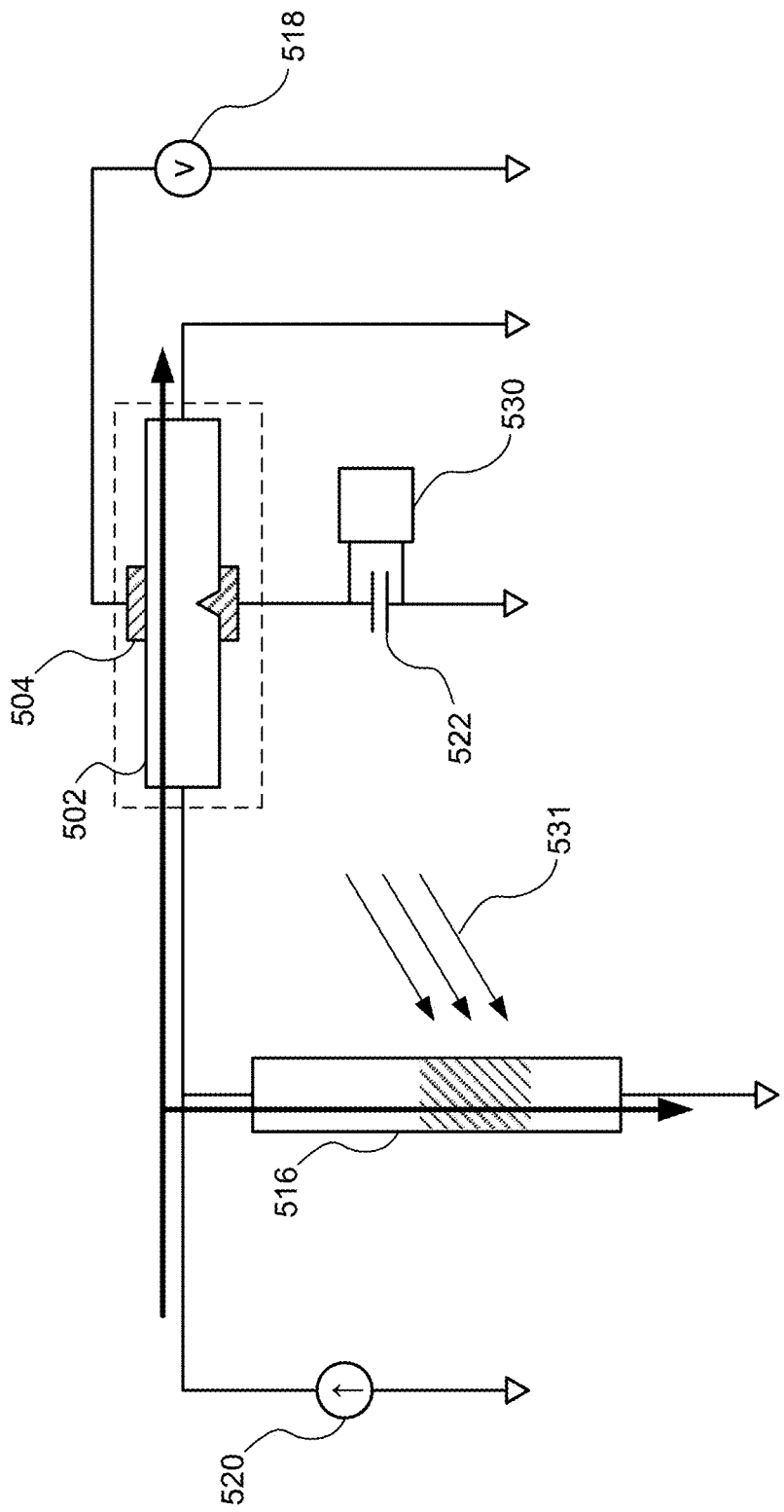
Figure 5I:
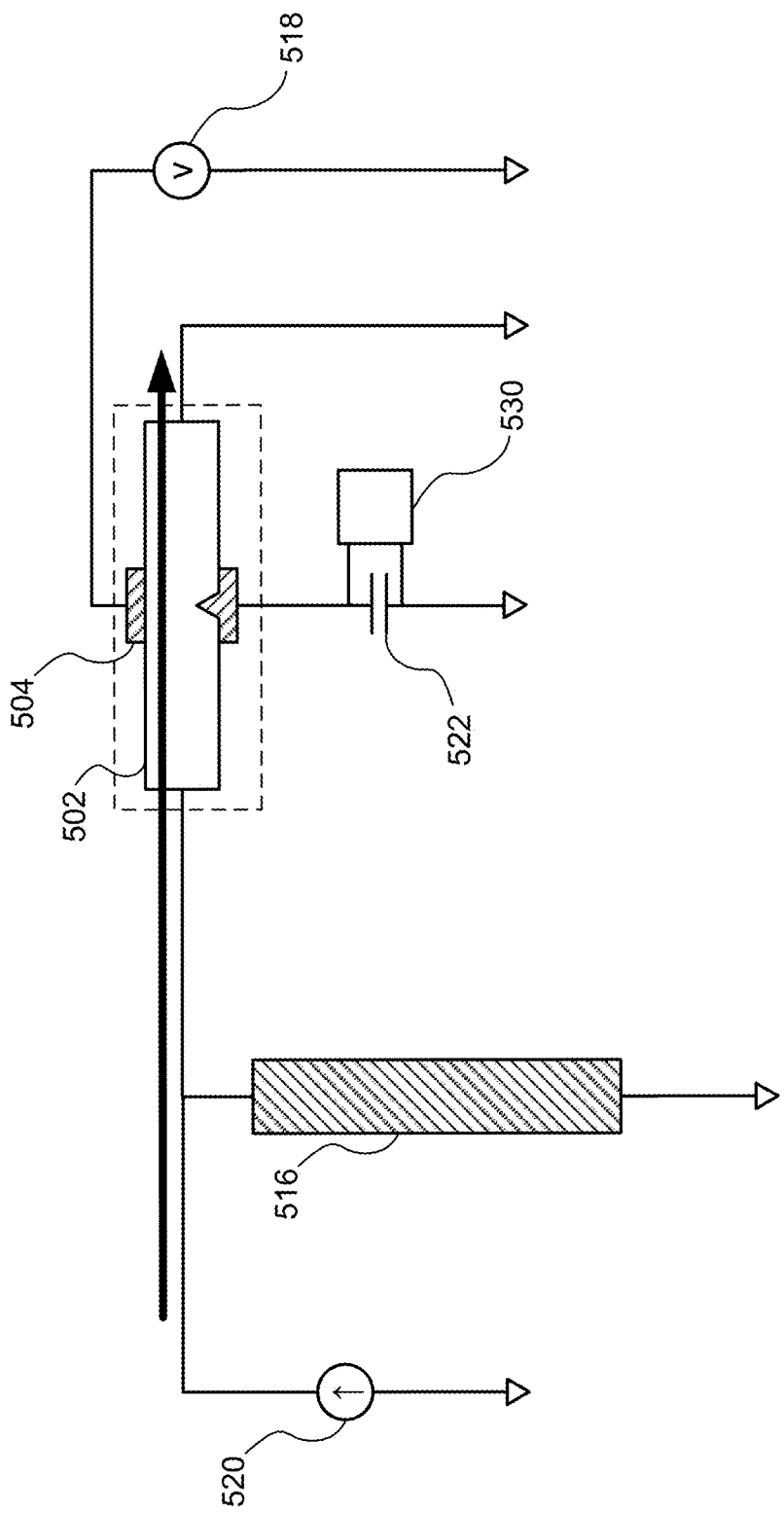

FIG. 5H illustrates that superconducting wire 516 is exposed light 531. Superconducting wire 516, in response to receiving the light 531, generates photocarriers (also called hot electrons), which, in turn, causes transition of superconducting wire 516 from a superconducting state to a non-superconducting state. As a result, an increased portion (or most or all) of the current provided by current source 520 is directed to superconducting component 502, as shown in FIG. 5I.

Figure 5J:
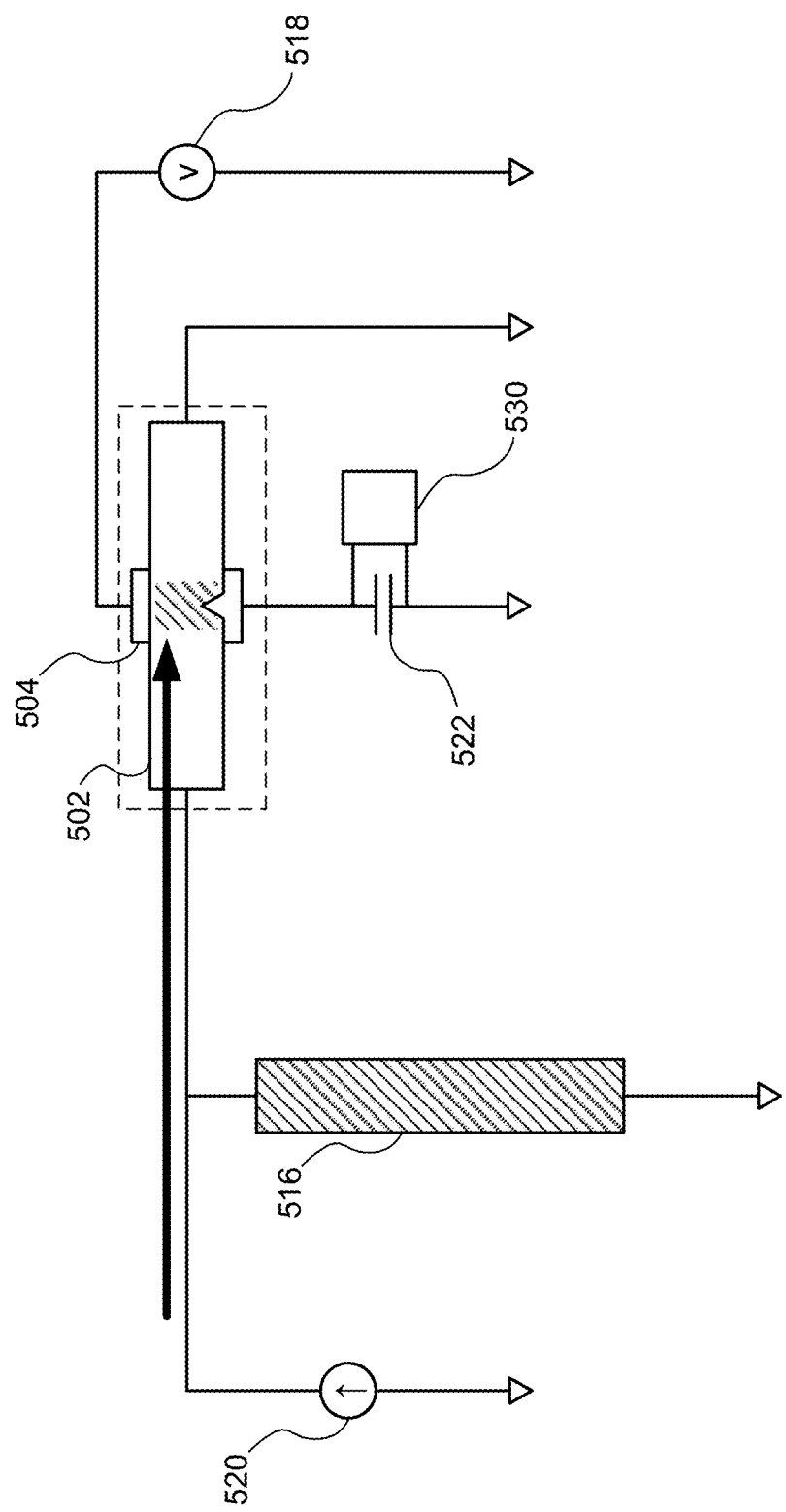

FIG. 5J illustrates that the current from current source 520 is above a current threshold of superconducting component 502, and at least a portion of superconducting component 502 transitions from a superconducting state to a non-superconducting state. Superconducting component 502 generates heat during the transition of superconducting component 502 from the superconducting state to the non-superconducting state and/or while superconducting component 502 remains in the non-superconducting state due to the current provided to superconducting component 502. The heat generated by superconducting component 502 is transferred to semiconducting component 504, and in turn, increases the temperature of semiconducting component 504 above the threshold temperature of semiconducting component 504.

Figure 5K:
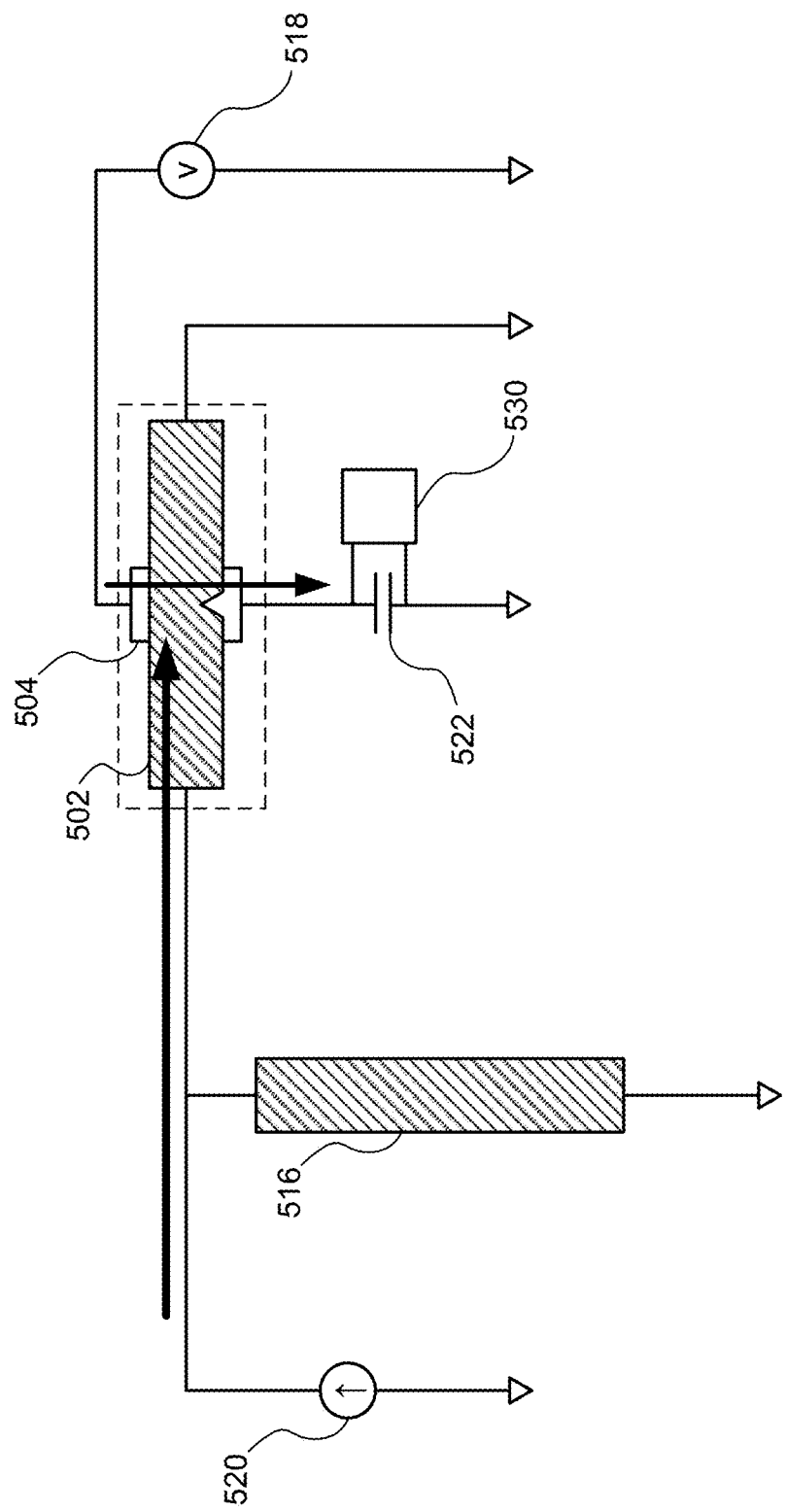

FIG. 5K illustrates that semiconducting component 504 has transitioned from the "off" state to an "on" state, which, in turn, increases the voltage differential over capacitor 522. Readout circuit 530 detects the increase in the voltage differential over capacitor 522. In some embodiments, readout circuit 530 includes a transistor which is turned on by the increased voltage differential over capacitor 522 (while semiconducting component 504 remains in the "on" state) and turned off by the reduced voltage differential over capacitor 522 (while semiconducting component 504 remains in the "off" state).

Figure 6A:
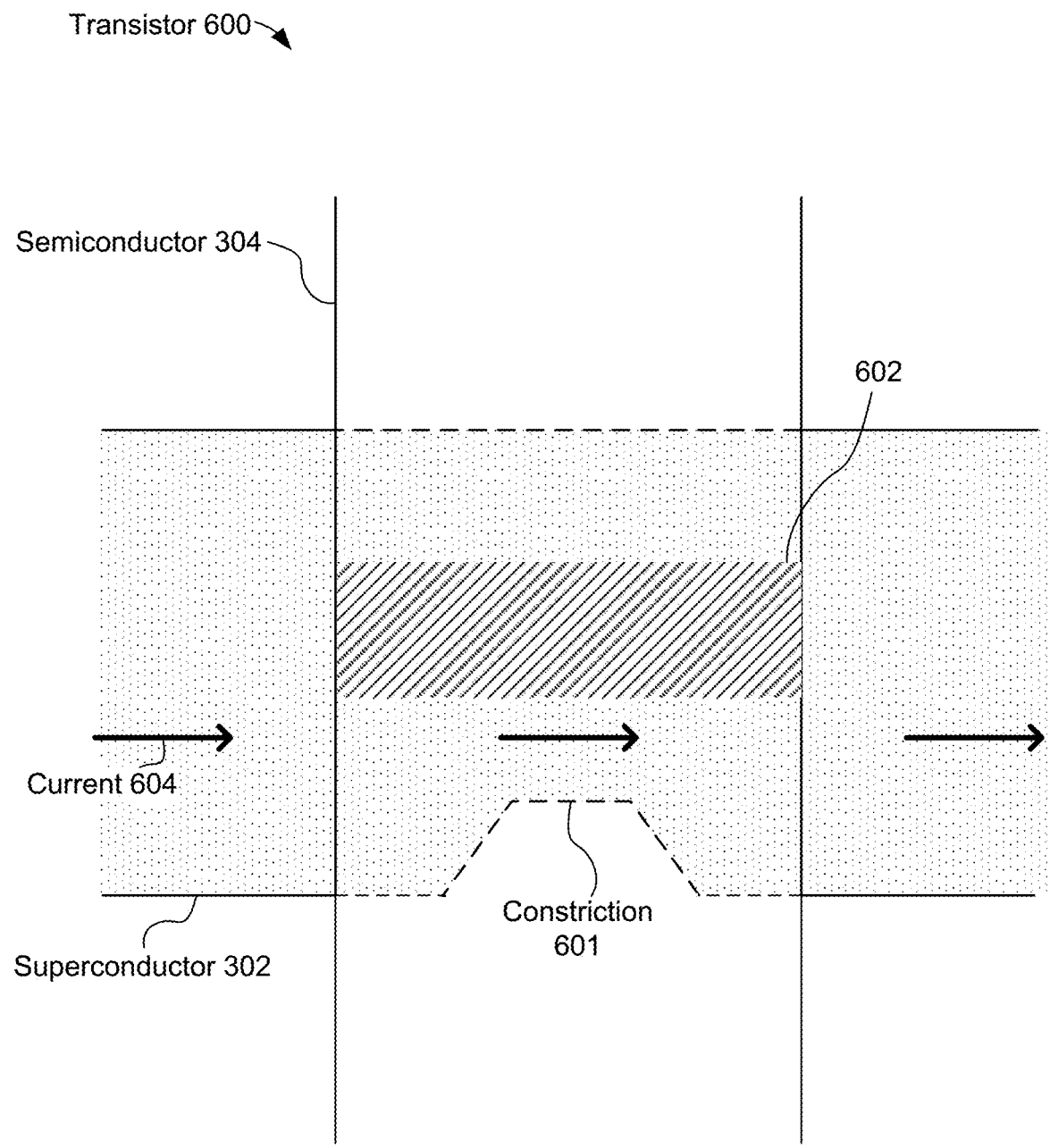
FIGS. 6A-6D are diagrams illustrating another prophetic example of a representative operating sequence of a transistor device in accordance with some embodiments.

FIGS. 6A-6D are diagrams illustrating a prophetic example of an operating sequence of a transistor device 600 in accordance with some embodiments. The transistor device 600 in FIGS. 6A-6D is the same as the transistor device 300 in FIG. 3A, except that the constriction 601 is a different shape from the constriction 301. FIG. 6A shows the transistor device 600 having a semiconductor 304 as a gate and a superconductor 302 as a source and drain. At the first time shown in FIG. 6A, a current 604 (e.g., a current below a critical current for the superconductor 302) is supplied to the superconductor 302. In accordance with some embodiments, the superconductor 302 in FIG. 6A is in a superconducting state. FIG. 6A further shows the semiconductor 304 with no current flow and a freeze-out region 602 (e.g., the semiconductor 304 is in an off state with a temperature of the freeze-out region 602 being below a critical temperature for the semiconductor). Thus, in FIG. 6A, the transistor device is in an on state (e.g., with the current 604 flowing through the superconductor 302 from the source to the drain).

Figure 6B:
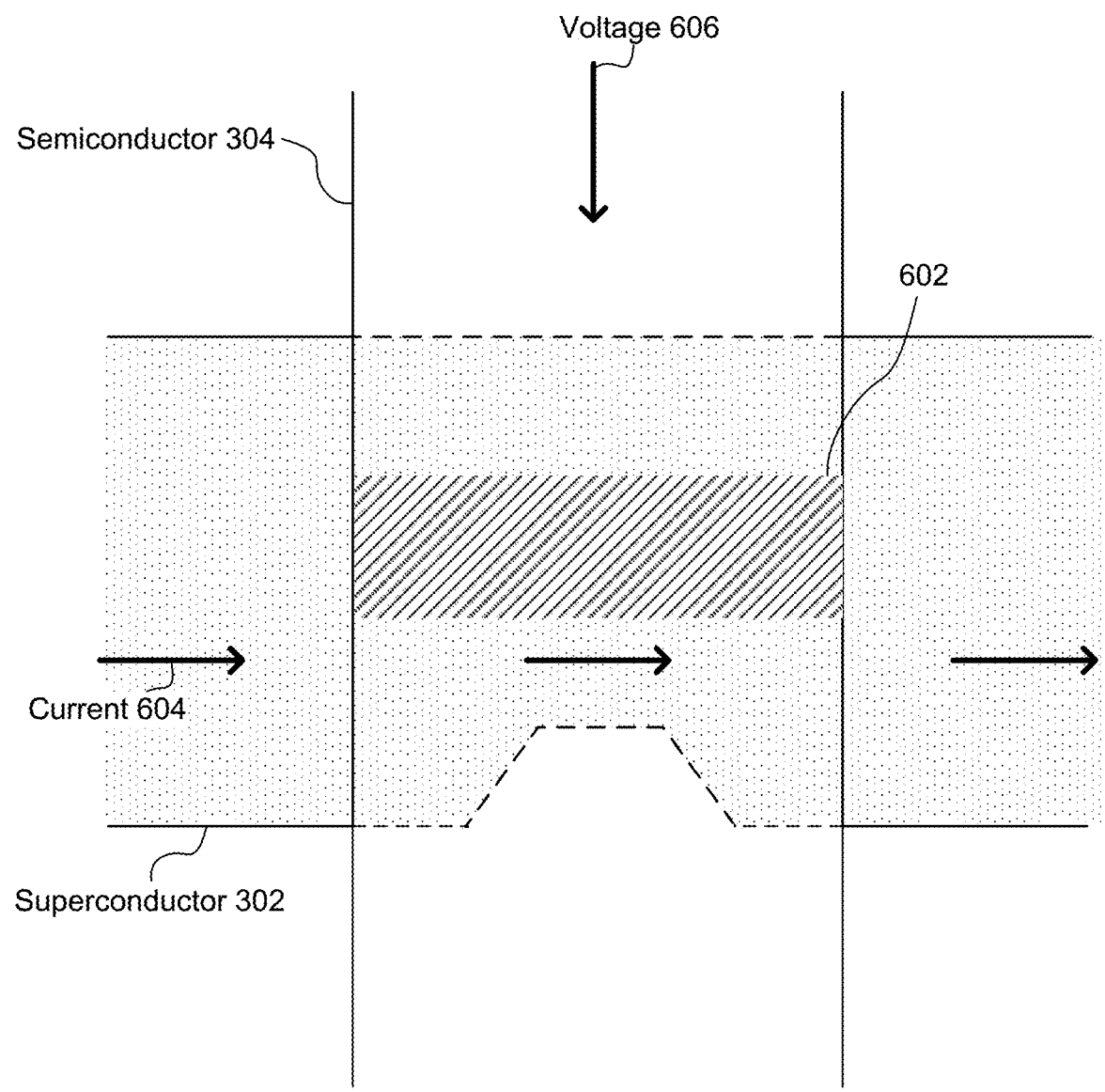
Figure 6C:
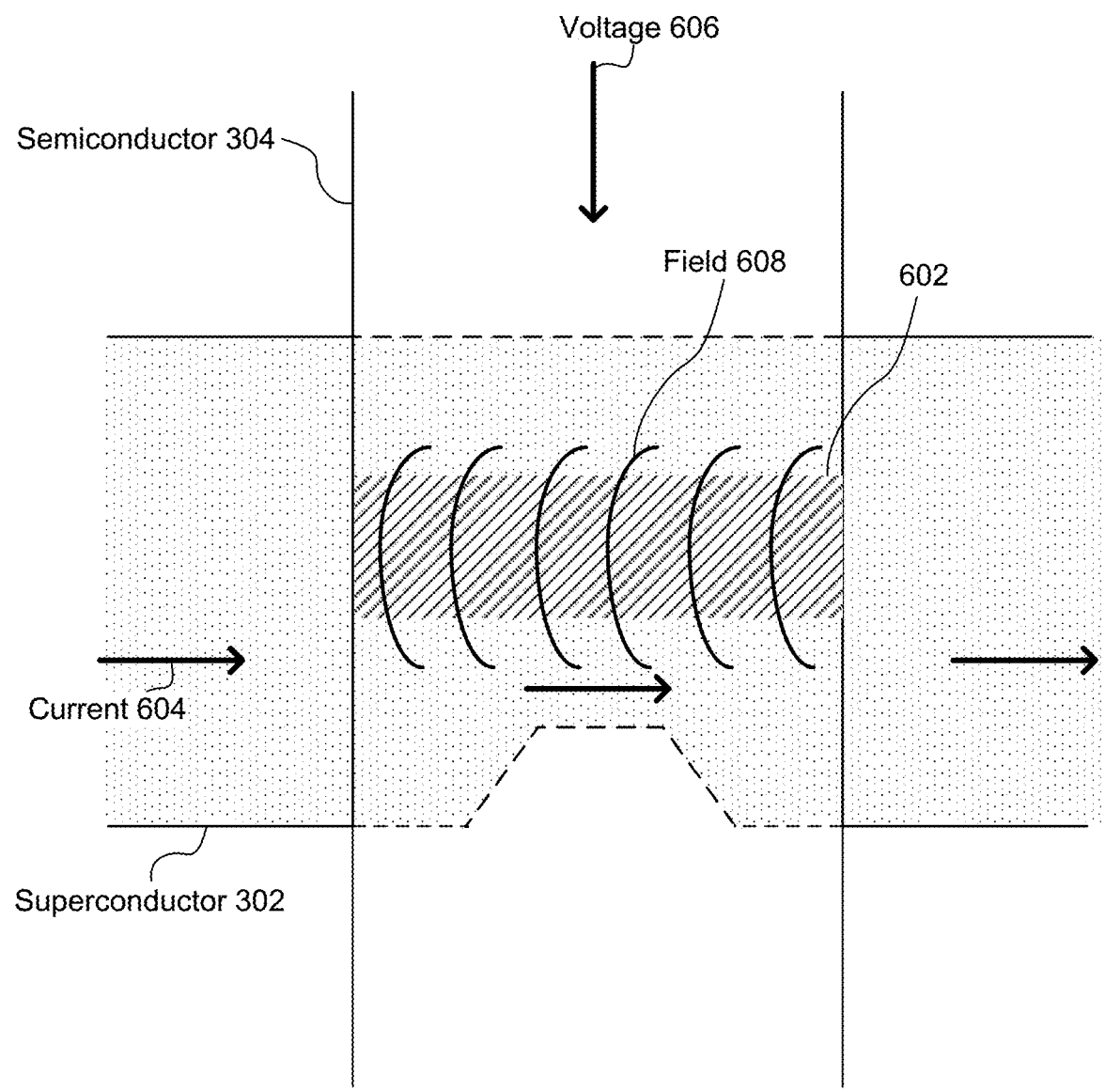

FIG. 6B shows the transistor device 600 at a second time, subsequent to the first time. At the second time, a voltage 606 is supplied to the semiconductor 304. The voltage 606 causes an electromagnetic field to form at the freeze-out region 602, as shown in FIG. 6C. FIG. 6C shows the transistor device at a third time, subsequent to the second time. As shown in FIG. 6C, the electromagnetic field 608 has formed at the freeze-out region 602 due to the voltage 606. In accordance with some embodiments, the electromagnetic field 608 lowers a current threshold for the superconductor 302 (e.g., at a constriction region in proximity to the freeze-out region 602).

Figure 6D:
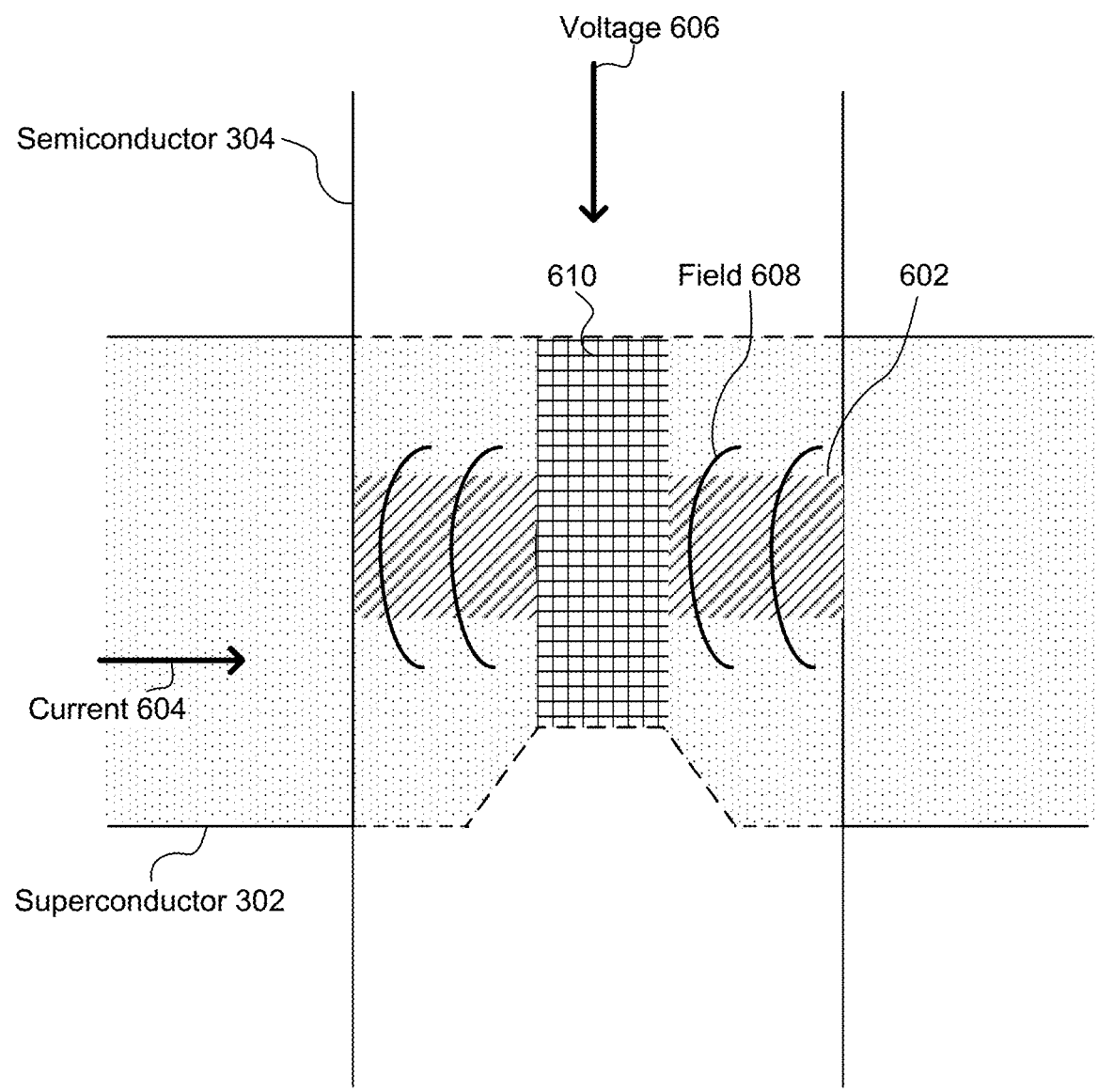

FIG. 6D shows the transistor device 600 at a fourth time, subsequent to the third time. At the fourth time, the electromagnetic field 608 has lowered the current threshold for the superconductor 302 such that the current 604 exceeds the lowered current threshold. As a result, a portion of the superconductor 302, denoted as region 610, transitions to a non-superconducting state. In some embodiments, the non-superconducting region 610 prevents or reduces current flow through the superconductor 302. Thus, in FIG. 6D, the transistor device is in an off state (e.g., disabling or severely reducing current flow from the source to the drain).

Figure 7A:
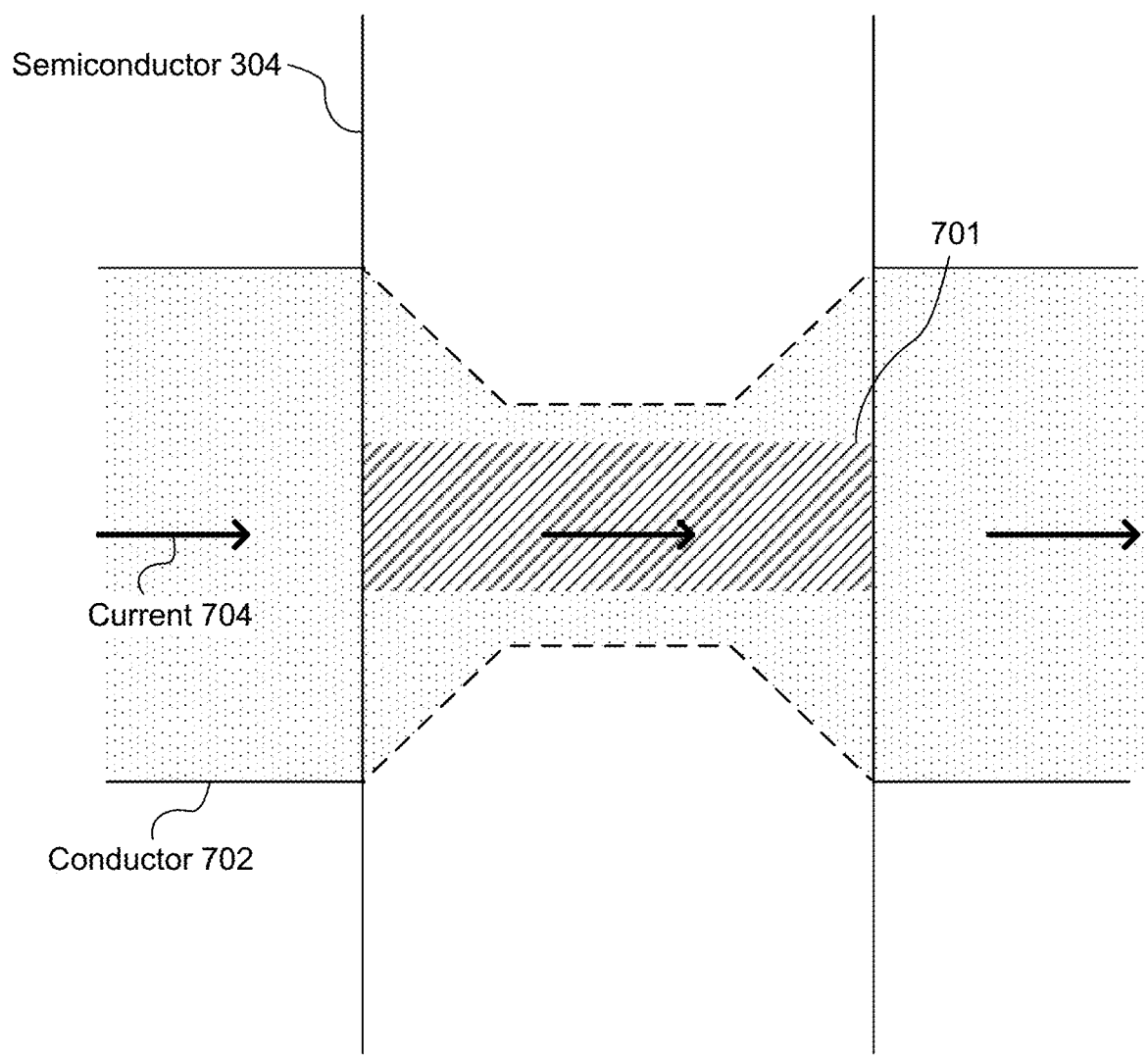
FIGS. 7A-7B are diagrams illustrating a prophetic example of a representative operating sequence of the transistor device of FIG. 1E in accordance with some embodiments.
Figure 7B:
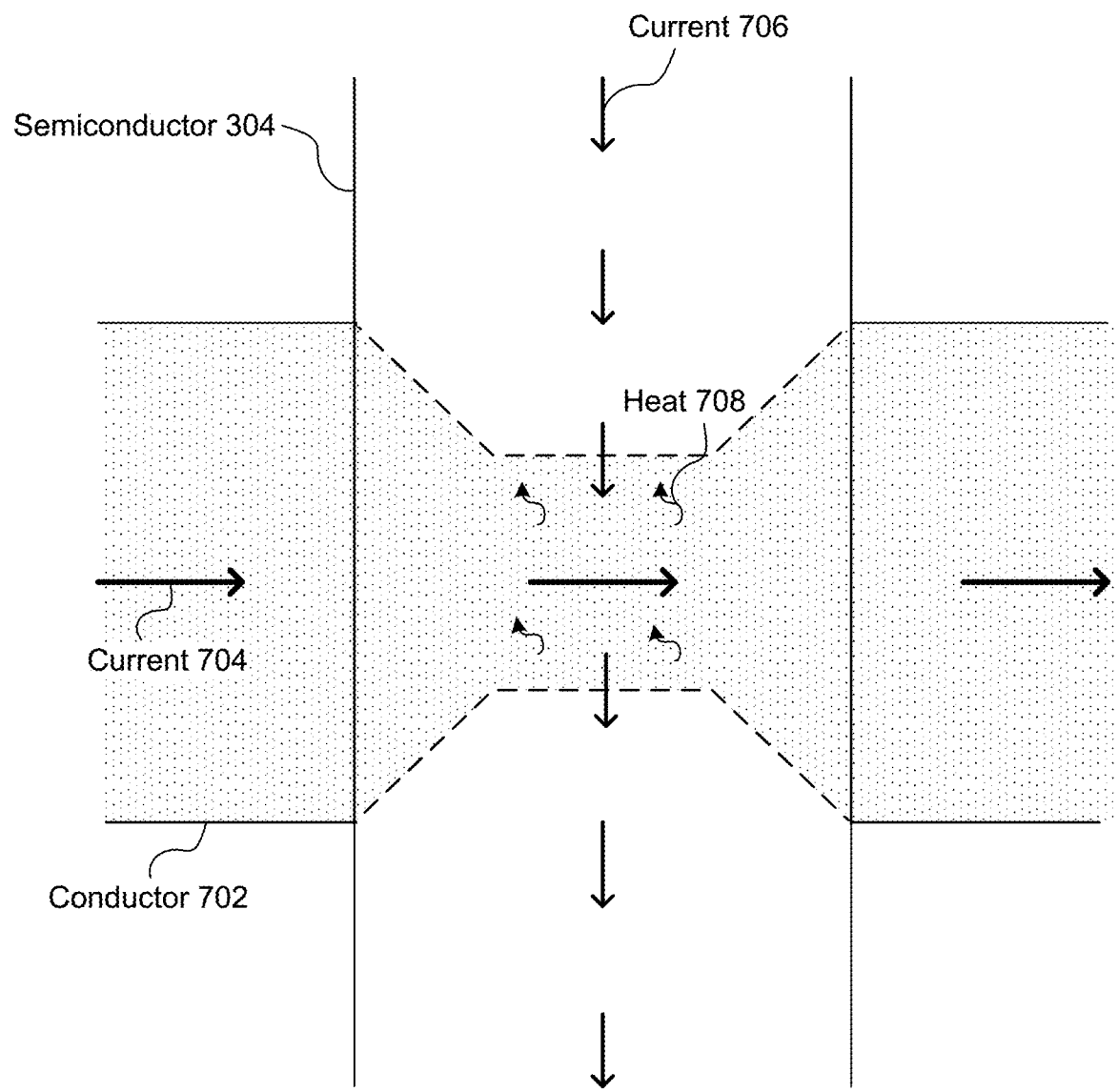

FIGS. 7A-7B are diagrams illustrating a prophetic example of an operating sequence of the transistor device of FIG. 1E in accordance with some embodiments. FIG. 7A shows the transistor device having a conductor 702 (e.g., a metal) as a gate and a semiconductor 304 as a source and drain. As shown in FIG. 7A the semiconductor 304 includes a freeze-out region 701 where a temperature of the semiconductor is below a threshold operating temperature for the semiconductor. Thus, in FIG. 7A, the transistor device is in an off state (e.g., no current flows through the semiconductor 304 from the source to the drain).

At the first time shown in FIG. 7A, a current 704 is supplied to the conductor 702. The current 704 generates heat at a constriction of the conductor 702 (e.g., due to the resistance of the conductor 702). FIG. 7B shows the transistor device at a second time, subsequent to the first time. At the second time, the current 704 causes a portion of the conductor 702 to generate heat 708. In accordance with some embodiments, the heat generated by the conductor 702 in FIG. 7B is sufficient to increase a temperature of the semiconductor 304 above a critical temperature (e.g., Tc 208) of the semiconductor 304. At temperatures above the critical temperature of the semiconductor 304, a current 706 is allowed to pass through a portion of the semiconductor 304 adjacent to the constriction. Thus, in FIG. 7B, the transistor device is in an on state (e.g., allowing current flow from the source to the drain).

Figure 8:
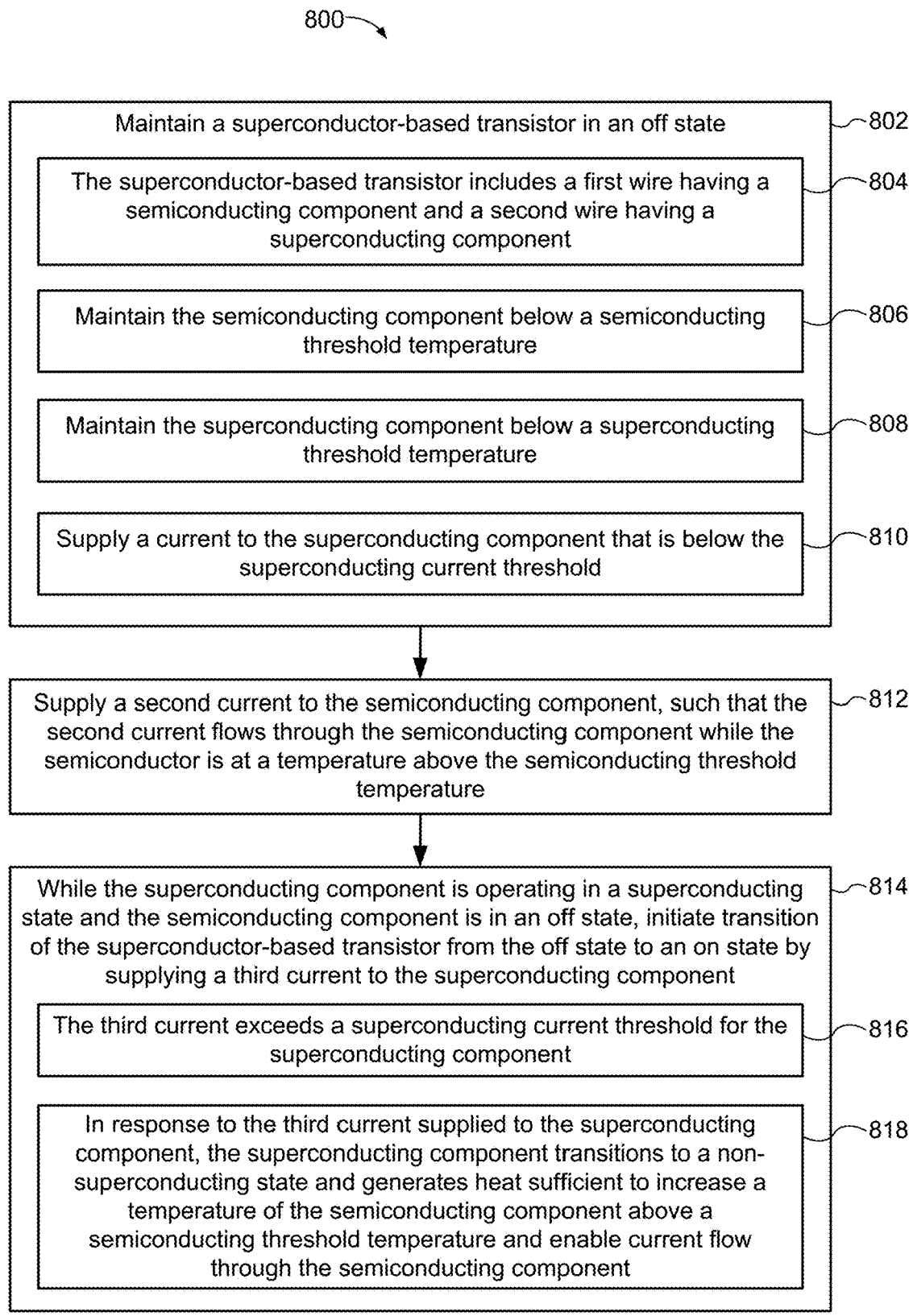
FIG. 8 is a flow diagram illustrating a representative method of operating a superconductor-based transistor in accordance with some embodiments.

FIG. 8 is a flow diagram illustrating a method 800 of operating a superconductor-based transistor in accordance with some embodiments. In some embodiments, the method 800 is performed by a circuit that includes a superconductor-based transistor (e.g., transistor 500, FIG. 5A) and a current source (e.g., current source 510).

The circuit maintains (802) the superconductor-based transistor in an off state at a first time. In some embodiments, the superconducting component is at a temperature below a superconducting threshold temperature (e.g., below Tc 206) at the first time. In some embodiments, the semiconducting component is at a temperature below a semiconducting threshold temperature (e.g., below Tc 208) at the first time. In some embodiments, the transistor is maintained at temperatures below the superconducting threshold temperature via a cryostat or the like.

In some embodiments, maintaining the superconductor-based transistor in an off state includes maintaining (806) the semiconductor component below a semiconducting threshold temperature (e.g., below Tc 208). In some embodiments, maintaining the superconductor-based transistor in an off state includes maintaining (808) the superconducting component below a superconducting threshold temperature (e.g., below Tc 206). In some embodiments, maintaining the superconductor-based transistor in an off state includes supplying (810) a current to the superconducting component that is below the superconducting current threshold (e.g., current 412).

In some embodiments, the method 800 includes supplying (e.g., the circuit supplying) a second current to the semiconducting component, such that the second current flows through the semiconducting component while the semiconductor is at a temperature above the semiconducting threshold temperature.

While the superconducting component is operating in a superconducting state and the semiconducting component is in an off state, the circuit initiates (814) transition of the superconductor-based transistor from the off state to an on state by supplying a third current to the superconducting component. In some embodiments, the third current exceeds (816) a superconducting current threshold for the superconducting component.

In some embodiments, in response to the current supplied to the superconducting component, the superconducting component transitions (818) to a non-superconducting state and generates heat sufficient to increase a temperature of the semiconducting component above a semiconducting threshold temperature (e.g., above Tc 208) and allow current flow through the semiconducting component (as shown in FIG. 4C).

In accordance with some embodiments, a method for operating a superconductor-based transistor includes: (1) at a first time, maintaining the superconductor-based transistor in an off state, where the superconductor-based transistor includes a first wire including a semiconducting component (e.g., semiconductor 304) and a second wire including a superconducting component (e.g., superconductor 302); and (2) while (a) the superconducting component is operating in a superconducting state and (b) the semiconducting component is in an off state, initiating transition of the superconductor-based transistor from the off state to an on state by supplying a current to the superconducting component (e.g., current 414), the current exceeding a superconducting current threshold for the superconducting component.

Figure 9A:
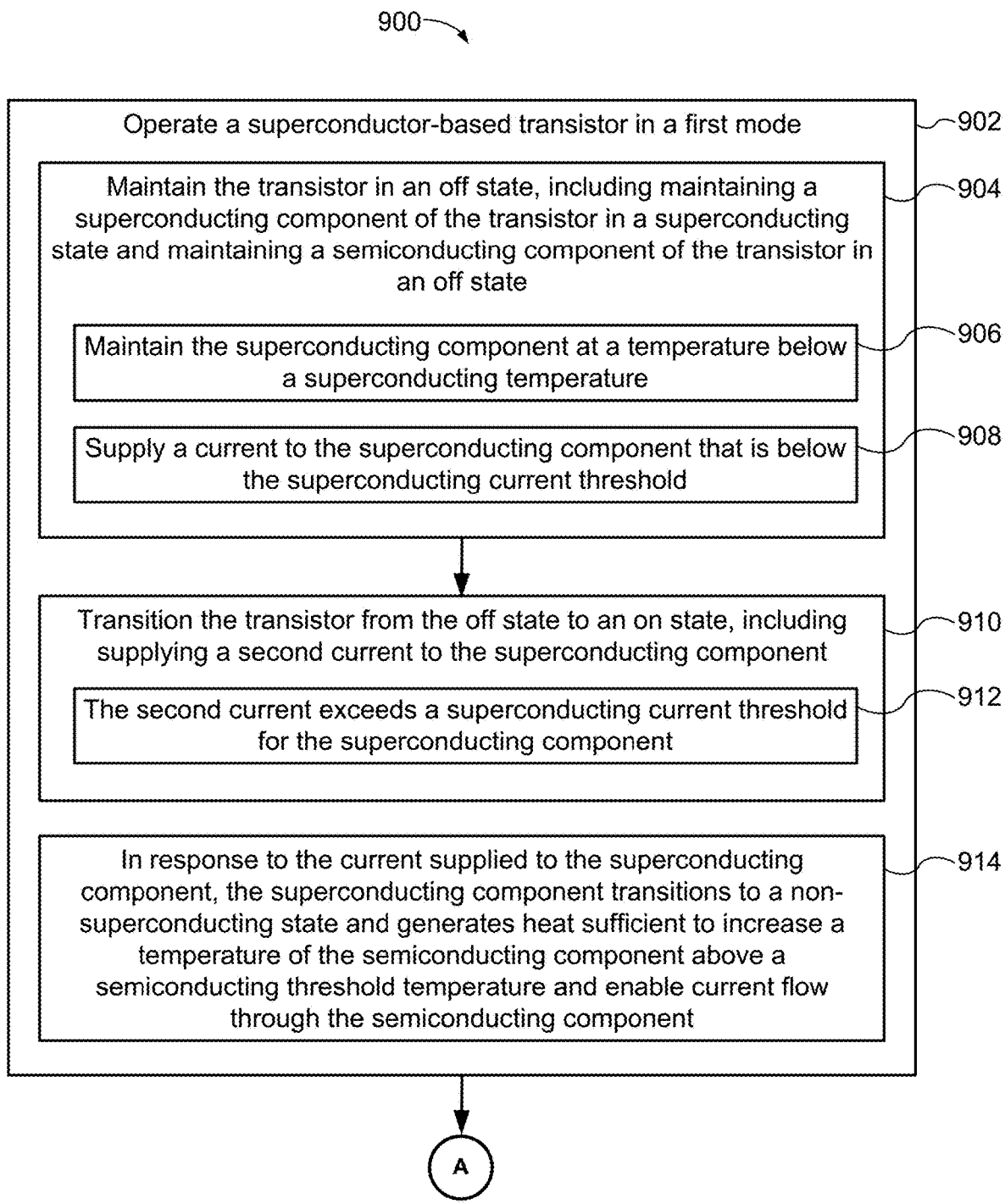
FIGS. 9A-9B are flow diagrams illustrating another representative method of operating a superconductor-based transistor in accordance with some embodiments.
Figure 9B:
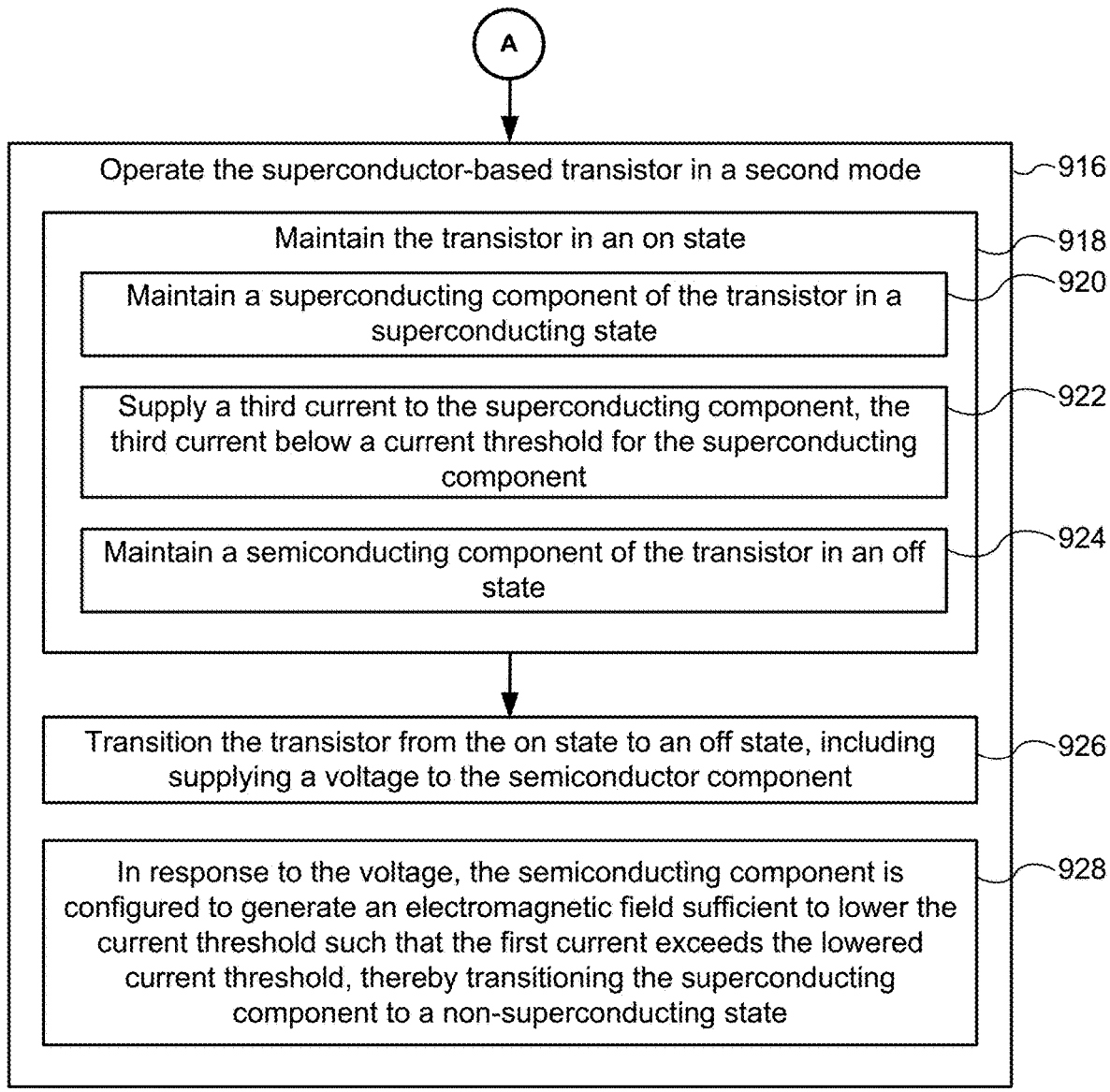

FIGS. 9A-9B are flow diagrams illustrating another representative method of operating a superconductor-based transistor in accordance with some embodiments. In some embodiments, the method 900 is performed by a circuit that includes a superconductor-based transistor (e.g., transistor 600) and a current source.

The circuit operates (902) a superconductor-based transistor in a first mode (e.g., illustrated in FIGS. 4A-4C). The circuit maintains (904) the transistor in an off state (e.g., FIG. 4A), including maintaining a superconducting component (e.g., superconductor 302) of the transistor in a superconducting state and maintaining a semiconducting component of the transistor in an off state (e.g., semiconductor 304).

The circuit maintains (906) the superconducting component at a temperature below a superconducting temperature. The circuit supplies (908) a current (e.g., current 412, FIG. 4A) to the superconducting component that is below the superconducting current threshold.

The circuit transitions (910) the transistor from the off state to an on state, including supplying a second current (e.g., current 414, FIG. 4B) to the superconducting component. The second current exceeds (912) a superconducting current threshold for the superconducting component.

In response to the current supplied to the superconducting component, the superconducting component transitions (914) to a non-superconducting state and generates heat sufficient to increase a temperature of the semiconducting component above a semiconducting threshold temperature and allow current flow through the semiconducting component (e.g., FIG. 4C).

In some embodiments, the circuit operates (916) the superconductor-based transistor in a second mode (e.g., illustrated in FIGS. 6A-6D). The circuit maintains (918) the transistor in an on state (e.g., FIG. 6A).

The circuit maintains (920) the superconducting component in a superconducting state. The circuit supplies (922) a third current (e.g., current 604) to the superconducting component, the third current below a current threshold for the superconducting component. The circuit maintains (924) a semiconducting component of the transistor in an off state.

The circuit transitions (926) the transistor from the on state to an off state (e.g., FIG. 6D), including supplying a voltage (e.g., the voltage 606) to the semiconductor component.

In response to the voltage, the semiconducting component is configured to (928) generate an electromagnetic field (e.g., field 608) sufficient to lower the current threshold such that the first current exceeds the lowered current threshold, thereby transitioning the superconducting component to a non-superconducting state.

In accordance with some embodiments, a method for operating a superconductor-based transistor includes operating the superconductor-based transistor in a first mode (e.g., illustrated in FIGS. 4A-4C), including: (1) maintaining the transistor in an off state (e.g., FIG. 4A), including: (a) maintaining a superconducting component (e.g., superconductor 302) of the transistor in a superconducting state; and (b) maintaining a semiconducting component (e.g., semiconductor 304) of the transistor in an off state; and (2) transitioning the transistor from the off state to an on state, including supplying current (e.g., current 414, FIG. 4B) to the superconducting component, where the current exceeds a superconducting current threshold for the superconducting component. In some embodiments, in response to the current supplied to the superconducting component, the superconducting component transitions to a non-superconducting state and generates heat sufficient to increase a temperature of the semiconducting component above a semiconducting threshold temperature and allow current flow through the semiconducting component (e.g., FIG. 4C). In some embodiments, the superconducting component is at a temperature below a superconducting threshold temperature.

In some embodiments, maintaining the superconductor-based transistor in the off state includes maintaining the superconducting component at a temperature below a superconducting temperature.

In some embodiments, maintaining the superconductor-based transistor in an off state includes supplying a current (e.g., current 412, FIG. 4A) to the superconducting component that is below the superconducting current threshold.

In some embodiments, the method includes operating the superconductor-based transistor in a second mode (e.g., illustrated in FIGS. 6A-6D), including, while in the second mode: (1) maintaining the transistor in an on state (e.g., FIG. 6A), including: (a) maintaining a superconducting component of the transistor in a superconducting state; (b) supplying a first current (e.g., current 604) to the superconducting component, the first current below a current threshold for the superconducting component; and (c) maintaining a semiconducting component of the transistor in an off state; and (2) transitioning the transistor from the on state to an off state (e.g., FIG. 6D), including supplying a voltage (e.g., the voltage 606) to the semiconductor component; where, in response to a voltage, the semiconducting component is configured to generate an electromagnetic field (e.g., field 608) sufficient to lower the current threshold such that the first current exceeds the lowered current threshold, thereby transitioning the superconducting component to a non-superconducting state.

Figure 10A:
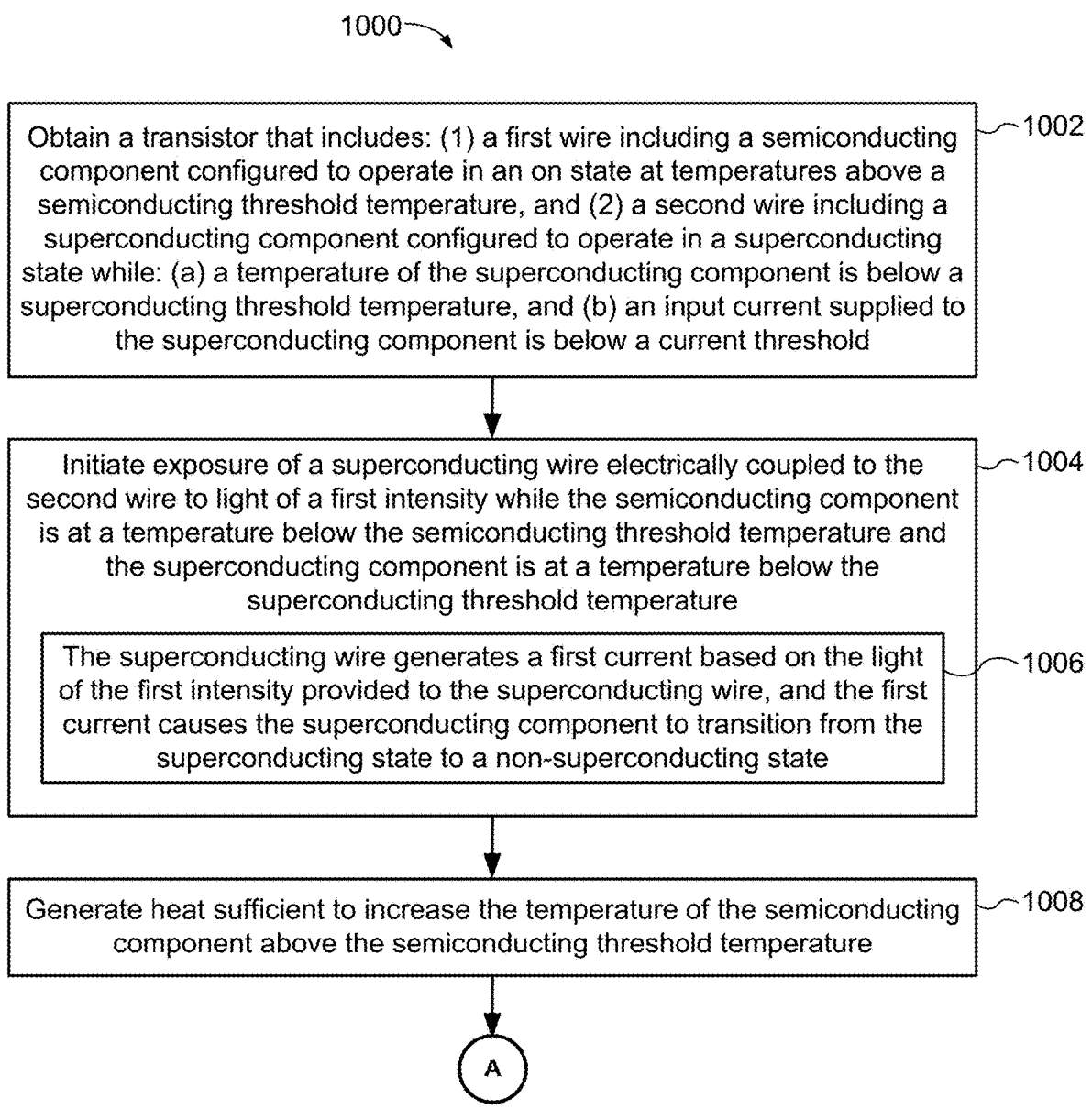
FIGS. 10A-10B are flow diagrams illustrating another representative method of operating a superconductor-based transistor in accordance with some embodiments.
Figure 10B:
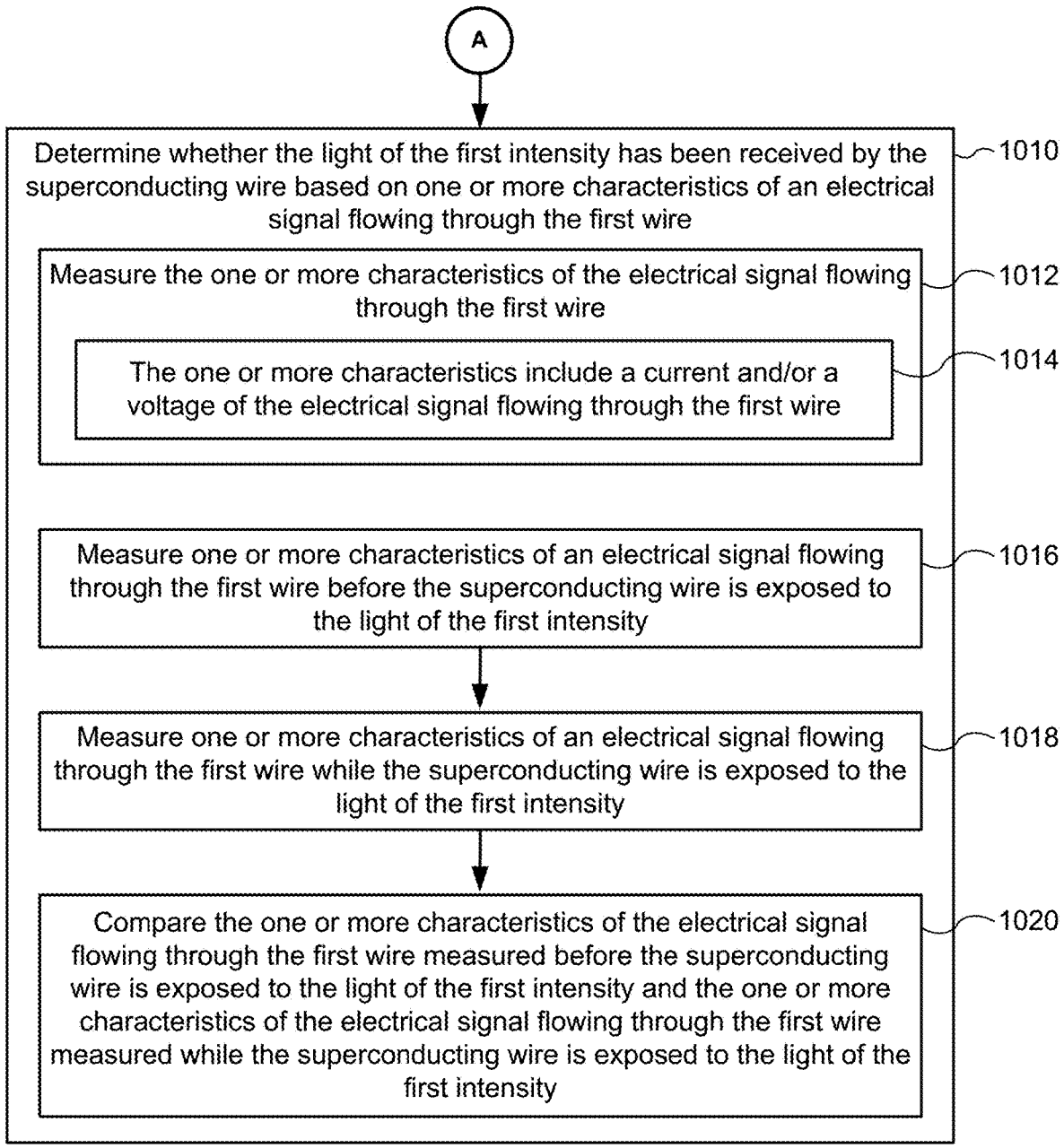

FIGS. 10A-10B are flow diagrams illustrating a method 1000 of operating a superconductor-based transistor in accordance with some embodiments. In some embodiments, the method 1000 is performed by a photodetector that includes a superconductor-based transistor (e.g., transistor 500) and a current source.

The photodetector includes (1002) a superconductor-based transistor. In some embodiments, the transistor includes: (1) a first wire including a semiconducting component configured to operate in an on state at temperatures above a semiconducting threshold temperature, and (2) a second wire including a superconducting component configured to operate in a superconducting state while: (a) a temperature of the superconducting component is below a superconducting threshold temperature, and (b) an input current supplied to the superconducting component is below a current threshold. In some embodiments, the transistor includes a first wire including a semiconducting component (e.g., semiconducting component 504, FIG. 5F) configured to operate in an on state at temperatures above a semiconducting threshold temperature; and a second wire including a superconducting component (e.g., superconducting component 502, FIG. 5F) configured to operate in a superconducting state while a temperature of the superconducting component is below a superconducting threshold temperature and an input current supplied to the superconducting component is below a current threshold.

The photodetector initiates (1004) exposure of a superconducting wire electrically coupled to the second wire to light of a first intensity (e.g., shining light on superconducting wire 516, FIG. 5H) while the semiconducting component is at a temperature below the semiconducting threshold temperature and the superconducting component is at a temperature below the superconducting threshold temperature.

In some embodiments, the superconducting wire generates a first current based on the light of the first intensity provided to the superconducting wire, and the first current causes the superconducting component to transition from the superconducting state to a non-superconducting state (e.g., FIG. 5D).

The photodetector generates (1006) heat (e.g., due to current flowing through the superconducting component while in the non-superconducting state) sufficient to increase the temperature of the semiconducting component above the semiconducting threshold temperature (e.g., semiconducting component 504 transitions into the "on" state, FIG. 5E).

In some embodiments, the photodetector determines (1010) whether the light of the first intensity has been received by the superconducting wire based on one or more characteristics of an electrical signal flowing through the first wire. For example, when a voltage drop across the semiconducting wire is above a predefined voltage drop threshold, it is deemed that no light above a detection threshold is detected; when the voltage drop across the semiconducting wire is below the predefined voltage drop threshold, it is deemed that light above the detection threshold is detected. In some embodiments, the photodetector measures (1012) the one or more characteristics of the electrical signal flowing through the first wire. In some embodiments, the one or more characteristics include (1014) a current and/or a voltage of the electrical signal flowing through the first wire.

In some embodiments, the photodetector measures (1016) one or more characteristics (e.g., voltage, current, etc.) of an electrical signal flowing through the first wire before the superconducting wire is exposed to the light of the first intensity.

In some embodiments, the photodetector measures (1018) one or more characteristics of an electrical signal flowing through the first wire while the superconducting wire is exposed to the light of the first intensity.

In some embodiments, the photodetector compares (1020) the one or more characteristics of the electrical signal flowing through the first wire measured before the superconducting wire is exposed to the light of the first intensity and the one or more characteristics of the electrical signal flowing through the first wire measured while the superconducting wire is exposed to the light of the first intensity.

In accordance with some embodiments, a method for detecting light is performed with a transistor. The transistor includes a first wire including a semiconducting component (e.g., semiconducting component 504, FIG. 5F) configured to operate in an on state at temperatures above a semiconducting threshold temperature; and a second wire including a superconducting component (e.g., superconducting component 502, FIG. 5F) configured to operate in a superconducting state while a temperature of the superconducting component is below a superconducting threshold temperature and an input current supplied to the superconducting component is below a current threshold. The method includes initiating exposure of a superconducting wire electrically coupled to the second wire to light of a first intensity (e.g., shining light on superconducting wire 516, FIG. 5H) while the semiconducting component is at a temperature below the semiconducting threshold temperature and the superconducting component is at a temperature below the superconducting threshold temperature. The superconducting wire generates a first current based on the light of the first intensity provided to the superconducting wire, and the first current causes the superconducting component to transition from the superconducting state to a non-superconducting state (e.g., FIG. 5D). The method also includes generating heat (e.g., due to current flowing through the superconducting component while in the non-superconducting state) sufficient to increase the temperature of the semiconducting component above the semiconducting threshold temperature (e.g., semiconducting component 504 transitions into the "on" state, FIG. 5E).

In some embodiments, the method also includes determining whether the light of the first intensity has been received by the superconducting wire based on one or more characteristics of an electrical signal flowing through the first wire (e.g., when a voltage drop across the semiconducting wire is above a predefined voltage drop threshold, it is deemed that no light above a detection threshold is detected; when the voltage drop across the semiconducting wire is below the predefined voltage drop threshold, it is deemed that light above the detection threshold is detected).

In some embodiments, the method includes measuring the one or more characteristics (e.g., voltage, current, etc.) of the electrical signal flowing through the first wire.

In some embodiments, the method includes measuring one or more characteristics of an electrical signal flowing through the first wire before the superconducting wire is exposed to the light of the first intensity (e.g., measuring voltage, current, etc. when the superconducting wire is not receiving light); measuring one or more characteristics of an electrical signal flowing through the first wire while the superconducting wire is exposed to the light of the first intensity (e.g., measuring voltage, current, etc. when the superconducting wire is receiving light); and determining whether the light of the first intensity has been received by the superconducting wire by comparing the one or more characteristics (e.g., voltage, current, etc.) of the electrical signal flowing through the first wire measured before the superconducting wire is exposed to the light of the first intensity and the one or more characteristics of the electrical signal flowing through the first wire measured while the superconducting wire is exposed to the light of the first intensity. For example, a reduced voltage drop across the semiconducting component is used to determine that the superconducting wire is receiving light. In some embodiments, the one or more characteristics include a current and/or a voltage of the electrical signal flowing through the first wire.

Figure 11A:
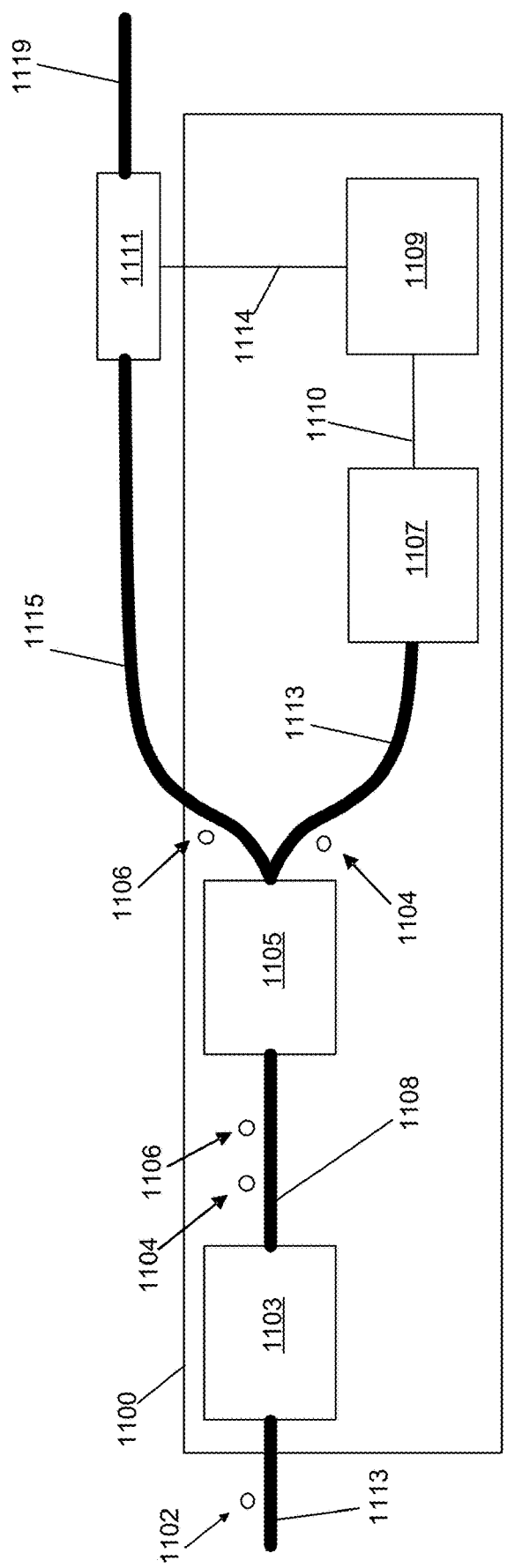
FIGS. 11A-11B illustrate a representative photonic circuit employing a photodetector in accordance with one or more embodiments.
Figure 11B:
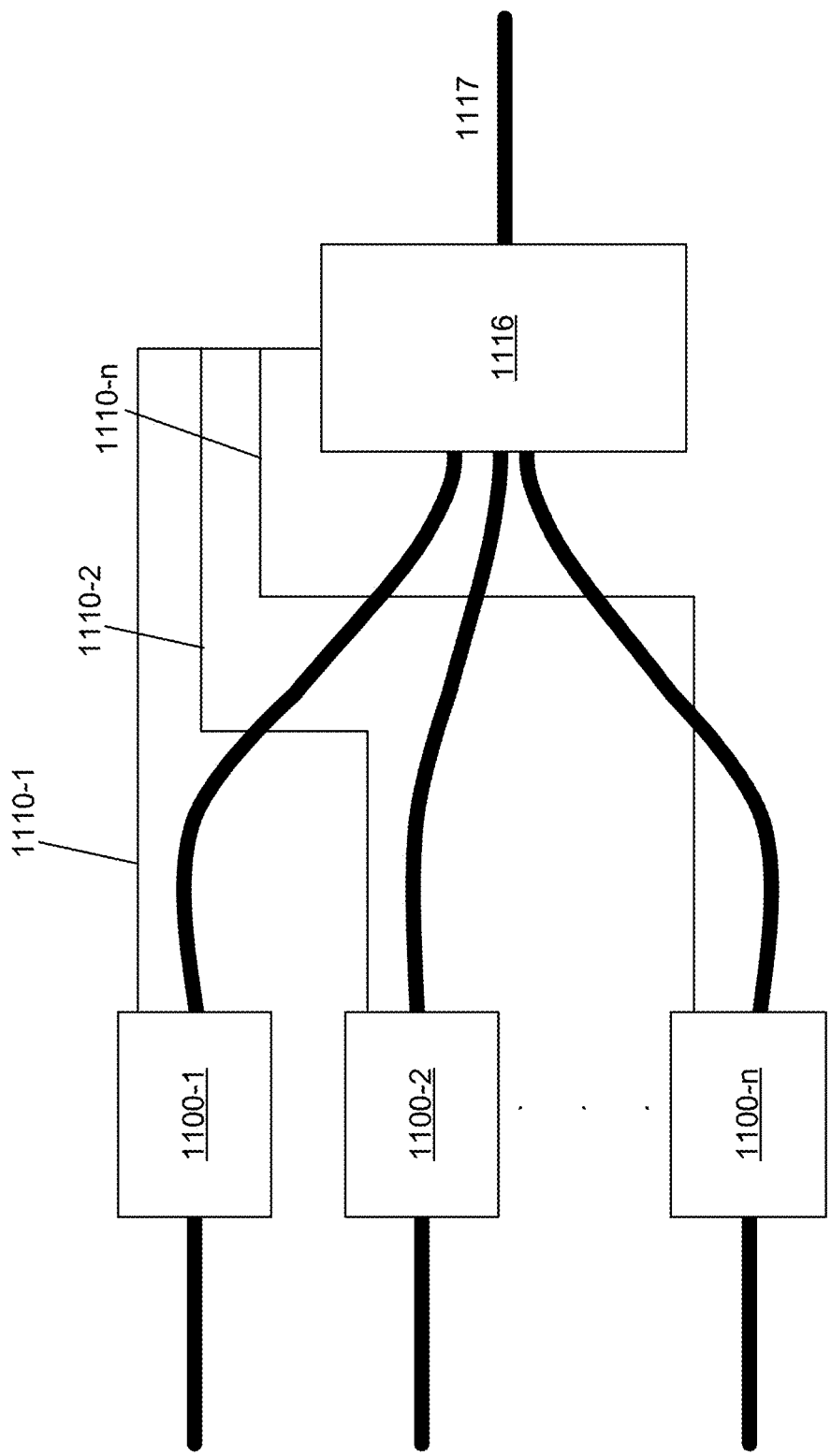

FIGS. 11A-11B show examples of a photonic system that can employ one or more superconducting switches and amplifiers in accordance with one or more embodiments. In the embodiments shown in FIGS. 11A-11B, a transistor, e.g., any of the transistors 100, 300, 500, and 600, and/or any of the arrangements shown in FIGS. 1A-7B described above can be employed as one or more switches or amplifiers. More specifically, the FIGS. 11A-11B illustrate a heralded single photon source in accordance with one or more embodiments. Such a source can be used within any system for which a source of single photons is useful, e.g., within a quantum communications system and/or a quantum computer that employs entangled photons as the physical qubits.

Turning to FIG. 11A, a heralded single photon source 1100 is illustrated in accordance with one or more embodiments. Thick black lines in the figure represent optical waveguides and thin black lines represent electrical interconnects (e.g. wires that may be formed from superconducting or non-superconducting materials). The system is a hybrid photonic/electrical circuit that includes a pumped photon pair generator 1103, a wavelength division multiplexer (WDM) 1105 (which is a 1×2 WDM in this example), a superconducting photon detector 1107, a superconducting amplifier circuit 1109, and an optical switch 1111. One or more components of the system can be housed in a cryogenic environment, such as a cryostat, held at a temperature that is lower than the threshold temperature for superconductivity, as described above.

An input optical waveguide 1113 optically couples a pump photon source (not shown) to photon pair generator 1103. A pump photon 1102 enters the pumped photon pair generator 1103 via input optical waveguide 1113. For the sake of illustration, any photons illustrated here are depicted outside of the waveguides, but one of ordinary skill will appreciate that in a physical device, these photons will propagate within one or more guided modes of the waveguide. In some embodiments, the pumped photon pair generator 1103 can include a nonlinear optical material that generates two output photons, referred to as idler photon 1104 and signal photon 1106 from one or more input pump photons 1102. For example, the pumped photon pair generator 1103 can generate a pair of output photons using a process known as spontaneous four wave mixing. The pair of output photons, signal photon 1104 and idler photon 1106, are typically generated having different wavelengths/frequencies, e.g., with the sum of the energies of the signal and idler equal to the energy of the pump photon. After generation, signal photon 1104 and idler photon 1106 are optically coupled to the input of WDM 1105 via waveguide 1108. Because photons 1104 and 1106 have different wavelengths/frequencies, WDM 1105 redirects each photon along a different output waveguide, e.g., signal photon 1104 is directed along the heralding waveguide path 1113 and idler photon 1106 is redirected along the switched output waveguide path 1115. Which photon is directed to which path is not critical and the path of the idler photon and signal photon can be exchanged without departing from the scope of the present disclosure.

In this example, a superconducting photon detector 1107, e.g., a superconducting nanowire single photon detector, is optically coupled to the heralding waveguide path 1113 and can produce an electrical signal (e.g. a current pulse, also referred to as a photon heralding signal) in response to the detection of the signal photon 1104. Because the signal photon 1104 and idler photon 1106 were generated nearly simultaneously as a pair, the electrical signal generated by the photon detector 1107 signals (i.e., "heralds") the presence of the idler photon 1106 in the switched output waveguide path 1115. The heralding signal is often a small amplitude current signal, e.g., microamps or less, and can be provided to the superconducting amplifier circuit 1109 where it is amplified to a larger output signal that can be used to more effectively drive any downstream electronic and/or photonic circuits. Referring momentarily to the FIGS. 4A-4C described above, the small heralding signal corresponds to the current 412 that provides a small current to a superconductor, e.g., superconductor 302 and/or any of the arrangements shown in FIGS. 1A-7B, to drive the superconducting wires of the circuit into the non-superconducting state. The amplified signal (e.g., current 430, FIG. 4C) is then provided to the optical switch 1111 via output electrical signal line 1114. Accordingly, the use of the superconducting amplifier circuit 1109 provides for a system that can drive higher current loads than would be the case with photon detector 1107 operating on its own. After being switched, the idler photon 1106 is provided via output waveguide 1119, e.g., for use in constructing a highly entangled resource state for use in a downstream optical quantum computing system (not shown).

FIG. 11B illustrates how several single photon sources similar to photon source 1100 can be multiplexed to increase the reliability of the photon generation process. Such a system is beneficial because of the non-deterministic nature of the conversion between the pump photon and the photon pair in the photon pair generator 1103. More specifically, because the photon pair generation process is a quantum mechanical process, it is inherently probabilistic, and thus it is not guaranteed that every pump photon that enters a photon pair generator 1103 will result in the generation of a photon pair at the output. In fact, in some instances, photon pair creation can fail entirely. Thus, to improve the reliability of the photon generation process, several single photon generators 1100-1, 1100-2, . . . , 1100-n, each receiving its own pump photon per generation cycle, can be arranged in parallel and optically (and electrically) coupled to a N×1 switch 1116, as shown. As with the heralded single photon source 1100, each single photon generator 1100-1, 1100-2, . . . , 1100-n possesses, or has an output coupled to, a corresponding dedicated heralding electrical signal line 1110-1, 1110-2, . . . , 1110-n, which can provide a heralding signal that informs a downstream circuit element of the successful generation of a photon by that particular photon source. In some embodiments, the heralding electrical signal lines 1110-1, 1110-2, . . . , 1110-n are electrically coupled to the N×1 switch 1116. N×1 switch 1116 includes digital logic that interprets the heralding electrical signals and switches the input port of the N×1 switch 1116 accordingly so as to provide the generated idler photon to the output port 1117. Thus, in this case, each photon source 1100 includes a superconducting amplifier circuit whose internal arrangement of current sources and parallel superconducting wires provides for enough amplification to drive the logic stage of the N×1 switch. In other examples, a small signal logic circuit can be employed before the amplifier and N×1 switch. One of ordinary skill will appreciate that other arrangements are possible without departing from the scope of the present disclosure.

In light of these principles and embodiments, we now turn to certain additional embodiments.

In accordance with some embodiments, a transistor (e.g., transistor 100) includes: (1) a first wire including a semiconducting component (e.g., semiconductor layer 102) configured to operate in an on state at temperatures above a semiconducting threshold temperature (e.g., Tc 208); and (2) a second wire including a superconducting component (e.g., superconducting layer 106) configured to operate in a superconducting state while: (a) a temperature of the superconducting component is below a superconducting threshold temperature (e.g., Tc 206); and (b) an input current supplied to the superconducting component is below a current threshold.

In some embodiments, the semiconducting component is located adjacent to the superconducting component. For example, FIG. 1A shows the superconductor layer 106 adjacent to (e.g., on top of) the semiconductor layer 102.

In some embodiments, in response to the input current exceeding the current threshold (e.g., current 414 in FIG. 4B), the superconducting component is configured to generate heat sufficient to increase a temperature of the semiconducting component above the semiconducting threshold temperature.

In some embodiments, the transistor is configured to operate in an off state while the semiconducting component is maintained at a temperature below the semiconducting threshold temperature. For example, while the semiconducting component is below the semiconducting threshold temperature, the semiconducting component has no current flow as illustrated in FIG. 4A. In some embodiments, the superconducting component is maintained at a temperature below the superconducting threshold, such that the superconducting component is in a superconducting state.

In some embodiments, the transistor is configured to operate in an on state while the semiconducting component is at a temperature above the semiconducting threshold temperature. For example, while the semiconducting component is at a temperature above the semiconducting threshold temperature, the semiconducting component allows current to flow from the source of the transistor to the drain of the transistor as illustrated in FIG. 4C. In some embodiments, the superconducting component is at a temperature above the superconducting threshold.

In some embodiments, the superconducting component is a superconducting wire on a first layer, the semiconducting component is a semiconducting wire on a second layer, and an electrically-insulating layer separates the first layer from the second layer. In some embodiments, the superconducting wire is oriented perpendicular to the semiconducting wire (e.g., FIG. 1A). In some embodiments, the superconducting wire is oriented parallel to the semiconducting wire (e.g., FIG. 1D).

In some embodiments, the superconducting component is a gate of the transistor and the semiconducting component is a source and drain of the transistor. In some embodiments, operating in an on state includes enabling current flow from the source to the drain.

In some embodiments, the superconducting threshold temperature is adjacent to the semiconducting threshold temperature. In some embodiments, the superconducting threshold temperature is below the semiconducting threshold temperature. In some embodiments, the semiconducting threshold temperature is between 5 and 10 Kelvin. In some embodiments, the superconducting threshold temperature is between 10 and 11 Kelvin.

In some embodiments, the superconducting component is a superconducting wire. In some embodiments, the wire is composed of niobium or a niobium alloy.

In some embodiments, the superconducting wire has a constriction (e.g., constriction 301) at a location corresponding to (e.g., adjacent to) the semiconducting component. In some embodiments, the constriction is a region of the superconducting wire with a notch. In some embodiments, the constriction is a region of the superconducting wire with a smaller width than neighboring regions of the wire.

In some embodiments, the superconducting component is configured to generate heat at a location corresponding to (e.g., adjacent to) the semiconducting component during a transition from the superconducting state to a non-superconducting state. In some embodiments, the location corresponding to the semiconducting component is a location closest to the semiconducting component. In some embodiments, the location corresponding to the semiconducting component is a location where the semiconducting component crosses (e.g., crosses over or under) the superconducting component. In some embodiments, the heat generated is sufficient to increase the temperature of the superconducting component by between 3 Kelvin and 10 Kelvin.

In some embodiments, the superconducting component is electrically isolated from the superconducting component. For example, the superconductor layer 106 in FIG. 1A is electrically isolated from the semiconductor layer 102 by insulating layer 104. In some embodiments, the superconducting component is separated from the semiconducting component by an insulating layer (e.g., insulating layer 104), such as an insulating layer composed of AlN, SiN, silicon oxide, or the like. In some embodiments, the semiconducting component is composed of germanium. In some embodiments, the semiconducting component is composed of silicon.

In some embodiments, the first wire has a first region (e.g., region 306) corresponding to (e.g., adjacent to) the superconducting component and secondary regions neighboring the first region (e.g., regions 305 and 307). In some embodiments, the first region includes the semiconducting component. In some embodiments, the semiconducting component includes the first region.

In some embodiments, the first region is configured to operate in the on state at temperatures above the semiconducting threshold temperature and the secondary regions is configured to operate in the on state at temperatures above a second semiconducting threshold temperature, the second semiconducting threshold temperature being below the semiconducting threshold temperature. In some embodiments, the secondary regions and the first region are made of a same semiconductor material (e.g., silicon or germanium). In some embodiments, the secondary regions have a higher doping concentration than the first region and the higher doping concentration lowers the threshold temperature. In some embodiments, the secondary regions have a metal coating and the first region does not.

In some embodiments, the first region is narrower than the secondary regions (e.g., as illustrated in FIG. 3C). In some embodiments, the secondary regions have a lower resistance than the first region as a result of being wider. In some embodiments, the secondary regions have a lower semiconducting threshold temperature than the first region as a result of being wider.

In some embodiments, the first wire is perpendicular to the second wire. In some embodiments, the first wire is parallel to the second wire. In some embodiments, the first wire is at a non-perpendicular, non-parallel orientation with respect to the second wire.

In accordance with some embodiments, a transistor includes: (1) a superconducting wire on a first layer (e.g., superconductor layer 106); (2) a semiconducting wire on a second layer (e.g., semiconductor layer 102), the semiconducting wire configured to transfer current from a source of the transistor to a drain of the transistor; and (3) an electrically-insulating layer (e.g., insulating layer 104) isolating the first layer from the second layer.

In some embodiments, the first layer is located above the electrically-insulating layer and the electrically insulating layer is located above the second layer. In some embodiments, the second layer is located above the electrically-insulating layer, and the electrically-insulating layer is located above the first layer. In some embodiments, the electrically-insulating layer (e.g., insulating layer 104) is thermally conductive. For example, heat generated by the superconducting wire is transferred through the electrically insulating layer to increase a temperature of the semiconducting wire.

In accordance with some embodiments, a method for fabricating a superconductor-based transistor includes: (1) providing a superconducting wire (e.g., superconductor layer 106); (2) depositing an electrically insulating layer over the superconducting wire (e.g., insulating layer 104); and (3) forming a semiconducting wire (e.g., semiconductor layer 102) on the electrically-insulating layer.

In some embodiments, the electrically insulating layer is composed of AlN. In some embodiments, the superconducting wire is composed of niobium-germanium. In some embodiments, the method includes: (1) providing a semiconducting wire; (2) depositing an electrically insulating layer over the semiconducting wire; and (3) generating (e.g., forming) a superconducting wire on the electrically insulating layer.

In some embodiments, providing the superconducting wire includes: (1) depositing a layer of superconducting material on a substrate; and (2) removing one or more portions of the layer of superconducting material to define the superconducting wire.

In accordance with some embodiments, a method for fabricating a transistor includes: (1) providing a semiconducting wire; (2) depositing an electrically-insulating layer over the semiconducting wire; and (3) forming a superconducting wire on the electrically insulating layer.

In accordance with some embodiments, a photodetector device includes a superconducting wire (e.g., superconducting wire 516, FIG. 5F) and a transistor (e.g., transistor 500, FIG. 5F). The transistor includes a first wire including a semiconducting component (e.g., semiconducting component 504, FIG. 5F) configured to operate in an "on" state at temperatures above a semiconducting threshold temperature; and a second wire including a superconducting component (e.g., superconducting component 502, FIG. 5F) configured to operate in a superconducting state while a temperature of the superconducting component is below a superconducting threshold temperature and an input current supplied to the superconducting component is below a current threshold. In some embodiments, the semiconducting component is configured to operate in an "off" state at temperatures below the semiconducting threshold temperature. In some embodiments, the superconducting component is configured to operate in a non-superconducting state while the temperature of the superconducting component is above the superconducting threshold temperature and/or the input current supplied to the superconducting component is above the current threshold. In some embodiments, the first wire consists of the semiconducting component. In some embodiments, the first wire includes the semiconducting component and one or more additional components (e.g., wires, resistors, inductors, etc.). In some embodiments, the second wire consists of the superconducting component. In some embodiments, the second wire includes the superconducting component and one or more additional components (e.g., wires, resistors, inductors, etc.).

The superconducting wire (e.g., superconducting wire 516, FIG. 5F) is electrically coupled to the second wire of the transistor (e.g., transistor 500, FIG. 5F). In some embodiments, the superconducting wire is directly coupled to the second wire. In some embodiments, the superconducting wire is indirectly coupled to the second wire (e.g., one or more additional components, such as resistors and/or inductors, are located between the superconducting wire and the second wire). The semiconducting component is located adjacent to the superconducting component. The superconducting component is configured to, in response to the input current exceeding the current threshold, transition to a non-superconducting state and generate heat sufficient to increase a temperature of the semiconducting component above the semiconducting threshold temperature. The transistor is configured to operate in an "off" state while the semiconducting component is maintained at a temperature below the semiconducting threshold temperature. The transistor is configured to operate in an "on" state while the semiconducting component is at a temperature above the semiconducting threshold temperature.

In some embodiments, the device further includes one or more current sources coupled to the second wire and configured to supply to the superconducting component a first current that is below the current threshold. For example, as shown in FIG. 5G, the device includes current source 520 coupled to the second wire (including superconducting component 502) and configured to supply to superconducting component 502 a current that is below the current threshold.

In some embodiments, the device further includes one or more current sources coupled to the first wire and configured to supply a second current through the semiconducting component.

In some embodiments, the device further includes one or more voltage sources (e.g., voltage source 518, FIG. 5G) coupled to the first wire and configured to supply a first voltage across the semiconducting component.

In some embodiments, in response to receiving light of a first intensity at the superconducting wire, the superconducting component transitions to a non-superconducting state and generates the heat sufficient to increase the temperature of the semiconducting component above the semiconducting threshold temperature. For example, as shown in FIGS. 5H-5K, in response to receiving light of the first intensity at superconducting wire 516, superconducting component 502 transitions to a non-superconducting state and generates the heat sufficient to increase the temperature of the semiconducting component above the semiconducting threshold temperature. In some embodiments, the light of the first intensity, received at the superconducting wire, causes the superconducting wire to transition into a non-superconducting state, which, in turn, causes the superconducting component to transition into a non-superconducting state (e.g., FIGS. 5H-5J).

In some embodiments, the superconducting component is a gate of the transistor and the semiconducting component is a source and drain of the transistor (e.g., the electrical signal, such as electrical current, applied to the superconducting component controls the current flowing through the semiconducting component).

In some embodiments, the superconducting threshold temperature is adjacent to the semiconducting threshold temperature (e.g., see FIGS. 2A and 2B). In some embodiments, the superconducting threshold temperature (e.g., Tc 206) is below the semiconducting threshold temperature (e.g., Tc 208).

In some embodiments, the superconducting component is a superconducting wire. In some embodiments, the superconducting component consists of a superconducting wire. In some embodiments, the superconducting wire has a constriction at a location adjacent to the semiconducting component (e.g., FIG. 3A).

In some embodiments, the superconducting component is configured to generate heat at a location adjacent to the semiconducting component during a transition from the superconducting state to a non-superconducting state. In some embodiments, the superconducting component is configured to generate heat at the location adjacent to the semiconducting component while the superconducting component remains in the non-superconducting state.

In some embodiments, the superconducting component is electrically isolated from the superconducting component (e.g., an electrical current flowing through the superconducting component is separate from an electrical current flowing through the superconducting component). In some embodiments, the semiconducting component is composed of germanium.

In some embodiments, the first wire has a first region adjacent to the superconducting component and secondary regions neighboring the first region.

In some embodiments, the first region is configured to operate in the "on" state at temperatures above the semiconducting threshold temperature and the secondary regions is configured to operate in the "on" state at temperatures above a second semiconducting threshold temperature, the second semiconducting threshold temperature being below the semiconducting threshold temperature.

In some embodiments, the first region is narrower than the secondary regions (e.g., FIG. 3C). In some embodiments, the first wire is perpendicular to the second wire (e.g., FIG. 1B). In some embodiments, the first wire is parallel to the second wire (e.g., FIG. 1D).

In accordance with some embodiments, a photodetector device includes a first superconducting wire and a transistor. The transistor includes a second superconducting wire on a first layer; a semiconducting wire on a second layer, the semiconducting wire configured to transfer current from a source of the transistor to a drain of the transistor; and an electrically insulating layer isolating the first layer from the second layer (e.g., FIGS. 1B-1D). The first superconducting wire is electrically coupled to the second superconducting wire.

In accordance with some embodiments, a transistor (e.g., transistor 100) includes: (1) a first wire including a semiconducting component (e.g., semiconductor layer 102) configured to operate in an on state at temperatures above a semiconducting threshold temperature (e.g., Tc 208); and (2) a second wire including a superconducting component (e.g., superconducting layer 106). In some embodiments, the superconducting component is configured to operate in a superconducting state while: (a) a temperature of the superconducting component is below a superconducting threshold temperature (e.g., Tc 206); and (b) a first input current (e.g., current 604, FIG. 6A) supplied to the superconducting component is below a current threshold (e.g., threshold current 250, FIG. 2C). In some embodiments, the semiconducting component is located adjacent to the superconducting component (e.g., FIG. 1A shows the superconductor layer 106 adjacent to the semiconductor layer 102). In some embodiments, in response to a first input voltage (e.g., voltage 606 in FIG. 6B), the semiconducting component is configured to generate an electromagnetic field (e.g., field 608 in FIG. 6C) sufficient to lower the current threshold such that the first input current exceeds the lowered current threshold, thereby transitioning the superconducting component to a non-superconducting state. In some embodiments: (1) the transistor is configured to operate in an on state while the superconducting component is in the superconducting state; and (2) the transistor is configured to operate in an off state while the superconducting component is in the non-superconducting state. For example, while the superconducting component is supplied with a current below the current threshold, the superconducting component has a current flow as illustrated in FIG. 6A. As another example, while the superconducting component is supplied with a current above the (e.g., lowered) current threshold, the superconducting component has reduced current flow as illustrated in FIG. 6D.

In some embodiments, the superconducting component is a superconducting wire on a first layer, the semiconducting component is a semiconducting wire on a second layer, and an insulating layer separates the first layer from the second layer (e.g., FIG. 1A). In some embodiments, the superconducting wire is oriented perpendicular to the semiconducting wire (e.g., FIG. 1A). In some embodiments, the superconducting wire is oriented parallel to the semiconducting wire (e.g., FIG. 1D). In some embodiments, the semiconducting region has a width of 10 nm to 30 nm (e.g., 20 nm) and the second current source applies 2V-10V across the width.

In some embodiments, the semiconductor component is a gate of the transistor and the superconducting component is a source and drain of the transistor. In some embodiments, operating in an on state includes enabling current flow from the source to the drain.

In some embodiments, the superconducting component is a superconducting wire. In some embodiments, the wire is composed of niobium or a niobium alloy.

In some embodiments, the superconducting wire has a constriction (e.g., constriction 301, FIG. 3A) at a location corresponding to (e.g., adjacent to) the semiconducting component. In some embodiments, the constriction is a region of the superconducting wire with a notch. In some embodiments, the constriction is a region of the superconducting wire with a smaller width than neighboring regions of the wire.

In some embodiments, the transistor is configured to operate in a second mode, where, in the second mode, in response to the first input current (e.g., current 414, FIG. 4B) exceeding the current threshold, the superconducting component is configured to generate heat sufficient to increase a temperature of the semiconducting component above the semiconducting threshold temperature (e.g., as illustrated in FIG. 4C). In some embodiments: (1) the transistor is configured to operate in an off state while the semiconducting component is maintained at a temperature below the semiconducting threshold temperature (e.g., FIG. 4A); and (2) the transistor is configured to operate in an on state while the semiconducting component is at a temperature above the semiconducting threshold temperature (e.g., FIG. 4C).

In some embodiments, in the second mode, the superconducting component is configured to generate heat at a location adjacent to the semiconducting component during a transition from the superconducting state to a non-superconducting state (e.g., generate heat as illustrated in FIG. 7B). In some embodiments, the location corresponding to the semiconducting component is a location closest to the semiconducting component. In some embodiments, the location corresponding to the semiconducting component is a location where the semiconducting component crosses over the superconducting component. In some embodiments, the heat generated is sufficient to increase the temperature of the superconducting component by between 3 Kelvin and 10 Kelvin.

In some embodiments, in the second mode, the superconducting component is a gate of the transistor and the semiconducting component is a source and drain of the transistor.

In some embodiments, the superconducting component is electrically isolated from the semiconducting component. In some embodiments, the superconducting component is separated from the semiconducting component by an insulating layer (e.g., AlN, SiN, silicon oxide, etc.). For example, the superconductor layer 106 in FIG. 1A is electrically isolated from the semiconductor layer 102 by insulating layer 104. In some embodiments, the superconducting component is separated from the semiconducting component by an insulating layer (e.g., insulating layer 104), such as an insulating layer composed of AlN, SiN, silicon oxide, or the like.

In some embodiments, the semiconducting component is composed of germanium. In some embodiments, the semiconducting component is composed of silicon.

In some embodiments, the semiconducting component has a first region (e.g., region 306) corresponding to (e.g., adjacent to) the superconducting component and secondary regions neighboring the first region (e.g., regions 305 and 307). In some embodiments, the first region is configured to operate in the on state at temperatures above the semiconducting threshold temperature and the secondary regions are configured to operate in the on state at temperatures above a second semiconducting threshold temperature, the second semiconducting threshold temperature being below the semiconducting threshold temperature. In some embodiments, the secondary regions and the first region are made of a same semiconductor material (e.g., silicon or germanium). In some embodiments, the secondary regions have a higher doping concentration than the first region and the higher doping concentration lowers the threshold temperature. In some embodiments, the secondary regions have a metal coating and the first region does not. In some embodiments, the first region is narrower than the secondary regions.

In accordance with some embodiments, a transistor includes: (1) a first wire including a semiconducting component (e.g., semiconductor component 304) configured to operate in an on state at temperatures above a semiconducting threshold temperature (e.g., 40 Kelvin); and (2) a second wire (e.g., conductor 702) located adjacent to the semiconducting component. In some embodiments: (a) in response to an input current (e.g., current 704), the second wire is configured to generate heat (e.g., heat 708) sufficient to increase a temperature of the semiconducting component above the semiconducting threshold temperature; (b) the transistor is configured to operate in an off state while the semiconducting component is maintained at a temperature below the semiconducting threshold temperature (e.g., FIG. 7A): and (c) the transistor is configured to operate in an on state while the semiconducting component is at a temperature above the semiconducting threshold temperature (e.g., FIG. 7B).

In some embodiments, the second wire is a gate of the transistor and the semiconducting component is a source and drain of the transistor. In some embodiments, operating in an on state includes enabling current flow from the source to the drain (e.g., current 706 shown in FIG. 7B).

In some embodiments, the second wire is a superconducting component maintained in a non-superconducting state. In some embodiments, the second wire is composed of niobium or a niobium alloy.

In some embodiments, the second wire has a constriction at a location adjacent to (e.g., corresponding to) the semiconducting component (e.g., as shown in FIGS. 7A-7B). In some embodiments, the constriction is a region (or portion) of the second wire with a notch. In some embodiments, the constriction is a region of the second wire with a smaller width than neighboring regions of the wire.

In some embodiments, the second wire is electrically isolated from the superconducting component. In some embodiments, the superconducting component is separated from the semiconducting component by an insulating layer (e.g., AlN, SiN, silicon oxide, etc.). In some embodiments, the semiconducting component is composed of Germanium and/or Silicon. In some embodiments, the insulating layer is electrically insulating and thermally conductive.

It will also be understood that, although the terms first, second, etc. are, in some instances, used herein to describe various elements, these elements should not be limited by these terms. These terms are only used to distinguish one element from another. For example, a first current could be termed a second current, and, similarly, a second current could be termed a first current, without departing from the scope of the various described embodiments. The first current and the second current are both currents, but they are not the same condition unless explicitly stated as such.

The terminology used in the description of the various described embodiments herein is for the purpose of describing particular embodiments only and is not intended to be limiting. As used in the description of the various described embodiments and the appended claims, the singular forms "a", "an" and "the" are intended to include the plural forms as well, unless the context clearly indicates otherwise. It will also be understood that the term "and/or" as used herein refers to and encompasses any and all possible combinations of one or more of the associated listed items. It will be further understood that the terms "includes," "including," "comprises," and/or "comprising," when used in this specification, specify the presence of stated features, integers, steps, operations, elements, and/or components, but do not preclude the presence or addition of one or more other features, integers, steps, operations, elements, components, and/or groups thereof.

As used herein, the term "if" is, optionally, construed to mean "when" or "upon" or "in response to determining" or "in response to detecting" or "in accordance with a determination that," depending on the context. Similarly, the phrase "if it is determined" or "if [a stated condition or event] is detected" is, optionally, construed to mean "upon determining" or "in response to determining" or "upon detecting [the stated condition or event]" or "in response to detecting [the stated condition or event]" or "in accordance with a determination that [a stated condition or event] is detected," depending on the context.

The foregoing description, for purpose of explanation, has been described with reference to specific embodiments. However, the illustrative discussions above are not intended to be exhaustive or to limit the scope of the claims to the precise forms disclosed. Many modifications and variations are possible in view of the above teachings. The embodiments were chosen in order to best explain the principles underlying the claims and their practical applications, to thereby enable others skilled in the art to best use the embodiments with various modifications as are suited to the particular uses contemplated.

What is claimed is:

1. A transistor, comprising:
a superconducting wire on a first layer of the transistor;
a semiconducting wire on a second layer of the transistor, the semiconducting wire configured to transfer current from a source of the transistor to a drain of the transistor; and
an electrically-insulating layer electrically isolating the first layer from the second layer, wherein the transistor is configured to switch from an off state to an on state when the superconducting wire is above a superconducting temperature threshold.

2. The transistor of claim 1, wherein the superconducting wire comprises a gate of the transistor and the semiconducting wire comprises the source and drain of the transistor.

3. The transistor of claim 1, wherein a superconducting threshold temperature of the superconducting wire is adjacent to a semiconducting threshold temperature of the semiconducting wire.

4. The transistor of claim 1, wherein the superconducting wire has a constricted region at a location adjacent to the semiconducting wire.

5. The transistor of claim 1, wherein the superconducting wire is configured to generate heat at a location adjacent to the semiconducting wire during a transition from a superconducting state to a non-superconducting state of the superconducting wire.

6. The transistor of claim 1, wherein the semiconducting wire includes Germanium.

7. The transistor of claim 1, wherein the semiconducting wire has a first region adjacent to the superconducting wire and secondary regions neighboring the first region.

8. The transistor of claim 7, wherein the first region is configured to operate in an on state at temperatures above a semiconducting threshold temperature and the secondary regions are configured to operate in the on state at temperatures above a second semiconducting threshold temperature, the second semiconducting threshold temperature being below the semiconducting threshold temperature.

9. The transistor of claim 7, wherein the first region is narrower than the secondary regions.

10. The transistor of claim 1, wherein the superconducting wire is perpendicular to the semiconducting wire.

11. The transistor of claim 1, wherein the superconducting wire is parallel to the semiconducting wire.

12. The transistor of claim 1, wherein the electrically-insulating layer is thermally conductive.

13. The transistor of claim 12, wherein the electrically-insulating layer is configured to conduct heat generated at the superconducting wire to the semiconducting wire, thereby raising a temperature of the semiconducting wire.

14. The transistor of claim 1, wherein the transistor is configured to remain in the off state when the superconducting wire is maintained at a temperature that is below a temperature threshold of the superconducting wire.

15. A method for operating a superconductor-based transistor, comprising:

maintaining the superconductor-based transistor in an off state, wherein the superconductor-based transistor includes a first wire including a semiconducting component and a second wire including a superconducting component; and while the superconducting component of the superconductor-based transistor is operating in a superconducting state, and the semiconducting component of the superconductor-based transistor is in an off state, initiating transition of the superconductor-based transistor from the off state to an on state by supplying a current to the superconducting component, wherein the current exceeds a superconducting current threshold for the superconducting component;

whereby, in response to the current supplied to the superconducting component, the superconducting component transitions to a non-superconducting state and generates heat sufficient to increase a temperature of the semiconducting component above a semiconducting threshold temperature and enable current flow through the semiconducting component.

16. The method of claim 15, wherein maintaining the superconductor-based transistor in an off state comprises maintaining the superconducting component below a superconducting temperature.

17. The method of claim 15, wherein maintaining the superconductor-based transistor in an off state comprises supplying a current to the superconducting component that is below the superconducting current threshold.

* * * * *